US012751308B2

(12) United States Patent
Tong et al.

(10) Patent No.: US 12,751,308 B2
(45) Date of Patent: Sep. 29, 2026

(54) SEMICONDUCTOR PACKAGE AND SEMICONDUCTOR PACKAGE ASSEMBLY WITH EDGE SIDE INTERCONNECTION

(71) Applicants: ND-HI TECHNOLOGIES LAB, INC., Taipei City (TW); ETRON TECHNOLOGY, INC., Hsinchu (TW)

(72) Inventors: Ho-Ming Tong, Taipei City (TW); Chao-Chun Lu, Hsinchu (TW)

(73) Assignees: ND-HI TECHNOLOGIES LAB, INC.; ETRON TECHNOLOGY, INC., Hsinchu (TW)

( * ) Notice: Subject to any disclaimer, the term of this patent is extended or adjusted under 35 U.S.C. 154(b) by 0 days.

(21) Appl. No.: 19/315,804

(22) Filed: Sep. 1, 2025

(65) Prior Publication Data

US 2025/0385203 A1 Dec. 18, 2025

Related U.S. Application Data

(63) Continuation of application No. 18/471,670, filed on Sep. 21, 2023.

(Continued)

(51) Int. Cl.
*H10W 70/68* (2026.01)
*H10P 72/70* (2026.01)

(Continued)

(52) U.S. Cl.
CPC ........... *H10W 70/688* (2026.01); *H10P 72/74* (2026.01); *H10W 70/611* (2026.01);

(Continued)

(58) Field of Classification Search
CPC ......... H01L 24/02; H01L 24/16; H01L 24/20; H01L 24/24; H01L 24/25; H01L 24/32;

(Continued)

(56) References Cited

U.S. PATENT DOCUMENTS 8,294,252 B1 * 10/2012 Patel .................... H01L 23/481
438/109
8,618,659 B2 12/2013 Sato (Continued)

FOREIGN PATENT DOCUMENTS

CN 117766514 A 3/2024
JP S59194460 A 11/1984

(Continued)

OTHER PUBLICATIONS

Extended European Search Report with search report issued by the European Patent Office for European Patent Application No. 25159330.7 on Sep. 24, 2025 (8 pages).

(Continued)

*Primary Examiner* — Ida M Soward
(74) *Attorney, Agent, or Firm* — WPAT, P.C.; Anthony King

(57) ABSTRACT

A semiconductor package includes a plurality of integrated circuit (IC) structures. Each IC structure includes: a first body having a primary surface and a secondary surface, wherein the primary surface is greater than the secondary surface in area; and a primary redistribution layer (RDL) over the primary surface of the first body, with the primary RDL having an edge surface aligned or substantially aligned with the secondary surface of the first body. The semiconductor package further includes an edge RDL over the secondary surface of the first body of each IC structure and the edge surface of the primary RDL of each IC structure. The primary RDL is electrically connected to the edge RDL and the first body, and the edge RDL is electrically connected to the first body through the primary RDL.

11 Claims, 33 Drawing Sheets

Related U.S. Application Data

(60) Provisional application No. 63/409,852, filed on Sep. 26, 2022.

(51) Int. Cl.

| | |
|---|---|
| ***H10W 70/60*** | (2026.01) |
| ***H10W 70/65*** | (2026.01) |
| ***H10W 70/67*** | (2026.01) |
| ***H10W 90/00*** | (2026.01) |
| *H10W 70/05* | (2026.01) |
| *H10W 70/09* | (2026.01) |
| *H10W 72/00* | (2026.01) |
| *H10W 90/10* | (2026.01) |
| *H10W 90/20* | (2026.01) |

(52) U.S. Cl.

CPC ......... *H10W 70/657* (2026.01); *H10W 90/00* (2026.01); *H10P 72/7436* (2026.01); *H10W 70/05* (2026.01); *H10W 70/09* (2026.01); *H10W 70/60* (2026.01); *H10W 70/65* (2026.01); *H10W 72/0198* (2026.01); *H10W 72/834* (2026.01); *H10W 90/10* (2026.01); *H10W 90/20* (2026.01); *H10W 90/297* (2026.01); *H10W 90/724* (2026.01); *H10W 90/732* (2026.01)

(58) Field of Classification Search

CPC ............... H01L 24/96; H01L 23/49805; H01L 23/5387; H01L 25/0652; H01L 25/0657; H01L 23/18; H10W 70/688; H10W 70/611; H10W 70/657; H10W 70/60; H10W 70/65; H10W 72/834; H10W 90/00; H10W 90/10; H10W 90/20; H10W 90/297; H10W 90/724; H10W 90/732

See application file for complete search history.

(56) References Cited

U.S. PATENT DOCUMENTS

| | | | | |
|---|---|---|---|---|
| 9,490,195 | B1 | 11/2016 | Prabhu | |
| 9,601,463 | B2 * | 3/2017 | Yu | H01L 24/20 |
| 10,170,456 | B2 | 1/2019 | Sung | |
| 10,665,571 | B2 | 5/2020 | Lee | |
| 11,024,603 | B2 | 6/2021 | Chen | |
| 11,145,526 | B2 | 10/2021 | Wang | |
| 11,183,484 | B2 | 11/2021 | Okutsu | |
| 11,270,921 | B2 | 3/2022 | Hou | |
| 11,302,673 | B2 * | 4/2022 | Yang | H10W 90/00 |
| 11,373,977 | B1 | 6/2022 | Bean | |
| 11,482,500 | B2 | 10/2022 | Bowers | |
| 11,552,054 | B2 | 1/2023 | Lin | |
| 11,854,921 | B2 | 12/2023 | Yu | |
| 11,869,821 | B2 | 1/2024 | Ko | |
| 12,230,613 | B2 | 2/2025 | Chang | |
| 2007/0102801 | A1 | 5/2007 | Ishida | |
| 2008/0029884 | A1 | 2/2008 | Grafe | |
| 2008/0083976 | A1 | 4/2008 | Haba | |
| 2008/0290493 | A1 | 11/2008 | Tsunozaki | |
| 2009/0045444 | A1 | 2/2009 | Huebner | |
| 2009/0045524 | A1 | 2/2009 | Mohammed | |
| 2010/0327461 | A1 | 12/2010 | Co | |
| 2012/0049376 | A1 | 3/2012 | Harada | |
| 2012/0211878 | A1 | 8/2012 | Popovic | |
| 2013/0099393 | A1 | 4/2013 | Jeong | |
| 2013/0299977 | A1 | 11/2013 | Dayringer | |
| 2013/0341803 | A1 * | 12/2013 | Cheah | H10W 90/00 257/774 |
| 2014/0089609 | A1 | 3/2014 | Kegel | |
| 2014/0185352 | A1 | 7/2014 | Chow | |
| 2014/0264945 | A1 | 9/2014 | Yap | |
| 2016/0064063 | A1 | 3/2016 | Nomura | |
| 2017/0018485 | A1 | 1/2017 | Prabhu | |
| 2017/0018529 | A1 | 1/2017 | Katkar | |
| 2017/0141063 | A1 | 5/2017 | Lee | |
| 2017/0338203 | A1 | 11/2017 | Yuan | |
| 2018/0040587 | A1 * | 2/2018 | Tao | H01L 25/0657 |
| 2018/0047706 | A1 | 2/2018 | Upadhyayula | |
| 2019/0051621 | A1 * | 2/2019 | Liu | H01L 23/585 |
| 2020/0266180 | A1 * | 8/2020 | Pendse | H01L 24/24 |
| 2020/0343218 | A1 * | 10/2020 | Hu | H10W 90/00 |
| 2020/0411481 | A1 | 12/2020 | Yang et al. | |
| 2021/0242100 | A1 | 8/2021 | Hou et al. | |
| 2021/0305226 | A1 | 9/2021 | Tsai | |
| 2022/0157697 | A1 * | 5/2022 | Taneda | H01L 23/49833 |
| 2022/0328374 | A1 | 10/2022 | Zhang | |
| 2023/0029098 | A1 | 1/2023 | Kim | |
| 2023/0042063 | A1 | 2/2023 | Bae | |
| 2023/0059491 | A1 | 2/2023 | Dokania | |
| 2023/0069969 | A1 | 3/2023 | Boutaleb | |
| 2023/0178502 | A1 | 6/2023 | Goh | |
| 2024/0038724 | A1 | 2/2024 | Karikalan | |
| 2024/0057351 | A1 | 2/2024 | Chuang | |
| 2024/0087976 | A1 | 3/2024 | Kim et al. | |
| 2024/0128208 | A1 | 4/2024 | Tong et al. | |
| 2024/0170458 | A1 | 5/2024 | Ji | |
| 2025/0286031 | A1 | 9/2025 | Kawano | |

FOREIGN PATENT DOCUMENTS

| | | | |
|---|---|---|---|
| KR | 20180071138 | | 6/2018 |
| KR | 20240035240 | A | 3/2024 |
| KR | 20240074354 | A | 5/2024 |
| WO | 2021095083 | A1 | 5/2021 |
| WO | 2024135670 | | 6/2024 |

OTHER PUBLICATIONS

Office Action of U.S. Appl. No. 19/059,275 with search report issued Aug. 12, 2025.

Office Action of U.S. Appl. No. 19/059,275 issued by USPTO on Nov. 26, 2025.

Office Action issued by KIPO dated Feb. 4, 2026 for Application No. KR10-2025-0023228.

English translation of the Search Report appended to Office Action issued by KIPO dated Feb. 4, 2026 for Application No. KR10-2025-0023228.

Office Action issued by JPO dated Apr. 14, 2026 for Application No. JP2025-027233.

English translation of the Search Report appended to Office Action issued by JPO dated Apr. 14, 2026 for Application No. JP2025-027233.

Office Action issued by EPO dated Feb. 19, 2026 for Application No. EP25202067.2.

Search Report appended to Office Action issued by EPO dated Feb. 19, 2026 for Application No. EP25202067.2.

Office Action issued by EPO dated Feb. 20, 2026 for Application No. EP25202075.5.

Search Report appended to Office Action issued by EPO dated Feb. 20, 2026 for Application No. EP25202075.5.

Office Action issued by EPO dated Mar. 27, 2026 for Application No. EP25159308.3.

Search Report appended to Office Action issued by EPO dated Mar. 27, 2026 for Application No. EP25159308.3.

Office Action issued by KIPO dated May 13, 2026 for Application No. KR10-2025-0130745.

English translation of the Search Report appended to Office Action issued by KIPO dated May 13, 2026 for Application No. KR10-2025-0130745.

Office Action issued by the USPTO for U.S. Appl. No. 18/471,670 on Jun. 29, 2026.

Office Action from the Korean family application dated Jul. 23, 2026.

English translation of the Office Action from the Korean family application dated Jul. 23, 2026.

(56) References Cited

OTHER PUBLICATIONS

U.S. Pat. No. 20240128208A1 is the US counterpart to CN117766514A.
U.S. Pat. No. 20240087976A1 is the US counterpart to KR20240035240A.

* cited by examiner

SEMICONDUCTOR PACKAGE AND SEMICONDUCTOR PACKAGE ASSEMBLY WITH EDGE SIDE INTERCONNECTION

PRIORITY CLAIM AND CROSS-REFERENCE

This application is a continuation of U.S. non-provisional application Ser. No. 18/471,670 filed on Sep. 21, 2023, which claims the benefit of U.S. provisional application No. 63/409,852, filed on Sep. 26, 2022, the disclosure of which is incorporated by reference herein in its entirety.

FIELD

This disclosure relates in general to a semiconductor device and a method of forming the same, and more particularly to a semiconductor device with side edge interconnection and a method of forming the same.

BACKGROUND

Tremendous progress has been made in two dimensional (2D) geometrical scaling of conventional transistors due to the great feats of engineering and material science involving extremely complex multiple-step lithographic patterning, new strain enhancing materials and metal oxide gate. However, 2D device scaling is losing momentum as the above-mentioned techniques approach their practical limits. Three-dimensional integrated circuit (3D IC) integration which represents a radical departure from the traditional 2D IC integration has been recognized as a next-generation semiconductor technology to simultaneously achieve high performance, low power consumption, small physical size and high integration density. The 3D ICs provide a path to continually meet performance and cost demands of next generation devices while still permitting more relaxed gate lengths with less process complexity for high-end applications such as high-performance computing (HPC), data centers and artificial intelligence (AI).

3D IC integration can proceed via
monolithic integration, and/or
vertical integration of disparate dies.

3D monolithic integration involves typically vertical integration of multiple active silicon layers with vertical interconnects between the layers. Recently, a "cache-on-central processing unit (CPU)" 3D IC structure has been demonstrated and commercialized using copper hybrid bonding. Today, high-bandwidth-memory (HBM) dynamic random-access memory (DRAM) stacks, each of which created by vertically integrating a number of DRAM dies on a control IC, represent the highest volume commercial 3D ICs today. These HBM DRAM stacks are typically mounted side-by-side with a processor IC on a silicon interposer in 2.5D IC packaging (FIG. 1A) for high-end applications such as HPC, data centers and AI. A 2.5D IC typically contains through-silicon vias (TSVs) in active dies such as DRAM and control ICs, and in the silicon interposer which can be passive or active. A 2.5D IC can also contain redistribution layers (RDLs) in the interposer and active dies. Take ChatGPT for instance, it is powered by n Vidia's H100 GPU in 2.5D IC configuration. Going forward, 3D ICs can enable memory on memory, memory over logic, and logic over logic structures using interconnect technologies including TSVs, RDLs containing interconnect wiring and micro-vias, flip chip bonding based on copper pillar micro-bumps or solder bumps, as well as the newly emerged technique of copper hybrid bonding. 3D ICs created by monolithic integration and/or heterogeneous integration allow for vertical stacking of heterogeneous dies and/or active silicon layers from different manufacturing processes and nodes, chip/chiplet reuse, and chiplets-in-SiP (system-in-a-package). Ultimately, 3D IC integration will enable stacking of HBM DRAM stacks on processors to greatly shorten the time of data transfer between DRAM dies and the processor and greatly reduce the peak compute-memory bandwidth gap. 3D ICs are ideal for applications that require integration of more transistors in a given footprint (such as mobile system-on-chip, SoC) or for applications already pushing the capability limit of a single die at the most-advanced node, such as HPC, data centers, AI/machine learning, 5G/6G networks, graphics, smartphones/wearables, automotive and others that demand ultra-high-performance, higher-power-efficiency devices. These devices include CPU, GPU (graphics processing unit), FPGA (field-programmable gate array), ASIC (application-specific IC), TPU (tensor processing unit), integrated photonics, AP (application processor for cell phones), packet buffer/router devices, and the like.

To accelerate adoption, 3D IC systems must be designed in a holistic manner via IC-package-system co-design, which involves a silicon IP, ICs/chiplets and an IC package, and addresses accompanying power and thermal challenges. In contrast to PPAC (performance, power, area and cost) optimization per square centimeter as applied in 2D packaging, IC-package-system co-design for 3D ICs aims to achieve "PPAC optimization per cubic millimeter", wherein a vertical dimension that covers ICs, interposer, IC package substrate, IC package and system printed circuit board (PCB) must all be considered in all tradeoff decisions.

Today, all 3D ICs adopt packaging topologies with single-sided areal electrical interconnects, for instance, from the bottom-side of the control IC in the HBM DRAM stack, which is connected to an interposer, to DRAM dies on top of the control IC, or from the laminate substrate to the bottom side of the CPU in cache-on-CPU. In powering 3D ICs that rely on single-sided interconnects, designers must consider all stacked layers while designing a power delivery network with a topmost die receiving power from its underlying die, the die underneath it from the die directly below, etc., a bottom die and a processor die from a 2.5D interposer and the interposer from a laminate substrate which, in turn, gets its power from the PCB. The single-sided interconnects are not scalable since the 3D IC footprint is invariant to the number of dies implemented vertically. Take HBM DRAM stacks for instance, the number of dies in the stack increases from 5 for HBM1 to 13 for HBM3. The one-sided electrical interconnects impose a severe constraint on PPAC optimization of 3D ICs.

SUMMARY

One aspect of the present disclosure provides a semiconductor package including a plurality of integrated circuit (IC) structures. Each IC structure includes: a first body having a primary surface and a secondary surface, wherein the primary surface is greater than the secondary surface in area; and a primary redistribution layer (RDL) over the primary surface of the first body, with the primary RDL having an edge surface aligned or substantially aligned with the secondary surface of the first body. The semiconductor package further includes an edge RDL over the secondary surface of the first body of each IC structure and the edge surface of the primary RDL of each IC structure. The primary RDL is electrically connected to the edge RDL and the first body, and the edge RDL is electrically connected to the first body through the primary RDL.

In the present disclosure, four untapped side faces of a 3D IC stack are used for interconnecting with dies in the 3D IC stack to allow for skip-die and multi-sided signal and power distribution. As a result, power and signal can be supplied from a bottom die (or from an interposer supporting the bottom die) on a front side not only to the die directly above, but also to all other dies in the die stack. Routing areas and design flexibility can thus be increased without substantially increasing a footprint of the 3D IC, and performance can be improved due to more efficient interconnect strategies.

BRIEF DESCRIPTION OF THE DRAWINGS

Aspects of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

Figure 1A:
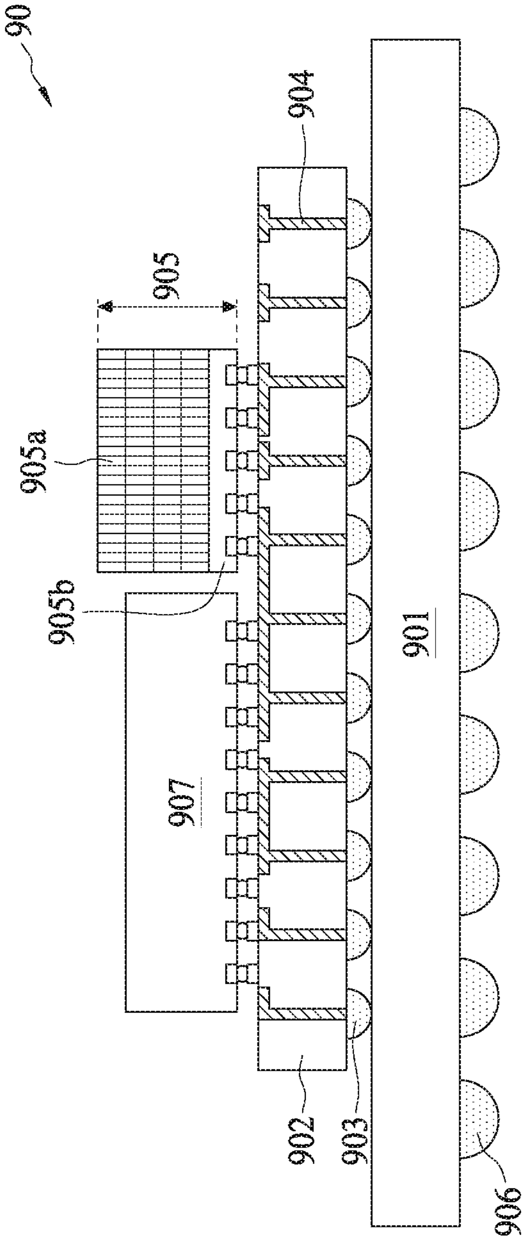
FIGS. 1A to 1F show various systems-in-a-package (SIPs), according to comparative embodiments of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings. Further, like reference numerals across different figures dictate similar features, and therefore a detailed explanation of the similar feature may be provided when such features are first introduced in the disclosure, and may not be subsequently repeated.

DETAILED DESCRIPTION

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Embodiments of the present invention disclose methodologies, processes and structures to create redistribution layers (RDL) and interconnects (e.g., through-silicon vias, through-mold vias, metal vias, metal pads for copper hybrid bonding, and micro-bumps or solder bumps for flip-chip assembly) on four side surfaces of 3D ICs and short 3D IC structure stacks (detailed descriptions of which are provided below), wherein each stacked layer consists of one or more ICs in an x-y direction (in-plane direction) and a z direction (out-of-plane direction or IC thickness direction).

Embodiments of the package structures proposed in the present disclosure allow for at least the following features: (a) five-sided power and signal distribution (through a front-side and four side faces of the 3D IC package); (b) skip-die and multi-sided interconnection (e.g., from a bottom die or a substrate such as an interposer directly to a top die and other ICs in the stack) through the four side faces and/or interior interconnections using combinations of RDLs, TSVs and through mold vias (TMVs); (c) RDLs on side surfaces to be interconnected in three dimensions through use of bendable flexible printed circuits (flexes); and (d) ability to use various interconnection technologies covering RDLs, TSVs, micro-bumps, solder bumps, copper hybrid bonds and fine-pitch Flexes. Therefore, the proposed package structures can effectively reduce lengths of global and IC packaging interconnect routes and increase a number of transistors visited within one clock cycle.

FIGS. 1A to 1F show various systems-in-a-package (SIPs), according to comparative embodiments of the present disclosure.

Figure 1B:
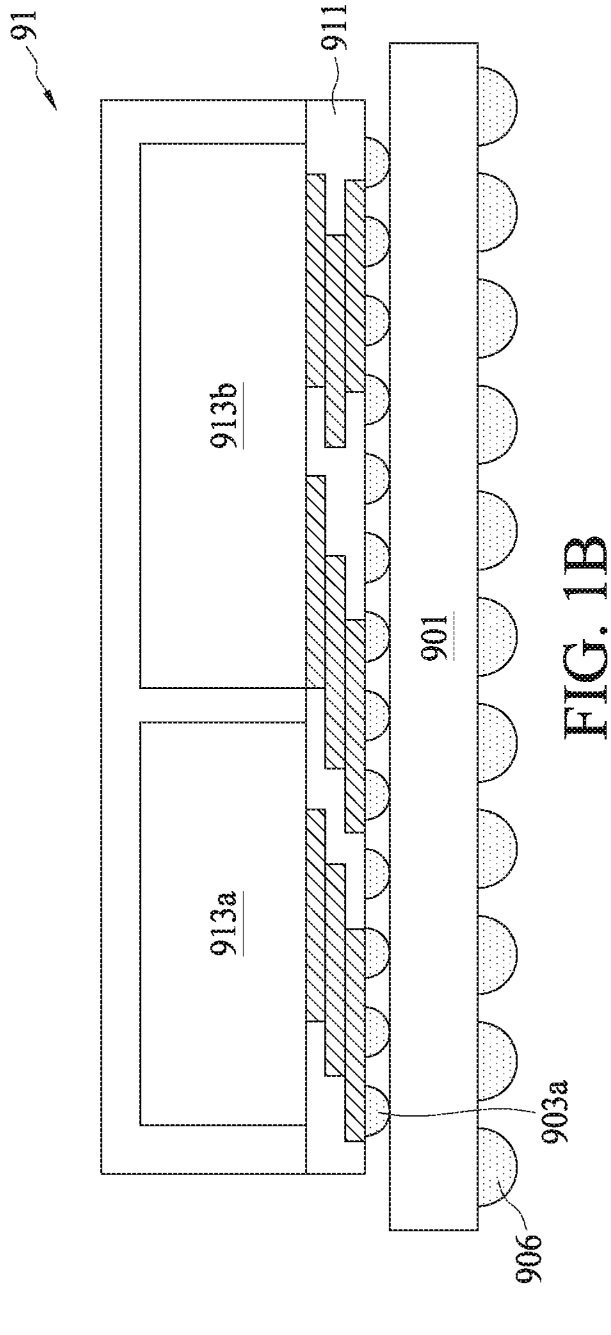
Figure 1C:
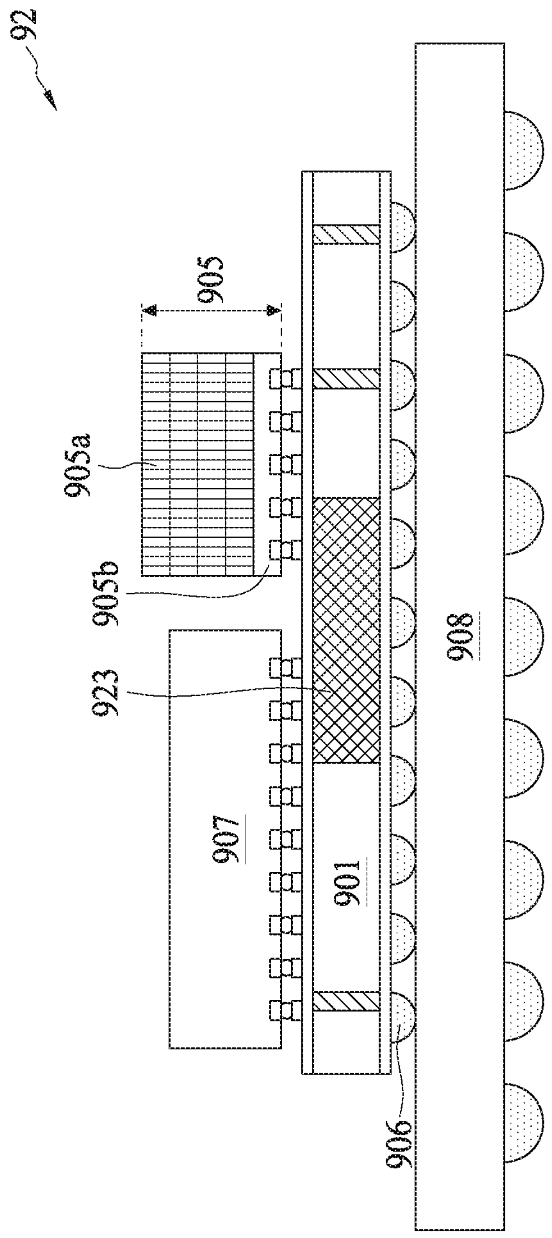
Figure 1D:
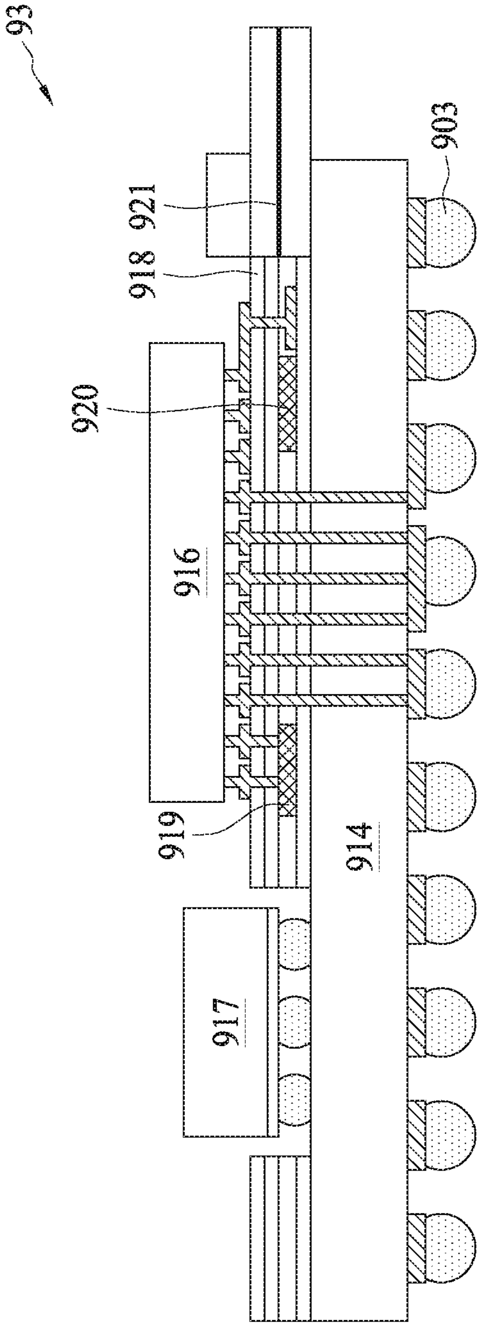
Figure 1E:
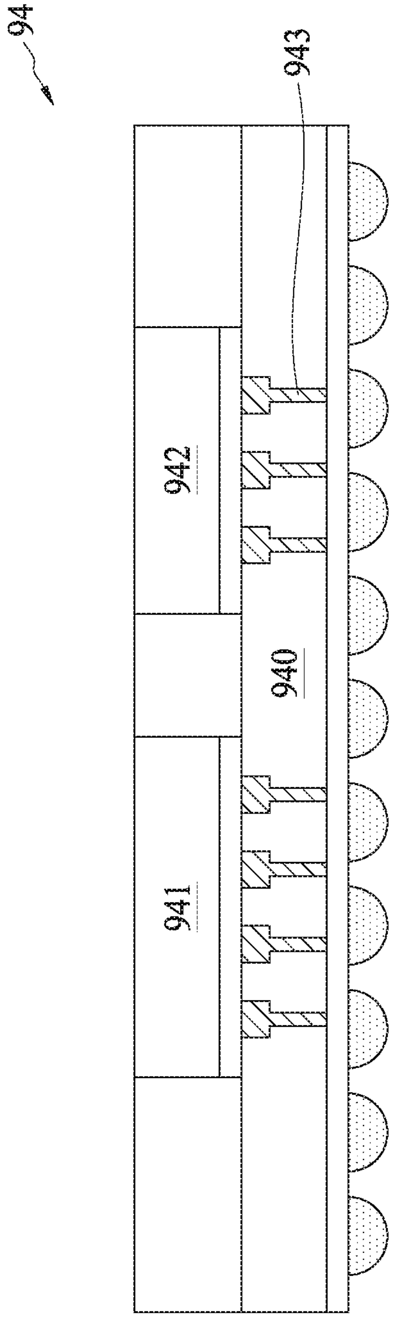
Figure 1F:
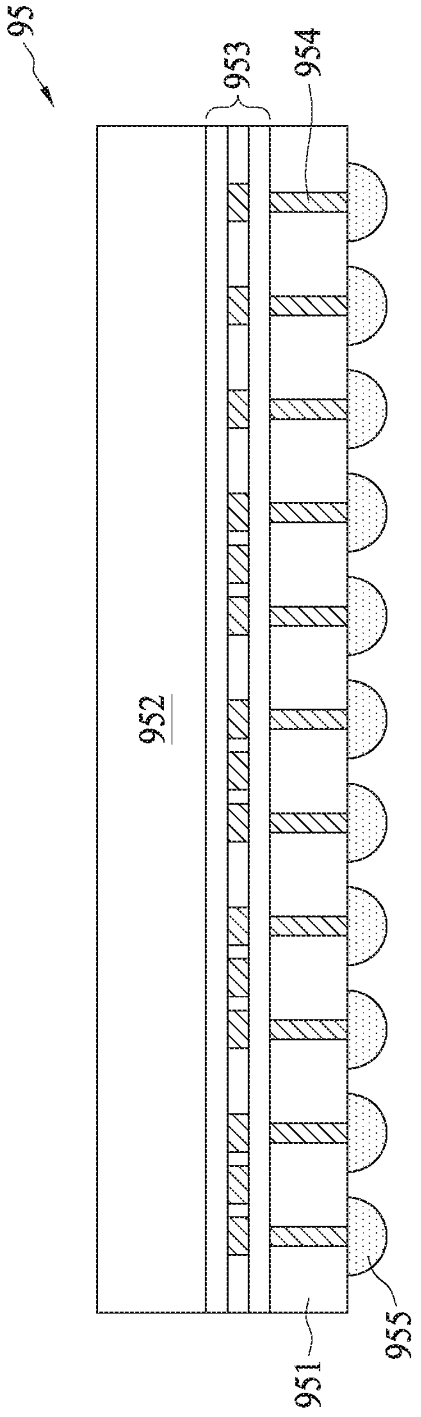

For high-end applications such as HPC, data centers, AI and smart handhelds, costs of IC (integrated circuit) scaling increase exponentially for system-on-chip (SoC) designs. Adding to complexity and cost are the industry's increasing reliance on complex advanced SiPs (system-in-package) to package advanced ICs. Advanced SiPs described herein include a 2.5D IC as shown in FIG. 1A, a fan-out SiP as shown in FIG. 1B, an embedded SiP as shown in FIG. 1C, silicon photonics as shown in FIG. 1D, a 3D IC assembled using chip-to-wafer (C2W) bonding as shown in FIG. 1E and a 3D IC assembled using wafer-to-wafer (W2W) bonding as shown in FIG. 1F. Advanced SiPs can also include chiplets-in-SiPs to enable high-end SoC partitioning using chiplets and one or more of the advanced SiP technologies and their enabling building block technologies shown in FIGS. 1A to 1F for improved yield, cost, time-to-market and performance. All advanced SiPs involve integration of multiple dies, and some SiPs (e.g., 2.5D and 3D ICs) can contain wafer-level components with tiny through-silicon vias (TSVs) as small as about 5 μm in diameter (and about 30 μm in depth, which is equivalent to a typical silicon substrate thickness) in thin active ICs such as HBM DRAM chips, as well as fine L (line width)/S (line spacing) redistribution layers (RDL) with an L/S of 2 μm/2 μm and below. All advanced SiPs commercially available today are packaged with single-sided power supply and signaling.

Referring to FIG. 1A, a 2.5D IC structure 90 includes a laminate substrate 901 supporting a silicon interposer 902 through a plurality of solder connections 903. The silicon interposer 902, which is commonly used in 2.5D IC packaging, contains through-silicon vias (TSVs) 904 and can be used as a platform to bridge a fine-line/spacing/pitch capability gap between the laminate substrate 901 and IC blocks covering a 3D IC such as an HBM DRAM stack, i.e., a memory structure 905 and a processor IC 907. A wide variety of electronic components, produced by wafer-level processes, can be disposed on the silicon interposer 902, and can include memory devices (e.g., 905), logic ICs (e.g., 907), MEMS (micro-electro-mechanical system) devices, and passive devices mounted on a top side (i.e., a chip side) of the silicon interposer 902, while the electronic components can be arranged in 2D IC, 2.5D IC or 3D IC package configurations. For instance, the memory structure 905 can be an HBM DRAM stack which includes a plurality of DRAM dies 905*a* vertically stacked over a base die (typically a control die) 905*b* through copper pillar micro-bumps. When needed, the interposer 902 and laminate substrate 901 combination can be replaced with a laminate substrate containing a silicon interconnect substrate which is either embedded in the substrate (FIG. 1C) or mounted on the substrate. As shown in FIG. 1A, the laminate substrate 901 upon which the silicon interposer 902 is bonded using micro-bumps or solder bumps can be bonded to a printed circuit board (PCB, not shown) through a plurality of ball grid array (BGA) solder balls 906 underneath the laminate substrate 901.

Referring to FIG. 1B, a fan-out package structure 91 can be adopted with electrical connections on chips 913*a* and 913*b*, wherein the electrical connections are fanned out from the active surfaces of chips 913*a* and 913*b* to enable placement of solder bumps 903*a* beyond the confines of the chips, which serve as external I/Os, distal to the chips 913*a* and 913*b*. The fan-out package structure 91, which can include one or more semiconductor chips (e.g., the chips 913*a* and 913*b*) allows individual chips to be connected to fan-out wiring layers 911 and to the solder bumps 903*a* or, alternatively, micro bumps, depending on applications. As depicted in FIG. 1B, the fan-out package structure 91, which is produced by wafer-level fan-out processes, is bonded to a substrate 901, wherein the substrate 901 can be a laminate substrate, an interposer or another fan-out package structure and which, in turn, is bonded to a next-level substrate using solder bumps or solder balls 906.

In FIG. 1C, an embedded SiP 92 includes one or more devices 923 embedded in a laminate substrate 901. The one or more devices 923 can be an embedded silicon interconnect (which can be either a passive device or an active device), an active device such as a power IC, or an embedded passive device such as a capacitor or an inductor. Furthermore, the laminate substrate 901, having the device 923 embedded therein, can be bonded to another laminate substrate or a PCB 908 through solder balls 906 or micro-bumps, depending on applications.

Referring to FIG. 1D, a silicon photonics structure 93 includes a CMOS die 916, a waveguide RDL structure 918, a modulator 919 and a photodetector 920 embedded in the waveguide RDL structure 918, and an optical fiber 921 coupling an optical signal into or out of the waveguide RDL structure 918. A laser diode 917 and the waveguide RDL structure 918 as well as the components coupled to the waveguide RDL structure 918 are integrated over a silicon interposer 914 without or with TSVs. The silicon interposer 914, which is produced by wafer-level processes, is configured to be mounted on a substrate through a plurality of solder bumps, or micro-bumps 903 for external connections.

Referring to FIG. 1E, a C2W structure 94 includes a first carrier 940, a first die 941, and a second die 942. The first die 941 and the second die 942 are placed over the first carrier 940 through various suitable bonding technologies including flip-chip assembly based on micro-bumps and copper hybrid bonding. The first carrier 940 can be an active device or a passive device including an interposer with through vias 943, and the first carrier 940 serves as a platform to interconnect the first die 941 and the second die 942 and a substrate (not shown) upon which the C2W structure 94 is mounted.

Referring to FIG. 1F, a W2W structure 95 includes a first carrier 951, a second carrier 952, and an interconnect layer 953 electrically coupling the first carrier 951 to the second carrier 952. The interconnect layer 953 includes flip-chip bonding, polyimide (PI)-to-PI or oxide-to-oxide based copper hybrid bonding, or another suitable bonding structure. Through vias 954 can be formed, for example, in the first carrier 951 to establish electrical connections between the first carrier 951, the second carrier 952, and a substrate (not shown) upon which the W2W structure 95 is mounted using solder bumps, micro-bumps or solder balls 955.

In FIGS. 1A to 1F, interconnection between components is achieved in practice today by flip-chip assembly based on solder bumps, micro-bumps or BGA solder balls. Copper hybrid bonding which is relatively new to high-end applications including HPC, data center and AI applications in principle can be employed to achieve finer-pitch bonding compared to flip-chip and higher density function integration as warranted by applications.

A 3D IC typically contains ICs and/or connectors (e.g., interposers) having top or bottom faces of a same or a similar size. In some embodiments of the present disclosure, a semiconductor package structure to be interconnected via its side faces can be an IC stack comprising ICs of a same or a similar size, or an IC stack consisting of a number of packaging layers embedded with ICs of different sizes but of the same size following embedding, or an IC stack of both ICs and embedded ICs of the same sizes. Embedding of ICs is achieved using a fanout-like process and a potting material, a molding compound, or an encapsulation material, which is a dielectric material to ensure that ICs of different sizes in different stacked layers are of the same sizes after embedding. As a result, side-face interconnections of the 3D IC are formed using conductive edge connections such as edge contact pads or edge vias in the RDL, edge through-silicon vias and edge through-mold vias residing at the edges of packaging layers. The components integrated in the 3D IC can serve different electronic functions and preferably are available as known-good dies or components. They can include ICs, other types of active devices such as MEMS (micro-electromechanical system) devices, and passive devices. This means an essentially unlimited choice of components is available for stacking and embedding.

Figure 2B:
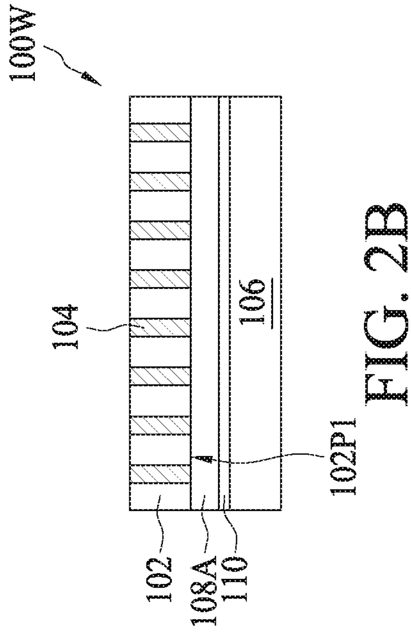
FIGS. 2A to 2C show cross-sectional views of structures in different stages of a method of manufacturing an integrated circuit (IC) structure, in accordance with some embodiments of the present disclosure.
Figure 2A:
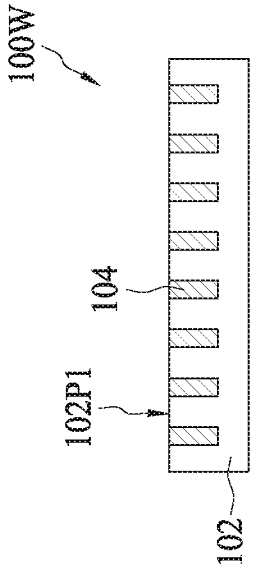
Figure 2C:
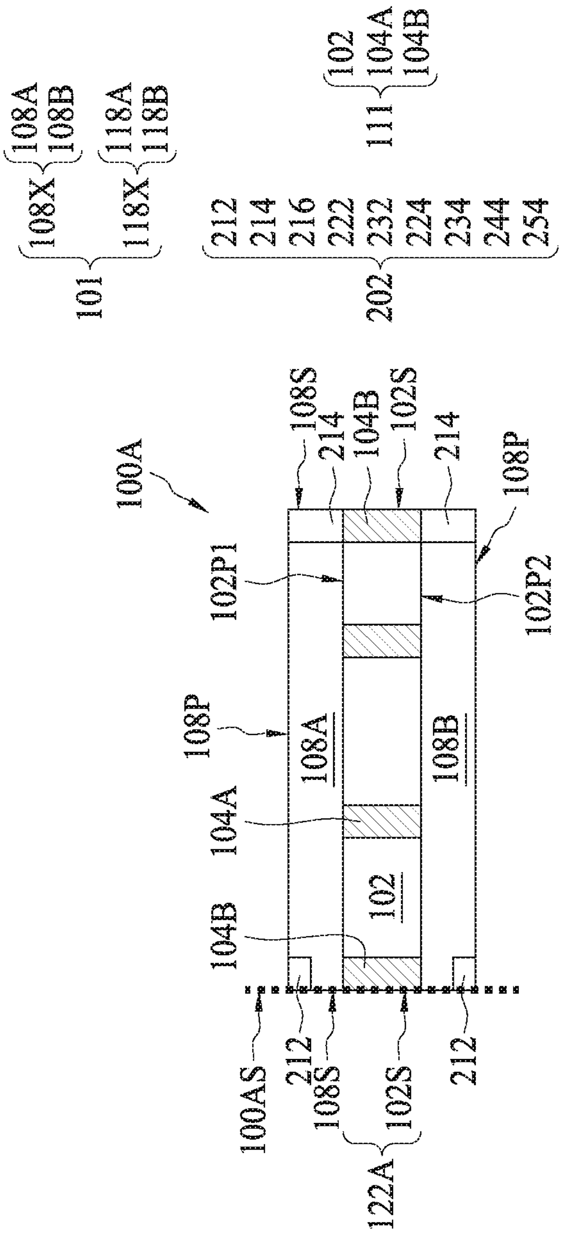

FIGS. 2A to 2C show cross-sectional views of structures in different stages of a method of manufacturing an IC structure 100A, in accordance with some embodiments of the present disclosure. According to some embodiments, the IC structure 100A shown in FIG. 2C is a semiconductor package device. The IC structure 100A may be formed from a semiconductor device 100W, which is a wafer-level device, wherein the IC structure 100A is formed by separating the semiconductor device 100W using a singulation or dicing process covering mechanical dicing, laser dicing, plasma etching or dicing, dry etching, wet etching (e.g., with an acid etch), the like, or a combination thereof.

Referring to FIG. 2A, the semiconductor device 100W is received or provided. Initially, a substrate 102 is provided or received. According to some embodiments, the substrate 102 is formed of a semiconductor material such as bulk silicon. According to some embodiments, the substrate 102 is formed of other semiconductor materials, such as silicon germanium, silicon carbide, gallium arsenide, or the like. In the present embodiment, the substrate 102 is a P-type semiconductive substrate (acceptor type). In some other embodiments, an N-type semiconductive substrate (donor type) can be used. Alternatively, the substrate 102 includes another elementary semiconductor, such as germanium; a compound semiconductor including gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or a combination thereof. In yet another embodiment, the substrate 102 includes portions to form a semiconductor-on-insulator (SOI) substrate. In other embodiment, the substrate 102 may include a doped epitaxial layer, a gradient semiconductor layer, and/or a semiconductor layer overlaying another semiconductor layer of a different type, such as a silicon layer on a silicon germanium layer.

A plurality of conductive vias 104 are formed in the substrate 102. The conductive vias 104 may extend from a primary surface 102P1 of the substrate 102 to a thickness of the substrate 102. Throughout the present disclosure, "primary surface" is used to indicate an upper surface or a bottom surface of a circuit or a device, which has a greatest surface area among six surfaces of a device or a layer. Similarly, "secondary surface" is used to indicate a lateral side surface of a circuit or a device (there are often four such side surfaces of the circuit or device), which has a surface area less than the surface area of the primary surface. The conductive vias 104 may include conductive materials, such as copper, tungsten, molybdenum, cobalt, ruthenium, titanium, tantalum, aluminum, silver, gold, or other suitable materials. The conductive vias 104 may include a single layer, or multilayer structure which can include a diffusion barrier layer, a seed layer to aid in electroplating, a filling layer, a combination thereof, or the like.

In an exemplary forming process of the conductive vias 104, a plurality of holes (not shown) are formed on the primary surface 102P1 of the substrate 102. The holes may be formed using a dry etch (e.g., a reactive ion etch, RIE), a wet etch, a combination thereof, or the like. Following hole opening, a deposition process, e.g., plasma enhanced chemical vapor deposition (PECVD), can be used to deposit silicon dioxide to passivate the hole openings and physical vapor deposition (PVD), sputter deposition, atomic layer deposition (ALD), or other suitable deposition operations is performed to deposit the materials of the conductive vias 104 in the holes and over the primary surface 102P1. The conductive vias 104 may be referred to herein as through-silicon vias (TSV) after the hole filling process.

According to some embodiments, a planarization process, e.g., chemical mechanical planarization (CMP), dry etching (e.g., using RIE), grinding, wet etching and/or other suitable etching operations is performed to remove excess conductive materials and planarize upper surfaces of the conductive vias 104 which are flush with the primary surface 102P1. Following planarization, a primary RDL 108A is deposited on the primary surface 102P1 with surface finish and pads for subsequent bonding as needed.

Referring to FIG. 2B, another substrate or a temporary carrier 106 is provided or received and the semiconductor structure 100W is bonded to the temporary carrier 106. According to some embodiments, the substrate 106 is a carrier substrate or a supporting substrate. The carrier substrate 106 may be formed of glass, silicon, ceramics, or other suitable carrier materials. A release layer 110 is formed over the carrier substrate 106. Examples of the release layer include release/adhesion layers commonly used in fan-out processes. The release layer 110 is an temporary layer formed over the carrier substrate 106 and can allow for easier removal of the carrier substrate 106 from the semiconductor device 100W by laser irradiation, thermos-mechanical release, grinding, CMP, dry or wet etching/cleaning, or a combination thereof.

Besides the release layers used in fan-out processing, the release layer can also be a combination of Ti (titanium)/Au (gold) on the carrier and Ti/Au on the backside of an IC structure. Au here can also be Cu (copper) or a solder on both surfaces. Compression or reflow bonding can be used to achieve bonding of the carrier and the IC structure. Annealing is optional and can be done on an as-needed basis. When silicon is used as the carrier, the release layer can be $SiO_2$, $Si_3N_4$ and others that are common in wafer BEOL and/or MEMS/NEMS processing. The release layers as such may also serve as the permanent bonding layers between IC structures (such as those shown in FIG. 7B).

Pre-bonding conditioning of the carrier and the IC structure surfaces can involve:

Chemical mechanical polish (CMP) to achieve, preferably a surface roughness, RA (arithmetic average roughness or sometimes root mean square roughness)<1 nm for both diamond and silicon when needed. This level of RA can be achieved by CMP for silicon, and by a combination of sacrificial $SiO_2$ layer deposition, and $SiO_2$ planarization by CMP and deep reactive ion etching (DRIE) for diamond, Wet surface pre-treatments involving ultrasonic de-ionized (DI) water clean, $H_2SO_4/H_2O_2$ treatment, $NH_3/H_2O_2$ treatment, and $N_2$ blow dry Plasma/inductively coupled plasma reactive ion etching (ICP-RIE): $O_2$, $H_2/O_2$, Deep RIE (DRIE): $O_2/CF_4$, and Activation of the bonding surfaces (with and/or without the glue layers) inside bonding machines prior to bonding by a fast atom beam gun, FAB (using, for instance, argon neutral atom beam at ~1 keV), or by an ion gun (using for instance, argon ion at ~60 eV) to remove oxide films in vacuum and to reveal dangling bonds at the surfaces for bonding.

(Note 1: FAB works well for (sputtered) Si/Si, Si/$SiO_2$, metals, compound semiconductors and single crystal oxides, while ion guns is known to work for $SiO_2/SiO_2$, Glass, $Si_3N_4$ (silicon nitride)/$Si_3N_4$, Si/Si, Si/$SiO_2$, metals, compound semiconductor, and single crystal oxides.)

(Note 2: A vacuum of $10^{-6}$ Pa (pascal) is required during bonding to prevent re-adsorption to activated bonding surfaces.)

Besides the aforementioned direct bonding approaches, an ultrathin glue or bonding layer such as CVD poly-silicon (poly-Si) can be deposited on the mating IC structures (FIG. 7B) as a permanent bonding layer or on both the IC structure and the carrier as a temporary release layer to achieve high low-temperature direct bonding yield. For heat sensitive applications, poly-Si (whose thermal conductivity, TC, is more than 100 times that of $SiO_2$) is preferred over $SiO_2$ for use to create the thin bonding layers in terms of minimizing the thermal resistivity impact to the final IC or package structure. Glue layers are typically ultrathin, around 100 nm or less than 100 nm, to minimize their thermal impacts. When used as a permanent layer, higher-TC and lower-thermal expansion materials are preferred. Glue layer candidates include the following and their combinations (or alloys):

Non-metals: Si (e.g., poly-silicon), $SiO_2$, $Si_3N_4$, $Al_2O3_3$ (alumina), diamond, boron nitride, graphene Metals: Ti, W, Pt, Cr, Au, Cu, Ir, nickel (Ni), iron (Fe), Ag—In, Au—In, Ag, Sn, Mo Metal-on-oxides: Ir on $SrTiO_3$, Ir on YSZ/Si, Ir on MgO, sapphire or $TaO_3$ When metallic glue layers are used for bonding the IC structures (see, for instance, FIG. 7B), it is advisable to deposit a barrier layer such as Ti on the backside of the IC structures prior to glue layer deposition to prevent metal diffusion in silicon lattices which can poison the devices. This is particularly true for ultrathin ICs. Diamond growth on silicon seed is a common practice during diamond CVD. Silicon nitride ($Si_3N_4$) is common in wafer BEOL processing. Alumina can be deposited by atom layer deposition. When it comes to extreme thermal conductivity, graphene is another material worth considering besides diamond. In monolayer, graphene can have a thermal conductivity of 30-50 W/cm·K. It can be considered as a glue or bonding layer assuming proper 3D molecular structures. Graphene can be grown on the silicon (100) surface using a direct cobalt-assisted two-step ion beam synthesis. It can also be grown on silicon through a simple transfer-free synthesis method. Epitaxial graphene can be grown on crystalline and semi-insulating surface (e.g., SiC and silicon), and graphene nanostructures with exceptional properties have been realized by a selective growth process on SiC surface. In addition to diamond and graphene, boron nitride merits attention with cubic boron nitride in particular as it is known to have a similar crystalline structure to diamond and a high in-plane TC (~16 W/cm·K). Furthermore, the glue layer can be a combination of Ti/Au on one IC structure and Ti/Au on the backside of another IC structure for bonding. Prior to Au deposition and as needed, thin metallization based on Ti, W or Cr can also be deposited. Thin layers of transient liquid bonding materials such as silver-indium (Ag—In) and Au—In, sintered Ag, In, Au or Cu can also be applied with matching metallization (e.g., Au, Ag or Cu). Glue layers can be deposited by CVD, atomic layer deposition (ALD), physical vapor deposition, thermal oxidation (in the case of silicon) or other means. Following deposition, glue layers can be conditioned through a combination of the aforementioned pre-bonding surface pre-treatments, DRIE (e.g., using a mixture of $SF_6$ and $O_2$), plasma/ICP-RIE (using $O_2$, Ar, $N_2$, Ar/$O_2$), and FAB (using, e.g., Ar neutral atom) or ion gun (using, e.g., Ar ion) in bonding stations.

Following the creation of the primary RDL 108A, the planarized structure with the primary RDL 108A is bonded to the substrate 106 with the help of the release layer through- and the bulk portion of the substrate 102 underlying the conductive vias 104 is removed to expose bottom surfaces of the conductive vias 104 (see FIG. 2B). Another RDL 108B can then be deposited on the revealed conductive vias 104 in FIG. 2B, complete with surface finish and solder bumps or micro-bumps as needed. Following the formation of the RDL 108B, mounting of the resultant structure with the RDL 108A and 108B on the carrier 106 on a wafer mount tape frame, release of the carrier 106, and singulation of the individual packages, the semiconductor structure 100A in FIG. 2C is formed.

Figure 2D:
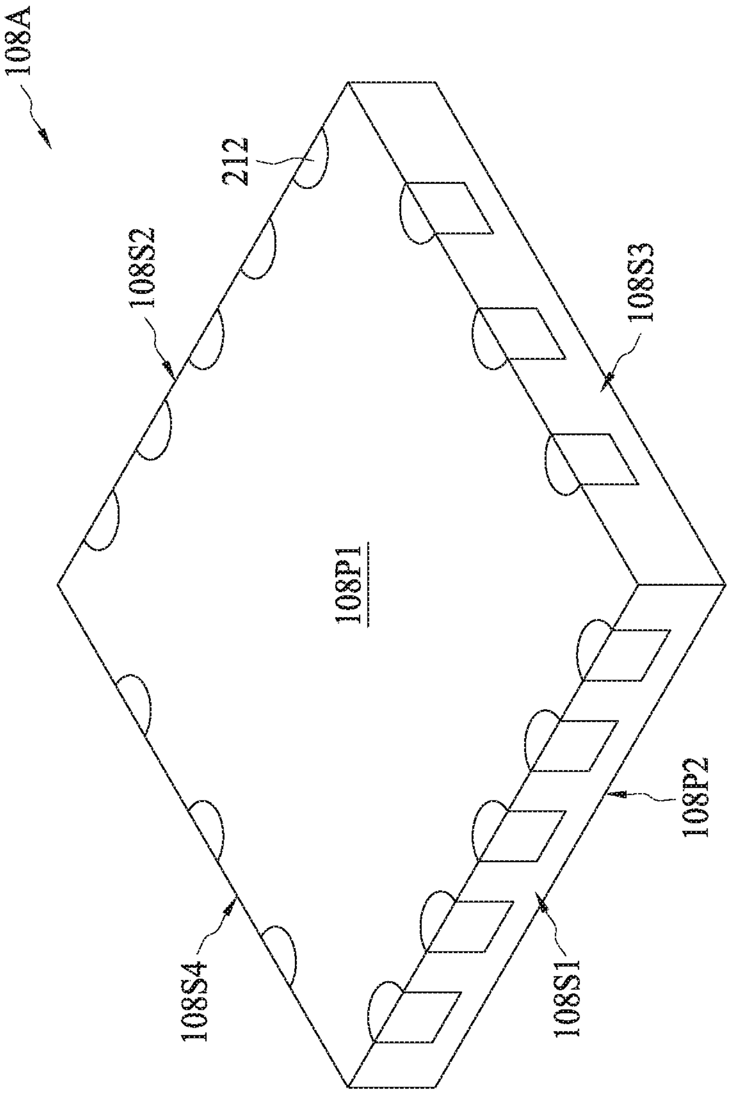
FIG. 2D shows a perspective view of a redistribution layer, in accordance with various embodiments of the present disclosure.
Figure 2F:
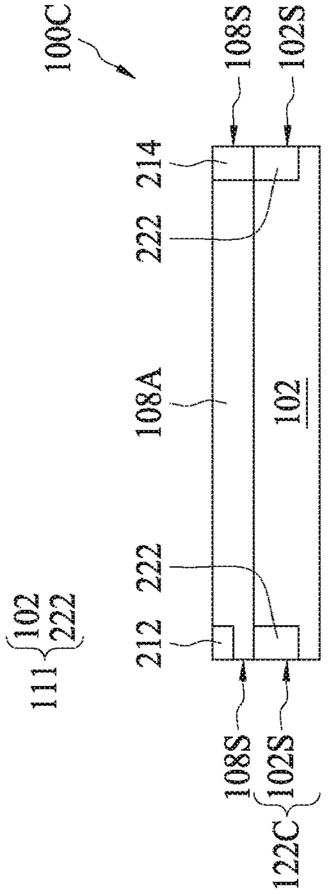
FIGS. 2E and 2F show cross-sectional views of an IC structure, in accordance with various embodiments of the present disclosure.

Based on the processes shown in FIGS. 2A to 2C, various layers, and structures can be formed to create the semiconductor structure 100A containing exposed edge pads, edge vias and edge TSVs which can go all the way or partially through the thickness of the silicon or the potting material, or its subset, for instance, a structure containing only the RDL 108A with edge pad/via interconnections in the RDL (FIG. 2E), or a structure containing both the RDL 108A with edge interconnections and edge TSVs (see FIG. 2F).

According to some embodiments, the release layer 110 includes a polymer-based material. According to some embodiments, the release layer 110 is an epoxy-based thermal release material, such as a light-to-heat-conversion (LTHC) release coating, which loses its adhesive property when heated or exposed to a laser. According to other embodiments, the release layer 110 is an ultraviolet (UV) glue, which loses its adhesive property when exposed to UV light. The release layer 110 may be thermoplastic or thermoset material. According to some embodiments, the release layer 110 includes polyimide or silicone-based materials. According to some other embodiments, the release layer 110 is a mixture of metal and non-metal materials. Metal candidates of the release layer can include nickel, chromium, titanium, gold, copper, manganese, iron, cobalt, tungsten, molybdenum, ruthenium, and tantalum, whereas non-metal candidates can include oxides, nitrides, phosphates and chromates of the metals. The release layer 110 may be disposed by spin-coating as a liquid and cured. In other embodiments, the release layer 110 may be a laminate film laminated on the carrier substrate 106. In yet some other embodiments, bonding between the substrate 102 and the temporary carrier 106 can be achieved by direct bonding based on, for instance, oxide-to-oxide or polyimide-to-polyimide without needing the release layer 110.

The RDL 108A is part of an interconnect structure 101 of the IC structure 100A. The RDL 108A includes one or more interconnected conduction paths formed through one or more conductive lines in conductive line layers and one or more conductive vias in conductive via layers (not separately shown) to route power and signals of a first circuit from one side of the RDL 108A to a second circuit on the same side or on an opposite side of the RDL 108A. The RDL 108A may include an encapsulating material (or an encapsulant such as a polyimide or an oxide layer to facilitate direct or copper hybrid bonding) encapsulating the conductive line layers and the conductive via layers. According to some embodiments, the encapsulating material includes one or more dielectric materials, e.g., silicon oxide, silicon nitride, silicon carbide, silicon oxynitride, polyimide, a combination thereof, or the like. Due to use of the RDL 108A of the interconnect structure 101, distribution of signals and power of devices or circuits in the IC structure 100A can meet design requirements. Throughout the present disclosure, an RDL, e.g., the RDL 108A, which is formed on a primary surface, e.g., the primary surface 102P1, of a circuit or a device is referred to as a primary RDL 108A. More structural details of the primary RDL 108A are discussed below.

According to some embodiments, the substrate 102 is arranged over and bonded to the primary RDL 108A. The bonding of the substrate 102 to the primary RDL 108A may be performed using thermal bonding, thermos-compression bonding, flip-chip bonding, hybrid bonding, or the like. Although not illustrated, the conductive vias 104 of the substrate 102 are electrically coupled to one of the conductive lines or one of the conductive vias of the primary RDL 108A to extend a signal-delivery network or a power-delivery network of the RDL 108A. Further, an upper portion of the substrate 102 is removed or thinned from a top portion of the substrate 102. The bottom surfaces of the conductive vias 104 are exposed accordingly. The removal or thinning of the upper portion of the substrate 102 may be performed using CMP, grinding, a dry etch (e.g., RIE), a wet etch, or the like. The conductive vias 104 then become the TSVs 104 accordingly.

Referring to FIG. 2C, a singulation or dicing process is performed to separate the semiconductor device 100W into individual IC structures 100A following mounting of the structure with RDL 108A and RDL 108B on a wafer mount frame, and release of the carrier 106. The singulation or dicing process may be performed using a diamond blade, a laser, a plasma with a masking layer deposited on, for instance, the RDL 108A, wet etching or a combination thereof to singulate the semiconductor devices 100W along scribe lines to form the individual IC structures 100A. The interconnect structure 101 in the IC structure 100A comprises the TSV die 122A, an interior interconnect structure 108X such as interior pads and vias in the RDLs 108A, 108B, and an edge interconnect structure 118X such as edge pads and vias in the RDLs.

During singulation or dicing, the areas that are cut away are called dicing, saw or die streets and they are typically between 50 μm to 100 μm wide. Dicing saw may use a diamond blade which rotates at 30,000 rounds per minute and is cooled with de-ionized water. To reveal the edge pads or vias, it is preferable that the sizes of the edge pads or vias are comparable to the dicing street width and dicing is carried out in immediate vicinity of the edge pads or vias (but not directly through the edge pads or vias), followed by light wet etching of the silicon as needed and warranted. To minimize bottom side chipping during mechanical blade dicing, it can be advantageous to dice the wafer first with the carrier support, followed by carrier release. Laser ablation dicing which can enable a dicing street width of 10 μm can also be used first to remove the fine wire layer on the dicing street's surface (and expose the edge pads adjacent to it) using a non-contact laser, followed by cutting the residual substrate with laser scribing and/or blade dicing. This process reduces problems like chipping, die cracking, and layer peeling. In laser ablation dicing, the laser heats the material to such a temperature that the area under the laser spot is ablated or simply vaporized. Alternatively, dicing can be carried out by stealth dicing which is dry and does not require liquid. Stealth dicing works as a two-stage process in which a laser beam (e.g., a pulsed Nd: YAG laser at the 1064 nm wavelength for silicon) is first directed to scan along intended cut lines to create defect regions and then an underlying membrane film (which is attached to wafer, followed by wafer carrier release) is expanded to induce fracture. Stealth laser dicing has the potential to replace blade dicing as a next generation ultrathin wafer singulation technology in support of 3D IC packaging as stealth laser allows for faster cutting, higher accuracy, less damage, and a smaller dicing street width. In comparison with mechanical and laser dicing, plasma dicing (also known as deep reactive ion etching) is a relatively new method of applying the Bosch dry etch process that can render the dies particle- and contamination-free with high-precision cuts. This method requires a custom mask design for effective plasma dicing. It etches all narrow dicing streets at the same time into the wafer using a plasma gas such as sulfur hexafluoride, resulting in high precision, throughputs and quality. Plasma dicing can produce cuts that are non-rectangular in shape, which is beyond the reach of blade dicing. Plasma dicing causes minimal damage to the wafer surface or trench sidewall, resulting in better die strengths, improved device reliability, and longer device life. Plasma dicing is fast gaining popularity within the semiconductor industry as the preferred solution, particularly as chips become smaller, thinner and more complex.

As a result of the singulation or dicing process, the IC structure 100A includes four secondary planes or side planes 100AS, although FIG. 2D only illustrates two secondary planes 100AS. The TSV die 122A includes side surfaces 102S on its four sides, while the primary RDL 108A and the primary RDL 108B include side surfaces 108S on their four sides. Throughout the present disclosure, the side surfaces 108S may also be referred to as the edge surface 108S. The side surface 102S of the TSV die 122A and the side surfaces 108S of the two primary RDLs, 108A, and 108B, together constitute or coincide with the secondary plane 100AS of the IC structure 100A. Through appropriate arrangement, the TSVs 104 are formed in the TSV die 122A and comprise two TSV types after the singulation or dicing process: interior TSVs 104A and edge TSVs 104B, wherein the interior TSV 104A is fully surrounded by the substrate 102 and the primary RDLs 108A and 108B, while the edge TSV 104B has at least one side surface exposed through the side surfaces 102S of the substrate 102.

Similarly, the primary RDL 108A or 108B includes conductive pads 212 and conductive vias 214, formed from conductive elements 202 such as the conductive lines and the conductive vias, respectively, wherein the conductive elements 202 comprise two parts: interior conductive elements 202 and edge conductive elements 202. Throughout the present disclosure, the conductive elements 202 may also be referred to as the first conductive elements 202. Through appropriate arrangement, the conductive pads 212 and the conductive vias 214 are formed in the IC structure 100A and comprise two parts after the singulation or dicing processes: interior conductive pads/vias, 212 and 214, and edge conductive pads/vias, 212 and 214, in which the interior conductive pads/vias, 212 and 214, are fully surrounded by the substrate material and the encapsulating material of the two primary RDLs, 108A and 108B, while the edge conductive pads/vias 212, 214 have at least one side surface exposed through the side surfaces 108S of the primary RDL, 108A or 108B.

According to some embodiments, the edge conductive pads 212 have at least one upper surface exposed through a primary surface 108P of the primary RDL 108A or 108B. The interior or edge conductive pads 212 may be arranged on a topmost conductive line layer of the respective primary RDL 108A or 108B, which is most distal to the TSV die 122A. According to some embodiments, the conductive pads 212 are arranged parallel to the primary surface 108P of the primary RDL 108A or 108B. The conductive pads 212 may stop short of the TSV die 122A. Further, the edge conductive pads 212 have at least one side surface exposed through the secondary plane 100AS of the IC structure 100A or the secondary surface 108S of the primary RDL 108A or 108B.

Likewise, according to some embodiments, the edge conductive vias 214 have at least one upper surface exposed through the primary surface 108P of the primary RDL 108A or 108B. The edge conductive vias 214 may be arranged to extend through a thickness (in a z-direction) of the respective primary RDL 108A or 108B. According to some embodiments, the edge conductive vias 214 are referred to herein as the TSVs of the primary RDL 108A or 108B. Further, the edge conductive vias 214 have at least one side surface exposed through the secondary plane 100AS of the IC structure 100A or the secondary surface 108S of the primary RDL 108A or 108B. The body 111 of the IC structure 100A may include the substrate 102, the interior TSVs 104A, and the edge TSVs 104B. The primary surface 102P (including primary surfaces 102P1 and 102P2) of the body 111 includes a coplane made up of the corresponding surfaces of the substrate 102, the interior TSVs 104A, and the edge TSVs 104B. According to some embodiments, the secondary surface of the body 111 coincides with the secondary plane 100AS of the IC structure 100A.

FIG. 2D shows a perspective view of the primary RDL 108A or 108B, in accordance with various embodiments of the present disclosure. The primary RDL 108A or 108B includes primary surfaces 108P, e.g., an upper primary surface 108P1 and a lower primary surface 108P2, and four secondary (side) surfaces 108S, e.g., a front secondary surface 108S1, a rear secondary surface 108S2, a right secondary surface 108S3 and a left secondary surface 108S4. A plurality of conductive elements 202, e.g., the conductive pads/vias 212, are formed on the primary RDL 108A or 108B and exposed through the four secondary surfaces 108S. The arrangement of the conductive pads 212 of the primary RDL 108A or 108B in FIG. 2D is shown for illustrative purposes. The conductive pad 212 or other conductive elements can be formed or exposed through one or more of the four secondary surfaces 108S.

As discussed above, throughout the present disclosure, the TSVs 104 (see 104A and 104B in FIG. 2C), the conductive pads 212, the conductive vias 214 and all other conductive members of the interconnect structure 101 in FIG. 2C are part of what are collectively referred to as the conductive elements 202 in the interconnect structure 101 of the IC structure 100A. The TSVs 104, the conductive pads 212 and the conductive vias 214 are configured to form at least part of the interconnect structure 101 of the IC structure 100A for fan-in or fan-out interconnections for devices or package layers to be electrically coupled to the IC structure 100A through the two primary surfaces 108P in FIG. 2C (i.e., the upper primary surface 108P1 and the lower primary surface 108P2; see FIG. 2D) of the IC structure 100A, as well as through the four secondary surfaces, 108S1 through 108S4 (see FIG. 2D), of the IC structure 100A. According to some embodiments, the TSVs 104 and the conductive vias 214 of the primary RDLs 108A and 108B can be coupled to form a collective TSV of the IC structure 100A. For example, the right-side edge conductive via 214 (FIG. 2C) of the primary RDL 108A, the right-side edge TSV 104 and the right-side edge conductive via 214 of the primary RDL 108B constitute a stacked edge TSV of the IC structure 100A to extend through the substrate thickness of the IC structure 100A.

Figure 2E:
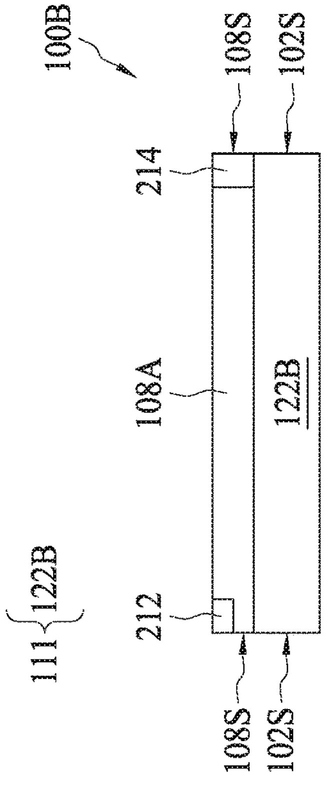

FIG. 2E shows a cross-sectional view of an IC structure 100B, in accordance with various embodiments of the present disclosure. The IC structure 100B is similar to the IC structure 100A in many aspects, e.g., the primary RDL

108A, the conductive pad 212 and the conductive via 214, and therefore details of such similar aspects are not repeated for brevity. A main difference between the IC structure 100A and the IC structure 100B is that the TSV die 122A of the IC structure 100A is replaced with a semiconductor die 122B in the IC structure 100B, and the primary RDL 108B in the IC structure 100A is absent from the IC structure 100B. According to some embodiments, the semiconductor die 122B can be at least one of a CPU die, a GPU die, a TPU die, a MEMS die, an AP die, an FPGA die, an ASIC die, a memory die, a transceiver die, a network interface die, an integrated photonics die, a packet buffer/router die or another suitable die. The semiconductor die 122B may include a substrate 102 comprising a material similar to that of the substrate 102 of the IC structure 100A shown in FIG. 2D. The semiconductor die 122B therefore constitutes a substrate or body 111 of the IC structure 100B. In other words, the body 111 of the IC structure 100B may include the semiconductor die 122B. The primary surface and the secondary surface of the body 111 of the IC structure 100B can be referred to those described with reference to the IC structure 100A of FIG. 2C and are not repeated here for brevity. According to some embodiments, the semiconductor die 122B does not include any edge interconnect structure 118X exposed through the side surfaces 102S of the semiconductor die 122B.

FIG. 2F shows a cross-sectional view of an IC structure 100C, in accordance with various embodiments of the present disclosure. The IC structure 100C is similar to the IC structure 100B in many aspects, e.g., the primary RDL 108A, the conductive pad 212, and the conductive via 214, and therefore details of such similar aspects are not repeated for brevity. Further, the IC structure 100C includes a semiconductor die 122C, which can be at least one of a CPU die, a GPU die, a TPU die, a MEMS die, an AP die, an FPGA die, an ASIC die, a memory die, a transceiver die, a network interface die, an integrated photonics die, a packet buffer/router die or another suitable die. The semiconductor die 122C may include a substrate 102 similar to the substrate 102 of the IC structure 100A shown in FIG. 2D. A main difference between the semiconductor die 122C and the semiconductor die 122B is that the semiconductor die 122C further includes an edge interconnect structure 118X, e.g., edge conductive pads 222, exposed through the secondary planes or side surfaces 102S of the semiconductor die 122C. According to some embodiments, an edge conductive pad 222 is electrically connected to the conductive via 214 of the primary RDL 108A for establishing a stacked conductive via for the semiconductor die 122C. The semiconductor die 122C therefore constitutes a body 111 of the IC structure 100C. In other words, the body 111 of the IC structure 100C may include the semiconductor die 122C. The primary surface and the secondary surface of the body 111 of the IC structure 100C can be referred to those described with reference to the IC structure 100A of FIG. 2C and are not repeated here for brevity.

Figure 2G:
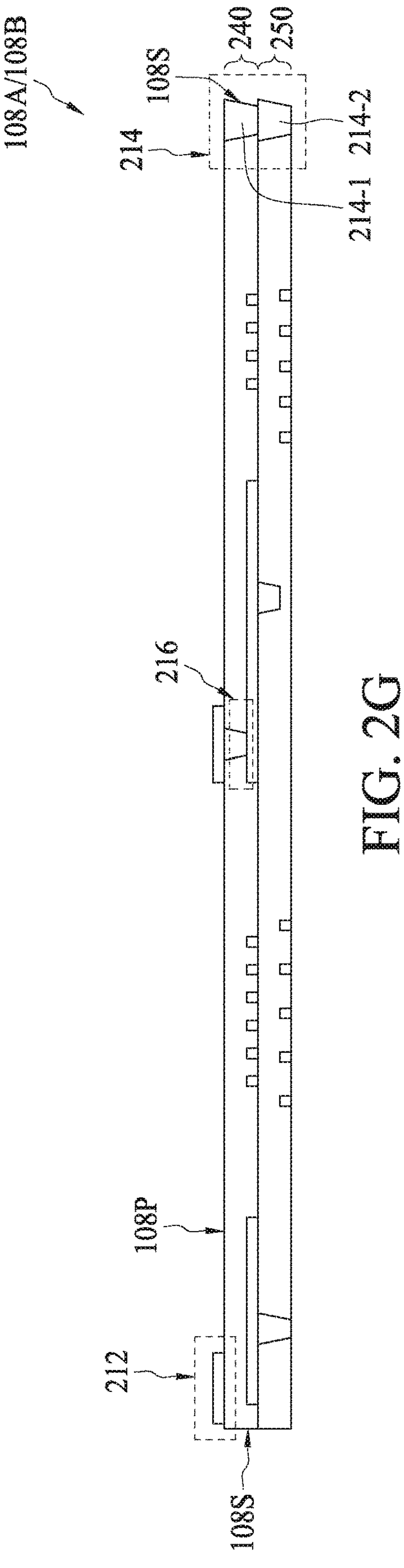
FIG. 2G shows a cross-sectional view of a redistribution layer of the IC structure shown in FIGS. 2B, 2C, 2E and 2F, in accordance with various embodiments of the present disclosure.

FIG. 2G shows a cross-sectional view of a primary RDL 108A or 108B of the IC structure 100A, 100B or 100C shown in FIGS. 2B to 2F, in accordance with various embodiments of the present disclosure. As illustrated in FIG. 2G, the primary RDL 108A or 108B is formed of a first major conductive line/via layer 240 and a second major conductive line/via layer 250 under the first major conductive line/via layer 240. Each of the first major conductive line/via layer 240 and the second major conductive line/via layer 250 includes one or more conductive lines and conductive vias (all of which are part of the collective conductive elements 202 of the interconnect structure 101 in the primary RDL 108A or 108B) extending in a horizontal or vertical direction. The conductive lines or vias are electrically insulated by a dielectric layer, referred to as an inter-metal dielectric (IMD) layer. The IMD layer may include one or more dielectric materials, such as silicon oxide, silicon nitride, silicon oxynitride, silicon carbide, polyimide, or other suitable dielectric materials. Some of the conductive vias in the first major conductive line/via layer 240 extend half-way in the vertical direction, while some of the conductive vias, e.g., a conductive via 214-1, in the first major conductive line/via layer 240, extend through an entire thickness of the first major conductive line/via layer 240. Similarly, some of the conductive vias in the second major conductive line/via layer 250 extend halfway in the vertical direction, while some of the conductive vias, e.g., a conductive via 214-2, in the second major conductive line/via layer 250, extend through a thickness of the second major conductive line/via layer 250. The conductive vias 214-1 and 214-2 are electrically connected to form a stacked conductive via 214 of the primary RDL 108A or 108B traversing the primary RDL 108A or 108B. Throughout the present disclosure, the stacked conductive via 214 may also be referred to as the stacked via 214. According to some embodiments, the first major conductive line/via layer 240 includes two conductive line layers and a conductive via layer between the two conductive line layers, wherein a conductive via 216 is arranged in the conductive via layer to electrically connect two conductive lines in the adjacent conductive line layers, Referring to FIG. 2F and FIG. 2G, the conductive via 214 of the IC structure 100C shown in FIG. 2F is considered a conductive via connecting the adjacent first and second major conductive line/via layers, 240 and 250. According to some embodiments, the stacked conductive via 214 is part of the edge interconnect structure 118X and is exposed through a secondary surface 108S of the primary RDL 108A or 108B. Although FIG. 2G illustrates only two major conductive line/via layers, 240 and 250, the present disclosure is not limited thereto. Other numbers of major conductive line/via layers and configurations of conductive lines or conductive vias in each major conductive line/via layer are also within the contemplated scope of the present disclosure.

Figure 3A:
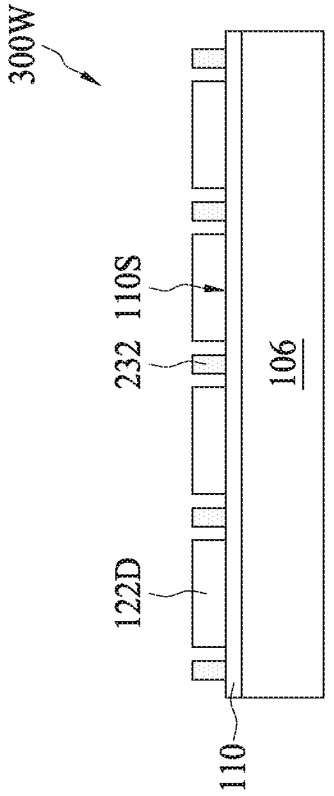
FIGS. 3A to 3D show cross-sectional views of structures in different stages of a method of manufacturing an IC structure, in accordance with some embodiments of the present disclosure.
Figure 3B:
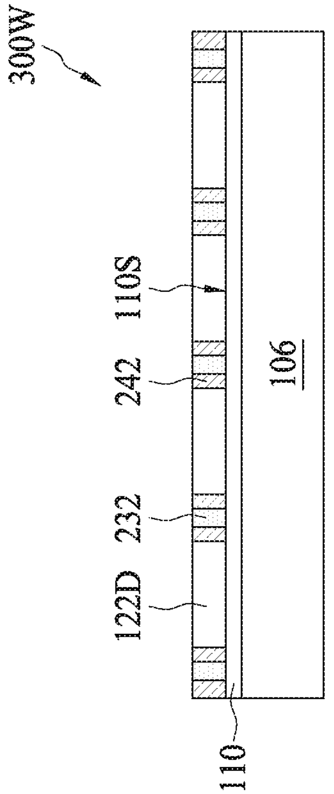
Figure 3C:
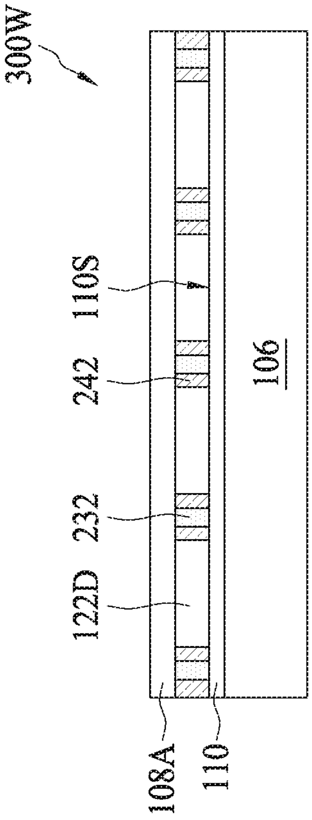
Figure 3D:
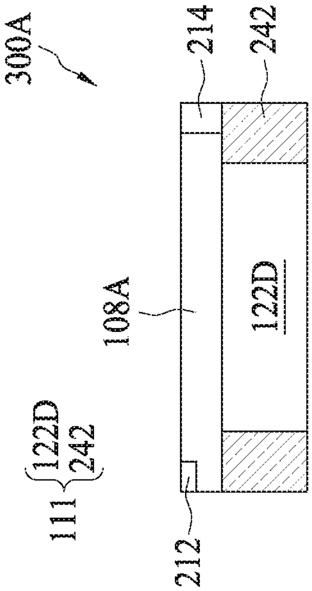

FIGS. 3A to 3D show cross-sectional views of structures in different stages of a method of manufacturing an IC structure 300A, in accordance with some embodiments of the present disclosure. According to some embodiments, the IC structure 300A shown in FIG. 3D is a semiconductor package device. The IC structure 300A may be formed from a semiconductor device 300W, which is a wafer-level device, wherein the IC structure 300A is formed by separating the semiconductor device 300W using a singulation or dicing process.

Referring to FIG. 3A, the carrier substrate 106 is received or provided. Further, the release layer 110 is formed over the carrier substrate 106 as in the case of FIGS. 2A to 2C. A plurality of semiconductor dies 122D are arranged over the release layer 110. The semiconductor die 122D may include at least one of a CPU die, a GPU die, a TPU die, a MEMS die, an AP die, an FPGA die, an ASIC die, a memory die, a transceiver die, a network interface die, an integrated photonics die, a packet buffer/router die or another suitable die. Further, a plurality of conductive pillars or vias 232 are created over the release layer 110 in between adjacent semiconductor dies 122D with suitable pitches and are encapsulated by a molding compound or a suitable potting material (such as an epoxy, for instance, Epotek 377) as shown in FIG. 3B. The conductive vias 232 may be alternately created in the semiconductor dies 122D. The plurality of semiconductor dies 122D and the conductive vias (pillars) 232 are referred to herein as a reconstituted structure and arranged on a carrier surface 110S of the release layer 110 or the carrier substrate 106. The conductive vias 232 may include a conductive material, e.g., tungsten, copper, titanium, tantalum, molybdenum, ruthenium, cobalt, aluminum, silver, gold, or another suitable material. The plurality of semiconductor dies 122D and the conductive vias 232 may have substantially equal heights. According to some embodiments, the semiconductor dies 122D and the conductive vias 232 are arranged over the release layer 110 by a pick-and-place bonding process.

Referring to FIG. 3B, the reconstituted structure of the semiconductor device 300W is molded or encapsulated using a potting material (e.g., an encapsulating material, a molding material or an insulating element) 242. The potting material 242 may include a dielectric material, such as silicon oxide, silicon nitride, silicon carbide, silicon oxynitride, epoxy-based molding material, a polymeric material, or the like. A molding or a deposition process is performed to deposit the potting material 242 in between the semiconductor dies 122D and the conductive vias 232 which can be created prior to bonding of the semiconductor dies 122D and potting material deposition. According to some embodiments, a planarization process, e.g., CMP, grinding, wet etching, a dry etch (e.g., RIE), and/or another suitable etching operation, is performed to remove excess potting material 242 and planarize an upper surface of the potting material 242 revealing the conductive vias 232 from the upper surfaces of the semiconductor dies 122D. According to some embodiments, since the conductive vias 232 are within and laterally surrounded by the potting material 242, the conductive vias 232 are also referred to herein as through-molding vias (TMV) 232.

Referring to FIG. 3C, the primary RDL 108A is formed over the upper surfaces of the potting material 242, the semiconductor dies 122D and the TMVs 232. Materials, configurations and methods of forming the primary RDL 108A are similar to those described with reference to FIGS. 2B to 2G, and repeated description of the primary RDL 108A is omitted for brevity.

Referring to FIG. 3D, a singulation or dicing process is performed to separate the semiconductor device 300W into individual IC structures 300A. Further, the carrier substrate 106 is removed or detached from the semiconductor device 300W by releasing the release layer 110 from the semiconductor device 300W. Through appropriate arrangement, the conductive pads/vias 212/214 are formed in the IC structure 300A and comprise two pad/via types after the singulation or dicing process: interior conductive pads/vias (not separately shown) 212 and edge conductive pads/vias 214. Properties of the conductive pads/vias 212 and the conductive pads/vias 214 are similar to those of the IC structure 100C shown in FIG. 2F, and repeated description thereof is omitted for brevity. The IC structure 300A is different from the IC structure 100C mainly in that in the IC structure 300A, the semiconductor die 122D is laterally surrounded or encapsulated by the potting material 242 while in the case of 100C only the edges of the die and RDLs are exposed. The semiconductor die 122D and the potting material 242 constitute a body 111 of the IC structure 300A. In other words, the body 111 of the IC structure 300A may include the semiconductor die 122D and the potting material 242. The primary surface and the secondary surface of the body 111 of the IC structure 300A can be referred to those described with reference to the IC structure 100A of FIG. 2C and are not repeated here for brevity.

Figure 3F:
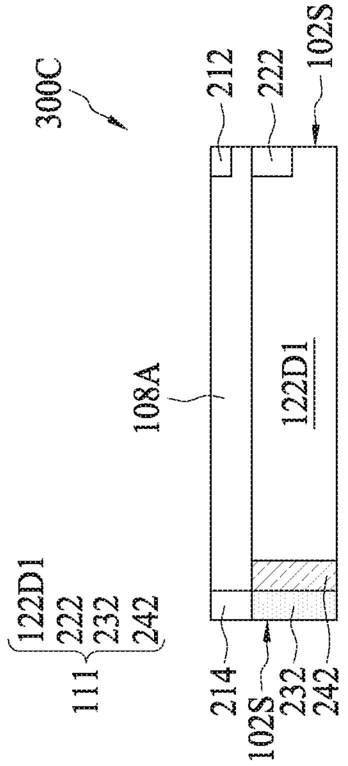
FIGS. 3E and 3F show cross-sectional views of an IC structure, in accordance with various embodiments of the present disclosure.
Figure 3E:
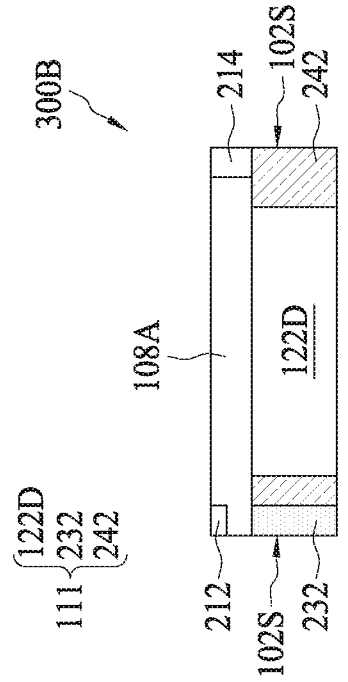

FIG. 3E shows a cross-sectional view of an IC structure 300B, in accordance with various embodiments of the present disclosure. The IC structure 300B is similar to the IC structure 300A in many aspects, e.g., the primary RDL 108A, the conductive pad 212 and the conductive via 214, and therefore details of such similar aspects are not repeated for brevity. A main difference between the IC structure 300A and the IC structure 300B is that, in addition to the semiconductor die 122D and the potting material 242, a body 111 of the IC structure 300B further includes an edge TMV 232, which extends through a thickness of the semiconductor die 122D or partially through a thickness of the semiconductor die 122D. The edge TMV 232 is part of the edge interconnect structure 118X. The body 111 of the IC structure 300B may include the semiconductor die 122D, the edge TMV 232 and the potting material 242. The primary surface and the secondary surface of the body 111 of the IC structure 300B can be referred to those described with reference to the IC structure 100A of FIG. 2C and are not repeated here for brevity.

FIG. 3F shows a cross-sectional view of an IC structure 300C, in accordance with various embodiments of the present disclosure. The IC structure 300C is similar to the IC structure 300B in many aspects, e.g., the primary RDL 108A, the conductive pad 212, the conductive via 214 and the TMV 232, and therefore details of such similar aspects are not repeated for brevity. Further, the IC structure 300C includes a semiconductor die 122D1, which replaces the semiconductor die 122D and can be at least one of a CPU die, a GPU die, a TPU die, a MEMS die, an AP die, an FPGA die, an ASIC die, a memory die, a transceiver die, a network interface die, an integrated photonics die, a packet buffer/router die or another suitable die. A main difference between the semiconductor die 122D and the semiconductor die 122D1 is that the semiconductor die 122D1 further includes a portion of the edge interconnect structure 118X, e.g., an edge conductive pad 222 exposed through the secondary planes or side surfaces 102S of the semiconductor die 122D1. Materials, configuration and a method of forming the edge conductive pad 222 of the IC structure 300C are similar to those of the conductive via 222 described with reference to FIG. 2F. A body 111 of the IC structure 300C therefore includes the semiconductor die 122D1, the potting material 242, the conductive via 222 and the TMV 232. The primary surface and the secondary surface of the body 111 of the IC structure 300C can be referred to those described with reference to the IC structure 100A of FIG. 2C and are not repeated here for brevity. According to some embodiments, the primary RDL 108A of the IC structure 300C includes a conductive via 214 electrically connected to the TMV 232 in the body 111 of the IC structure 300C for establishing a stacked conductive via for the IC structure 300C.

Figure 4A:
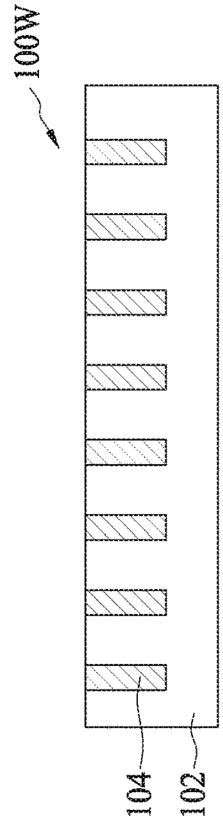
FIGS. 4A to 4G show cross-sectional views of structures in different stages of a method of manufacturing an IC structure, in accordance with some embodiments of the present disclosure.
Figure 4B:
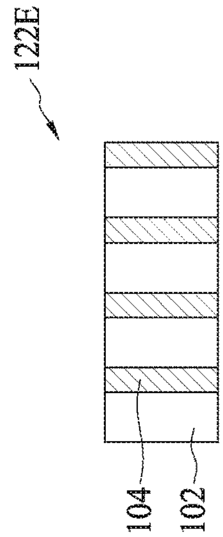
Figure 4C:
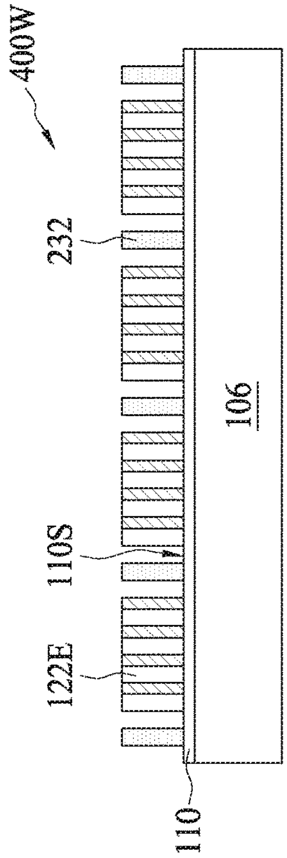
Figure 4D:
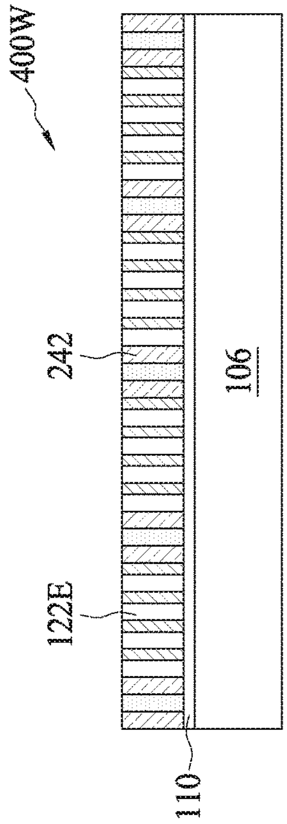
Figure 4E:
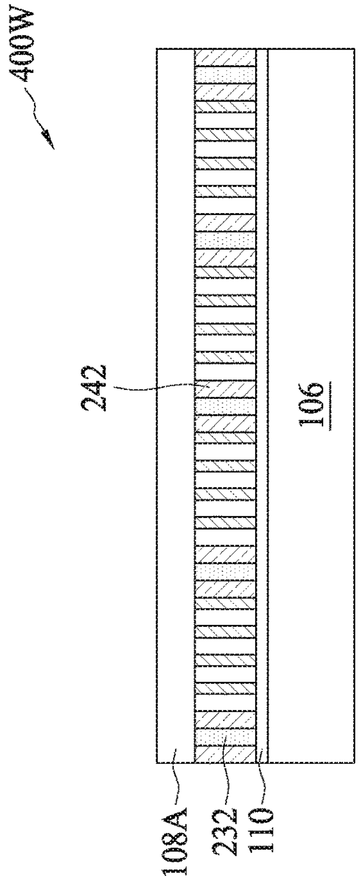
Figure 4F:
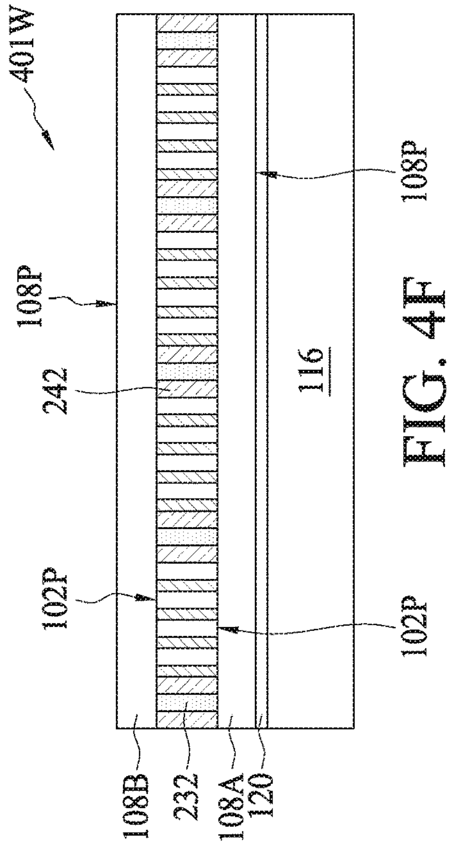
Figure 4G:
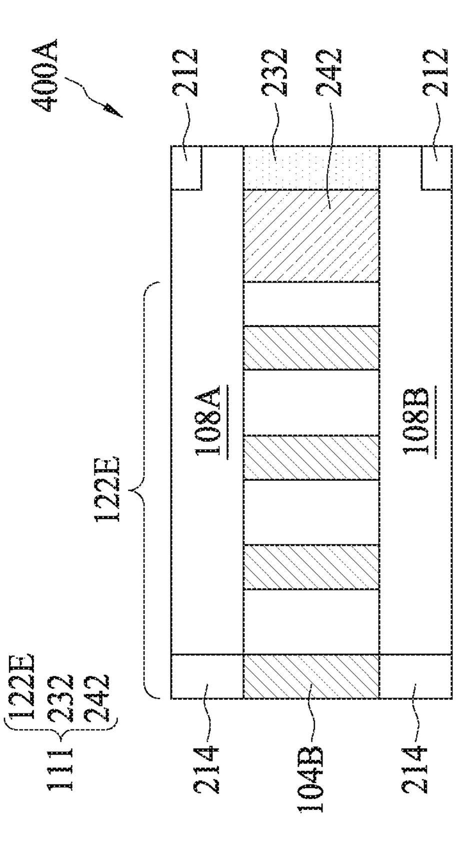

FIGS. 4A to 4G show cross-sectional views of structures in different stages of a method of manufacturing an IC structure 400A, in accordance with some embodiments of the present disclosure. According to some embodiments, the IC structure 400A shown in FIG. 4G is a semiconductor package device. The IC structure 400A may be formed from a semiconductor device 100W (see FIG. 4A), which is a wafer-level device, wherein the IC structure 400A is formed by separating the semiconductor device 400W using a singulation or dicing process.

Referring to FIG. 4A, the substrate 102 is received or provided as the semiconductor device 100W. Further, conductive vias 104 are formed in the substrate 102. Referring to FIG. 4B, a bulk portion of the substrate 102 below the conductive vias 104 is removed, e.g., by CMP, grinding, or an etching operation such that the conductive vias 104 become TSVs 104. A singulation or dicing process is performed to separate the semiconductor device 100W into a plurality of TSV dies 122E, which are similar to the TSV die 122A described with reference to FIG. 2C.

Referring to FIG. 4C, the carrier substrate 106 is received or provided in a semiconductor device 400W. Further, the release layer 110 is formed over the carrier substrate 106. A plurality of TSV dies 122E and a plurality of TMVs 232 are arranged over the release layer 110 to form a reconstituted structure on a carrier surface 110S of the release layer 110 or the carrier substrate 106. The TMVs 232 may be alternately arranged with the TSV dies 122E. The TMVs 232 may include a conductive material, e.g., tungsten, copper, titanium, tantalum, molybdenum, cobalt, ruthenium, aluminum, silver, gold, or another suitable material. The plurality of TSV dies 122E and the plurality of TMVs 232 may have substantially equal heights. According to some embodiments, the TSV dies 122E and the TMVs 232 are arranged over the release layer 110 by a pick-and-place bonding process.

Referring to FIG. 4D, the semiconductor device 400W is molded or encapsulated using a potting material (e.g., an encapsulating material or a molding material) 242. A deposition process or a molding process is performed to deposit the potting material 242 in between the TSV dies 122E and the TMVs 232. According to some embodiments, a planarization process, e.g., CMP, grinding, et etching, or another suitable etching operation, is performed to remove excess potting material 242 and planarize an upper surface of the potting material 242, an upper surface of the TSV dies 122E and an upper surface of the TMVs 232, revealing the TSVs and the TMVs Referring to FIG. 4E, the primary RDL 108A is formed over the upper surfaces of the potting materials 242, the TSV dies 122E and the TMVs 232. Materials, configuration and a method of forming the primary RDL 108A are similar to those described with reference to FIGS. 2B to 2G, and repeated description of the primary RDL 108A is omitted for brevity.

According to some embodiments, an order of the processing steps shown in FIGS. 4C and 4D can be altered. For example, initially, the plurality of TSV dies 122E are arranged over the release layer 110 without the TMVs 232. Subsequently, the potting material 242 is deposited to fill the gaps between the TSV dies 122E and is planarized. A hole opening operation by, for instance, laser is performed to form via holes between the TSV dies 122E which are subsequently filled with conductive materials forming the TMVs 232. The vias may be laterally surrounded by the potting material 242.

Referring to FIG. 4F, another carrier substrate 116 is provided or received in another semiconductor device 401W. Another release layer 120 is formed over the carrier substrate 116. Further, the structure in FIG. 4E is flipped over with its RDL 108A side bonded to the second carrier substrate 116 with the use of a release layer 120 and carrier 106 is released. Subsequently, another primary RDL 108B with surface finish and bonding pads is formed over the other side of the TSV dies 122E, the potting material 242 and the TMV 232*s* supported by the second carrier 116. Materials, configurations, and methods of forming the carrier substrate 116, the release layer 120 and the primary RDL 108B are similar to those of the carrier substrate 106, the release layer 110 and the primary RDL 108A described with reference to FIG. 2C, and therefore details of such similar features are not repeated for brevity. Moreover, the carrier substrate 116 is removed from the semiconductor device 401W by releasing the release layer 120 following wafer mounting Referring to FIG. 4G, a singulation or dicing process is performed to separate the reconstituted structure of the semiconductor device 401W into individual IC structures 400A. Through appropriate arrangement, the TMVs 232 and edge TSVs 104B are formed in the IC structure 400A and comprise two TMV types after the singulation or dicing process: interior TMVs (not shown) and edge TMVs 232, and two TSV types after the singulation or dicing process: interior TSVs and edge TSVs 104B.

Properties of the conductive pads 212 and the conductive vias 214 of the primary RDLs 108A or 108B are similar to those of the IC structure 100A shown in FIG. 2C, and repeated descriptions thereof are omitted for brevity. The IC structure 400A is different from the IC structure 100A mainly in that the IC structure 400A further includes the potting material 242 filling a space between the semiconductor die 122E and the TMV 232. The semiconductor die 122E, the TMV 232 and the potting material 242 constitute a body 111 of the IC structure 400A. In other words, the body 111 of the IC structure 400A may include the semiconductor die 122E, the edge TMV 232 and the potting material 242. The semiconductor die 122E may include one or more TSVs 104B. The primary surface and the secondary surface of the body 111 of the IC structure 400A can be referred to those described with reference to the IC structure 100A of FIG. 2C and are not repeated here for brevity.

FIGS. 4H to 4N show cross-sectional views of IC structures 400B, 400C, 400D, 400E, 400F, 400G and 400H, respectively, in accordance with various embodiments of the present disclosure. Since the IC structures 400B, 400C, 400D, 400E, 400F, 400G and 400H are seen as variants of the baseline IC structure 400A in many aspects, the following description will focus only on differences between the IC structure 400A and other IC structures 400B to 400H.

Figure 4H:
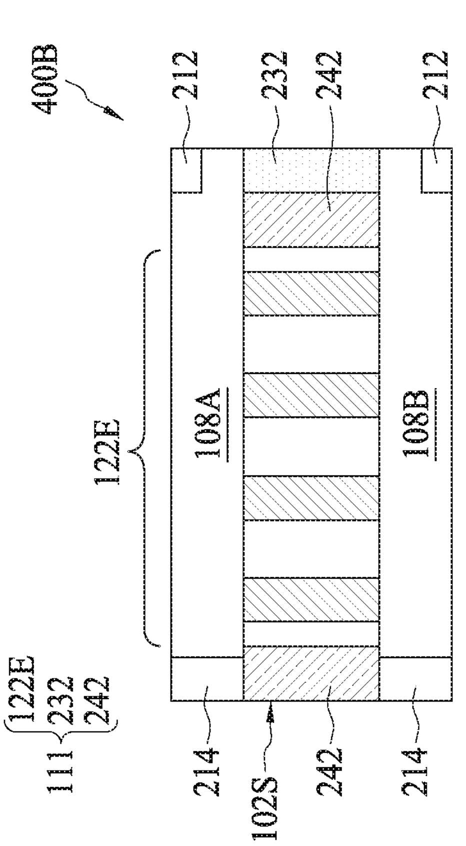
FIGS. 4H to 4N show cross-sectional views of an IC structure, in accordance with various embodiments of the present disclosure.

Referring to FIG. 4H, a main difference between the IC structure 400B and the IC structure 400A is that, in the IC structure 400B, the TSV die 122E containing interior TSVs is laterally surrounded or encapsulated by the potting material 242 and there exists no edge TSV in the IC structure 400B. The body 111 of the IC structure 400B may include the semiconductor die 122E, the edge TMV 232 and the potting material 242. The primary surface and the secondary surface of the body 111 of the IC structure 400B can be referred to those described with reference to the IC structure 100A of FIG. 2C and are not repeated here for brevity.

Figure 4I:
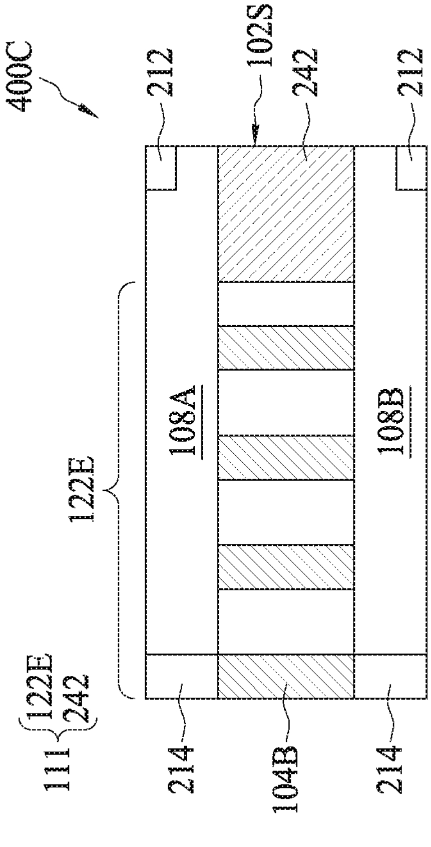
Figure 4J:
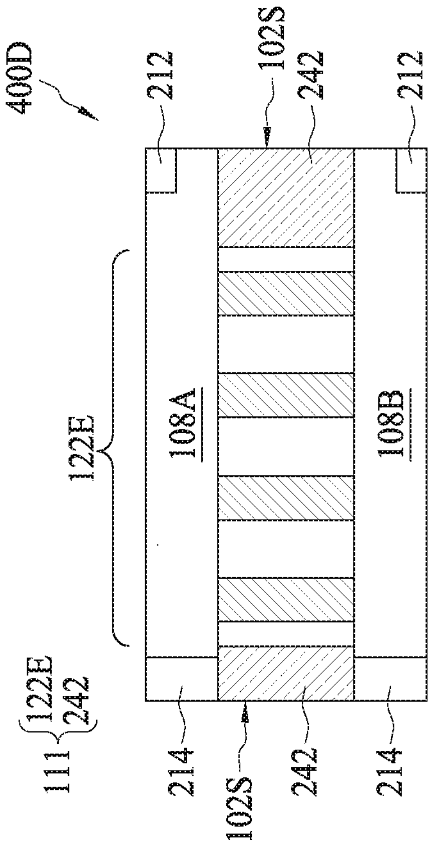

Referring to FIG. 4I, a main difference between the IC structure 400C and the IC structure 400A is that the TMV 232 is absent in the IC structure 400C. The body 111 of the IC structure 400C may thus include the semiconductor die 122E and the potting material 242. The primary surface and the secondary surface of the body 111 of the IC structure 400C can be referred to those described with reference to the IC structure 100A of FIG. 2C and are not repeated here for brevity. Referring to FIG. 4J, the IC structure 400D does not possess edge TSVs nor edge TMVs which are both present in the IC structure 400A. The body 111 of the IC structure 400D may thus include the semiconductor die 122E and the potting material 242. The primary surface and the secondary surface of the body 111 of the IC structure 400D can be referred to those described with reference to the IC structure 100A of FIG. 2C and are not repeated here for brevity.

Figure 4K:
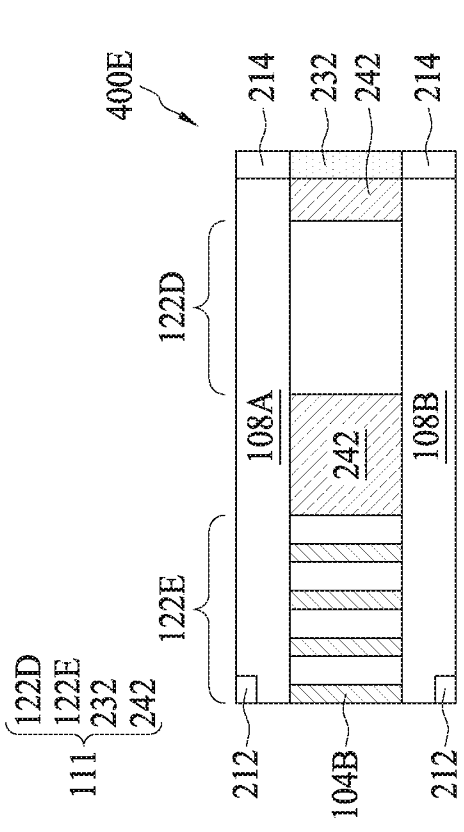

The IC structures 400E, 400F, 400G and 400H shown in FIGS. 4K to 4N can be seen as multi-die versions of the corresponding single-die IC structures 400A, 400B, 400C and 400D, wherein multiple dies are arranged in a same package layer of the IC structures 400E through 400H. Referring to FIG. 4K, a main difference between the IC structure 400E and the IC structure 400A is that the IC structure 400E further includes a second semiconductor die 122D besides the first semiconductor die, i.e., the TSV die 122E, both of which can be of the same or different sizes. A body 111 of the IC structure 400E is thus comprised of the semiconductor die 122D, the TSV die 122E, the TMV 232 and the potting material 242. The primary surface and the secondary surface of the body 111 of the IC structure 400E can be referred to those described with reference to the IC structure 100A of FIG. 2C and are not repeated here for brevity. The semiconductor die 122D and the TSV die 122E are arranged in a same package layer. The semiconductor die 122D (which can also contain interior or edge TSVs) is laterally surrounded or encapsulated by the potting material 242. Further, in the IC structure 400E, the TMV 232 serves as an edge TMV, which can be electrically connected to the edge conductive via 214 of the primary RDL 108A and the edge conductive via 214 of the primary RDL 108B to form a stacked TSV extending through an entire thickness of the IC structure 400E.

Figure 4L:
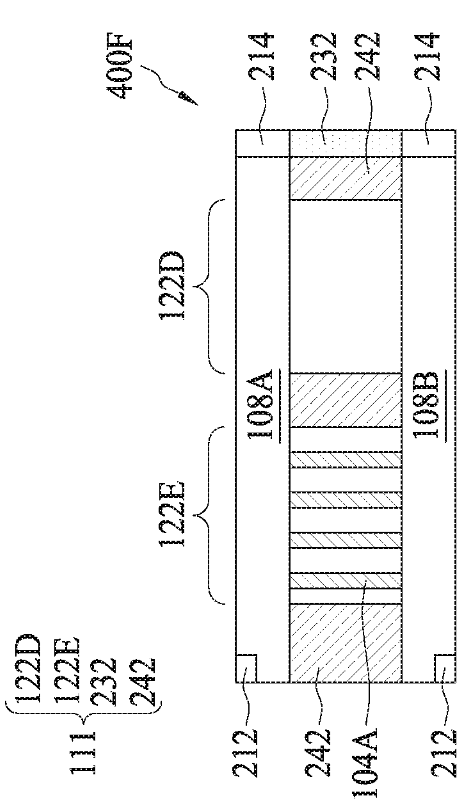

Referring to FIG. 4L, a main difference between the IC structure 400F and the IC structure 400E is that, in the IC structure 400F, the TSV die 122E is further laterally surrounded or encapsulated by the potting material 242 and the IC structure 400F contains no edge TSVs. The body 111 of the IC structure 400F may thus include the semiconductor die 122D, the TSV die 122E, the TMV 232 and the potting material 242. The primary surface and the secondary surface of the body 111 of the IC structure 400F can be referred to those described with reference to the IC structure 100A of FIG. 2C and are not repeated here for brevity.

Figure 4M:
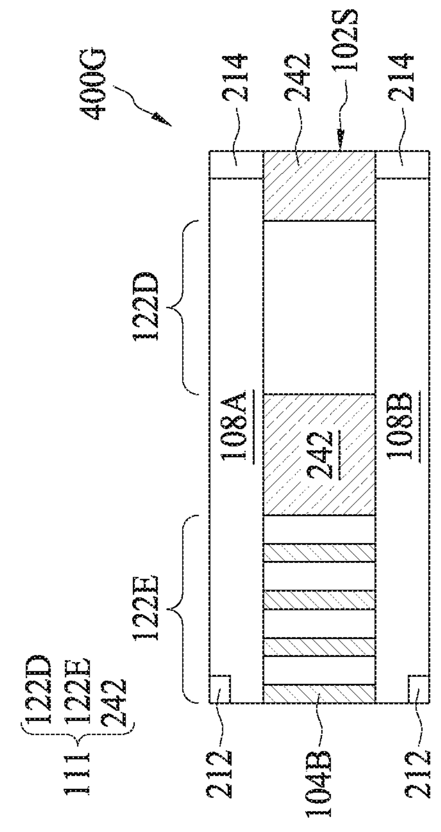

Referring to FIG. 4M, a main difference between the IC structure 400G and the IC structure 400E is that the edge TMV 232 is absent from the IC structure 400G which contains the edge TSV 104B. The body 111 of the IC structure 400F may thus include the semiconductor die 122D, the TSV die 122E and the potting material 242. The primary surface and the secondary surface of the body 111 of the IC structure 400G can be referred to those described with reference to the IC structure 100A of FIG. 2C and are not repeated here for brevity.

Figure 4N:
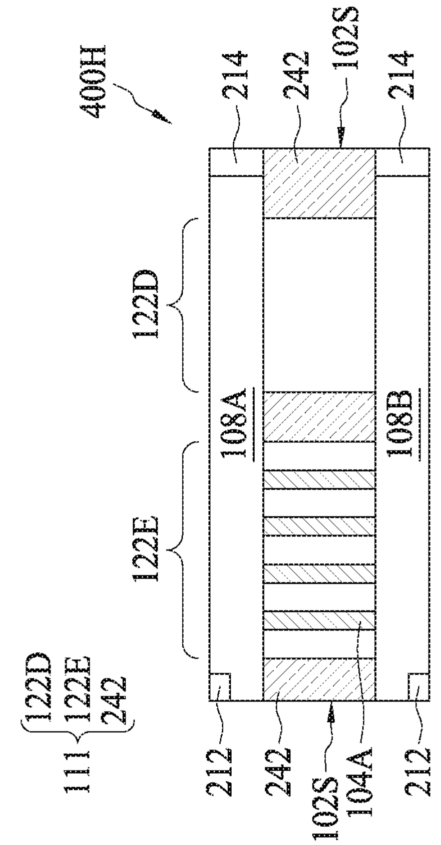

Referring to FIG. 4N, the IC structure 400H can be seen as a combination of features of the IC structures 400F and 400G, in which a body 111 of the IC structure 400H comprises only the semiconductor die 122D, the TSV die 122E and the potting material 242 without edge TSVs and edge TMVs. According to some embodiments, the potting material 242 laterally surrounds and encapsulates the semiconductor dies 122D and 122E. The potting material 242 is exposed through two secondary planes 102S of the body 111 of the IC structure 400H. The primary surface and the secondary surface of the body 111 of the IC structure 400H can be referred to those described with reference to the IC structure 100A of FIG. 2C and are not repeated here for brevity.

Figure 5B:
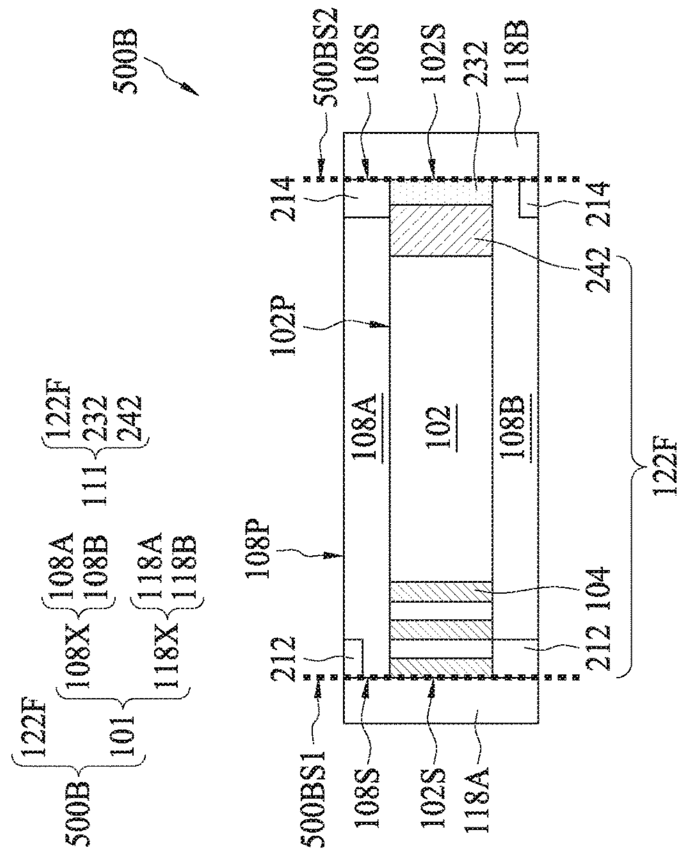
FIGS. 5A and 5B show cross-sectional views of an IC structure, in accordance with various embodiments of the present disclosure.
Figure 5A:
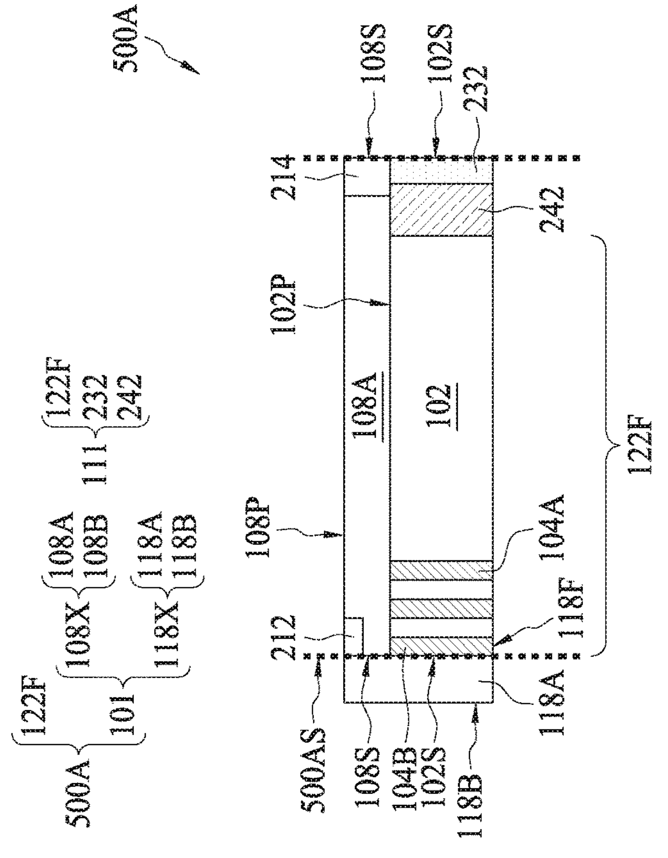

FIG. 5A shows a cross-sectional view of an IC structure 500A, in accordance with various embodiments of the present disclosure. A body 111 of the IC structure 500A comprises a semiconductor die 122F, a TMV 232 and a potting material 242. The primary surface and the secondary surface of the body 111 of the IC structure 500A can be referred to those described with reference to the IC structure 100A of FIG. 2C and are not repeated here for brevity. The semiconductor die 122F may include at least one of a CPU die, a GPU die, a TPU die, a MEMS die, an AP die, an FPGA die, an ASIC die, a memory die, a transceiver die, a network interface die, an integrated photonics die, a packet buffer/router die or another suitable die. The semiconductor die 122F is similar to the semiconductor die 122D1 shown in FIG. 3F, except that the edge conductive pad 222 of the semiconductor die 122D1 is replaced with a plurality of TSVs 104 (including interior TSVs 104A and edge TSVs 104B), in which one edge TSV 104B is exposed through a secondary plane 500AS of the IC structure 500A. Further, in contrast to the IC structures described previously, the IC structure 500A further includes a secondary RDL 118A arranged on the secondary plane 500AS of the IC structure 500A and electrically connected to the primary RDL 108A. Throughout the present disclosure, the secondary RDL 118A may also be referred to as the edge RDL 118A.

Figure 5C:
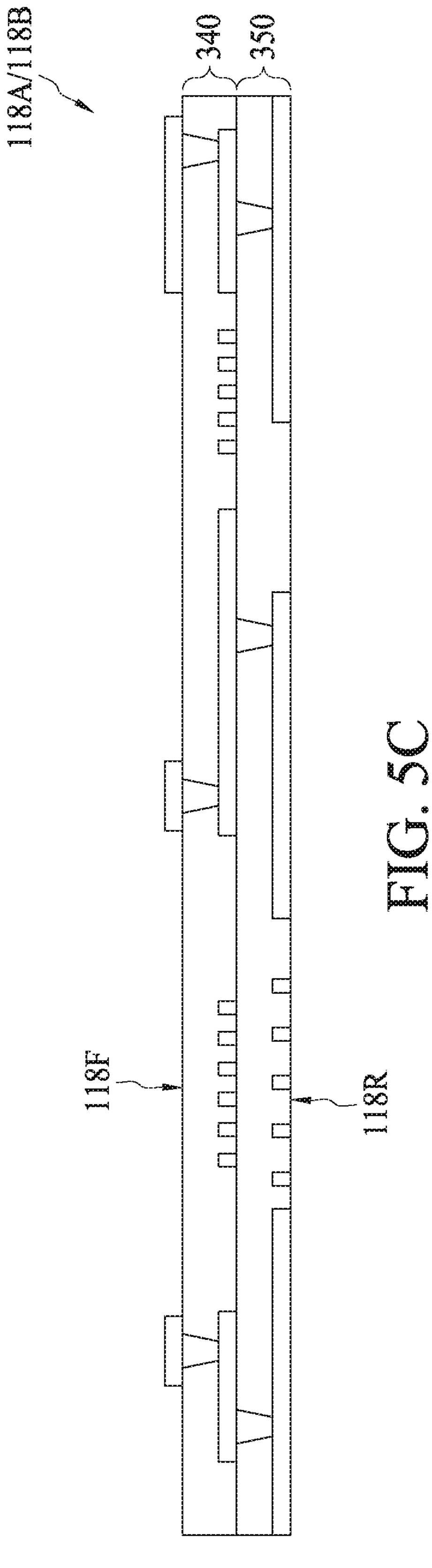
FIG. 5C shows a cross-sectional view of an interconnect structure of the IC structure shown in FIGS. 5A and 5B, in accordance with various embodiments of the present disclosure.

FIG. 5C shows a cross-sectional view in greater detail of the secondary RDL 118A of the IC structure 500A shown in FIG. 5A, in accordance with various embodiments of the present disclosure. The secondary RDL 118A is similar to the primary RDL 108, e.g., the primary RDL 108A or 108B, described with reference to FIG. 2G. The secondary RDL 118A shown in FIG. 5C includes two major conductive line/via layers 340, 350 similar to the first and second major conductive line/via layers, 240 and 250, of the primary RDL 108A or 108B in FIG. 2G. Referring to FIG. 5C, the secondary RDL 118A includes a front interconnect surface 118F and a back interconnect surface 118R opposite to the front interconnect surface 118F. Throughout the present disclosure, the front interconnect surface 118F and the back interconnect surface 118R may also be referred to as the first interconnect surface 118F and the second interconnect surface 118R, or the first surface 118F and the second surface 118R respectively. The secondary RDL 118A is electrically connected to an edge interconnect structure 118X, e.g., the edge TSV 104B of the semiconductor die 122F or an edge conductive pad 212 of the primary RDL 108A, of the IC structure 500A. According to some embodiments, the secondary RDL 118A is considered part of the edge interconnect structure 118X of the IC structure 500A. With such configuration, the primary RDL 108A can be electrically connected to the semiconductor die 122F not only through an interior interconnect structure 108X via a primary surface 102P of a substrate 102 of the IC structure 500A and a primary surface 108P of the primary RDL 108A facing the substrate 102, but also through the edge interconnect structure 118X including the edge TSV 104B and the secondary RDL 118A via a side surface (secondary plane) 102S of the body 111 of the IC structure 500A and a front interconnect surface 118F of the secondary RDL 118A. A routing capacity and design flexibility of the IC structure 500A provided for the semiconductor die 122F is therefore increased as compared to IC structures without the secondary RDL 118A and other edge interconnections.

FIG. 5B shows a cross-sectional view of an IC structure 500B, in accordance with various embodiments of the present disclosure. The IC structure 500B is substantially similar to the IC structure 500A in many aspects, and therefore descriptions of similar features are not repeated for brevity. The body 111 of the IC structure 500B may thus include the semiconductor die 122F, the TMV 232 and the potting material 242. The primary surface and the secondary surface of the body 111 of the IC structure 500B can be referred to those described with reference to the IC structure 100A of FIG. 2C and are not repeated here for brevity. A main difference between the IC structure 500B and the IC structure 500A is that, in addition to the secondary RDL 118A arranged on a left-side secondary plane 500BS1 of the IC structure 500B, the IC structure 500B further includes a secondary RDL 118B arranged on a right-side secondary plane 500BS2 of the IC structure 500B opposite to the secondary RDL 118A. A material and a configuration of the secondary RDL 118B may be similar to those of the secondary RDL 118A, as illustrated in FIG. 5C. However, other configurations and numbers of major conductive line/via layers for the secondary RDLs, 118A and 118B, are also within the contemplated scope of the present disclosure. The secondary RDL 118B is thus also considered part of the edge interconnect structure 118X of the IC structure 500B and can be electrically connected to the primary RDL 108A.

Figure 6B:
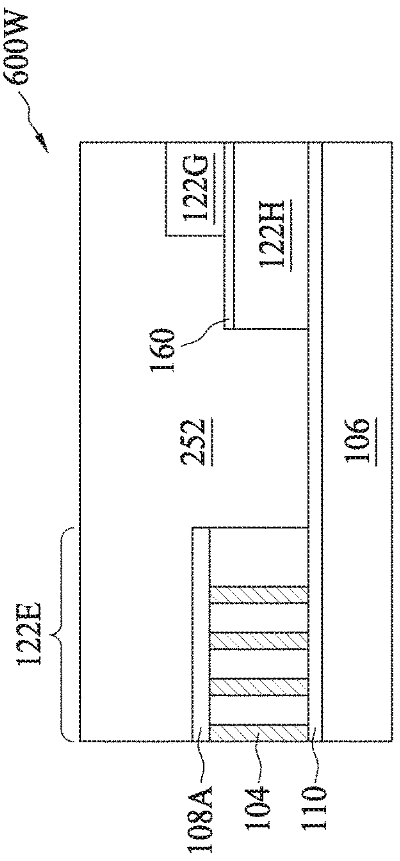
FIGS. 6A to 6E show cross-sectional views of structures in different stages of a method of manufacturing a semiconductor package, in accordance with various embodiments of the present disclosure.
Figure 6D:
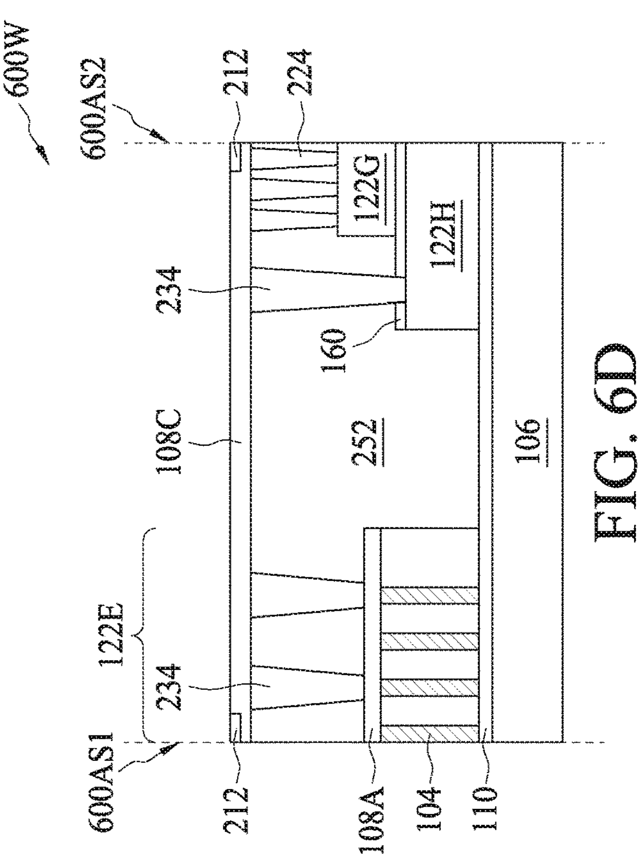
Figure 6A:
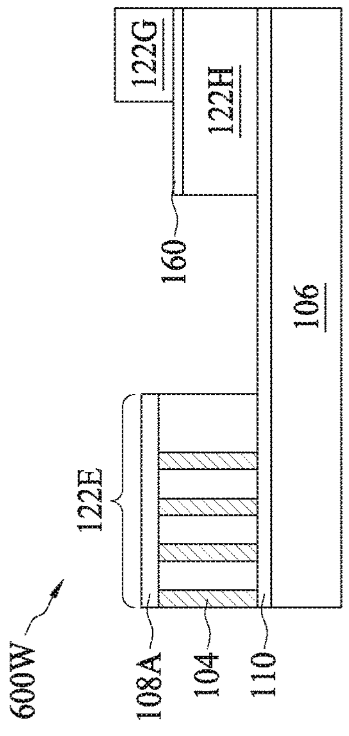
Figure 6C:
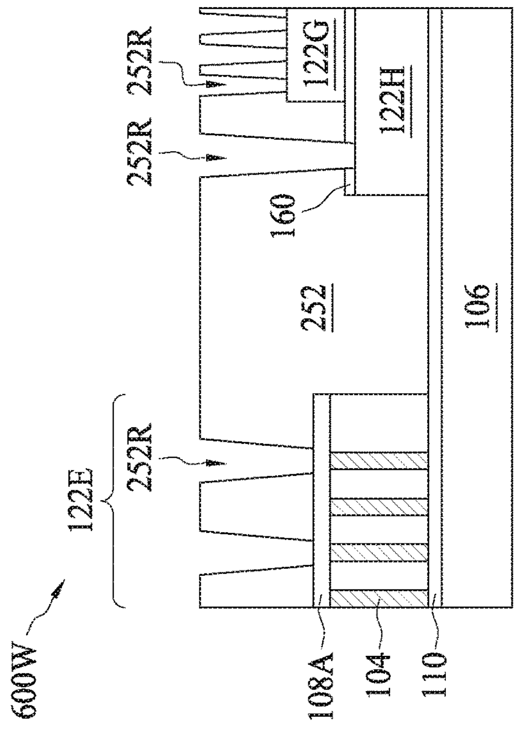
Figure 6E:
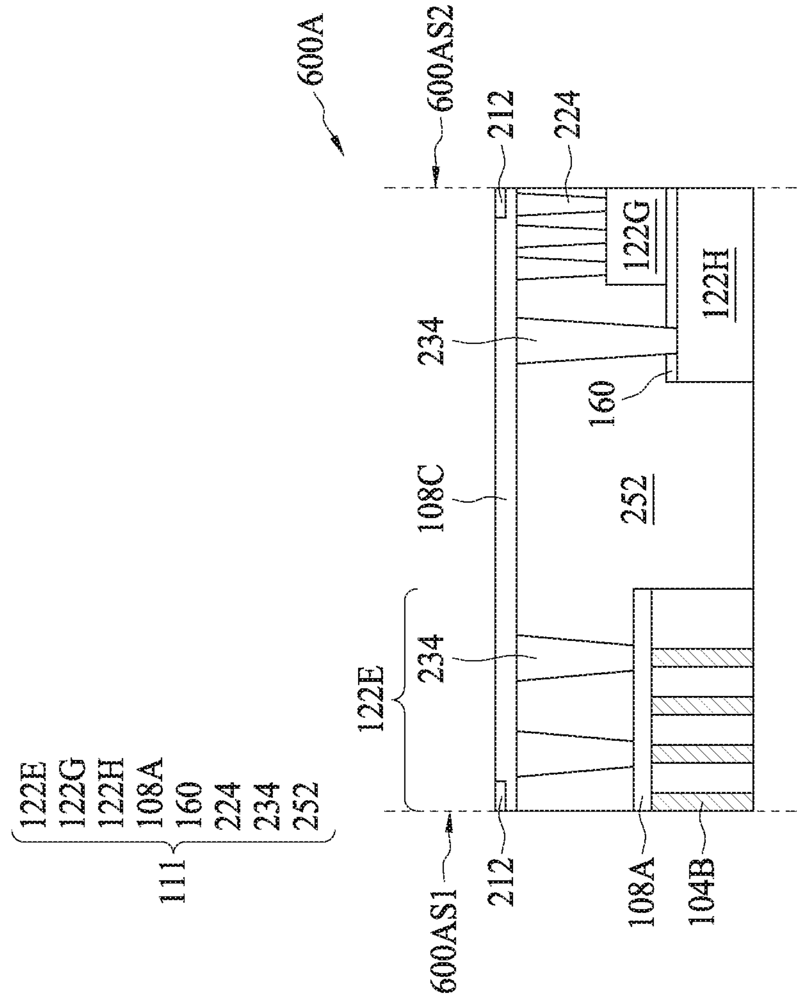

FIGS. 6A to 6E show cross-sectional views of structures in different stages of a method of manufacturing a semiconductor package 600A, in accordance with various embodiments of the present disclosure. According to some embodiments, the IC structure 600A shown in FIG. 6E is a semiconductor package device. The IC structure 600A may be formed from a semiconductor device 600W, which is a wafer-level device, wherein the IC structure 600A in FIG. 6E is formed by separating the semiconductor device 600W using a singulation or dicing process.

Referring to FIG. 6A, a carrier substrate 106 is provided or received. A release layer 110 is formed over an upper surface of the carrier substrate 106. A plurality of semiconductor dies, e.g., semiconductor dies, 122E, 122G and 122H, are prepared. A TSV die 122E may be replaced with semiconductor dies described above, such as the semiconductor dies 100A, 100B, 100C, 300A, 300B, 300C, and 400A to 400H. The TSV die 122E includes a plurality of TSVs 104 and a primary RDL 108A on an upper surface of the TSVs 104. According to some embodiments, the semiconductor die 122G or 122H can be at least one of a CPU die, a GPU die, a TPU die, a MEMS die, an AP die, an FPGA die, an ASIC die, a memory die, a transceiver die, a network interface die, an integrated photonics die, a packet buffer/router die, another suitable die or any of the semiconductor dies described above.

Sizes or dimensions of the semiconductor dies 122E, 122G and 122H may be similar or different. For example, the semiconductor dies 122E, 122G and 122H may have substantially equal or different heights, lengths or widths.

A pick-and-place process is performed to pick known good dies (KGDs) of the semiconductor dies 122E, 122G and 122H, and bond the KGDs over the release layer 110. A bonding or die attachment layer 160 is formed on the semiconductor die 122H after the semiconductor die 122H is placed over the release layer 110. The bonding layer 160 may aid in attachment of the semiconductor die 122G to the semiconductor die 122H. According to some embodiments, the bonding layer 160 is a die attachment film, an array of micro-bumps configured to perform flip-chip bonding, a direct bonding layer or a hybrid bonding layer configured to generate bonds. According to some embodiments, the semiconductor dies 122G and 122H are vertically stacked. The semiconductor die 122E may be arranged side-by-side adjacent to the stacked semiconductor dies, 122G and 122H, in a same package layer. The semiconductor dies 122E, 122G and 122H may be of substantially the same or different sizes.

Referring to FIG. 6B, the semiconductor device 600W is molded or encapsulated using a potting material or a suitable material 252. A material and a configuration of the potting material 252 are similar to those of the potting material 242 and can include molding compound and thick-film photoresists. A molding or deposition process is performed to deposit the potting material 252 in between the semiconductor dies 122E, 122G and 122H and embed the semiconductor dies 122E, 122G and 122H. The potting material 252 may have a height greater than that of the semiconductor dies 122E, 122G and 122H. According to some embodiments, a planarization process, e.g., CMP, grinding, etching (dry and/or wet) or another suitable etching operation, is performed to remove excess potting material 252 and generate a uniform upper surface of the potting material 252 (see FIG. 6B).

FIG. 6C illustrates a formation of a plurality of via holes 252R in the potting material 252. The holes may be created by laser ablation. Alternatively, if a thick film photoresist is used as the encapsulation material, it can be laminated on, patterned and developed to create the holes that extend from the upper surface of the potting material 252 to the bonding pads with proper surface finishes of the semiconductor dies 122E, 122G and 122H with the pads exposed under the via holes 252R.

Referring to FIG. 6D, a conductive material with proper passivation is deposited in the via holes 252R, e.g., by PVD, CVD, ALD, plating, or the like. The conductive material may include at least one of tungsten, copper, titanium, molybdenum, cobalt, ruthenium, tantalum, aluminum, silver, gold, and other suitable materials. One or more conductive pillars 224 are thus formed over and electrically connected to the semiconductor die 122G. At least one conductive pillar 224, formed on a secondary plane 600AS2 (at the present time such secondary plane 600AS2 is still a hypothetical plane before the dicing process) of the semiconductor device 600W, is configured as an edge conductive pillar 224. Further, one or more conductive plugs 234 are formed over and electrically connected to the TSV die 122E and/or the semiconductor die 122H. As a result, a body 111 of the IC structure 600A includes the semiconductor dies, 122E, 122H and 122G, the primary RDL 108A, the bonding layer 160, the potting material 252, the conductive vias 104, the interior conductive pillars 224, the conductive plugs 234 and the edge conductive pillar 224. According to some embodiments, the TSVs 104, the conductive pillars 224, and the conductive plugs 334 are of substantially the same or different lengths. The primary surface and the secondary surface of the body 111 of the IC structure 600A can be referred to those described with reference to the IC structure 100A of FIG. 2C and are not repeated here for brevity.

Another primary RDL 108C is formed over the upper surface of the potting material 252 and electrically connected to the semiconductor dies 122E, 122G and 122H. According to some embodiments, the primary RDL 108C at least includes an edge conductive pad 212 on a secondary plane, 600AS1 or 600AS2 (at the present time the secondary planes 600AS1 and 600AS2 are still hypothetical planes before the dicing process) of the semiconductor wafer 600W.

Subsequently, following wafer mounting, the carrier substrate 106 is removed or detached from the semiconductor device 600W by removing or releasing the release layer 110 from the semiconductor device 600W. FIG. 6E shows an individual IC structure 600A formed using a singulation or a dicing process to separate the semiconductor device 600W into individual IC structures 600A. Through appropriate arrangement, the edge conductive pads 212, the edge TSV 104B and the edge conductive pillar 224 can be formed and exposed through at least one of the secondary planes, 600AS1 and 600AS2, of the IC structure 600A. The primary RDL 108C is configured to be electrically connected to the semiconductor dies 122E, 122G and 122H through an interior interconnect structure 108X, e.g., the conductive plugs 234 and interior conductive copper pillars 224. Further, the primary RDL 108C is configured to be electrically connected to the semiconductor dies 122E, 122G and 122H through an edge interconnect structure 118X, e.g., the edge TSV 104 and the edge conductive pillar 224. A routing distance can thus be reduced with the help of the edge interconnect structure 118X.

Referring to FIG. 6E and FIGS. 5A and 5B, according to some embodiments, the secondary RDLs 118A and 118B of the IC structures 500A and 500B are applicable to the IC structure 600A. In other words, although not separately shown, the secondary RDL 118A or 118B can be arranged on the secondary surfaces 600AS1 and 600AS2, respectively, to be electrically connected to conductive elements 202 of the primary RDL108C, the edge TSV 104 (in FIG. 6E use 104 instead of 104B to be consistent with FIG. 6D), and/or the edge conductive pillars 224. According to some embodiments where the IC structure 600A includes an edge conductive plug 234, the secondary RDL 118A or 118B can be electrically connected to such edge conductive plug 234.

The embodiments of the present disclosure discussed above provide advantages. The collective edge conductive element 202 can appear in a form of edge conductive pads 212, in a form of edge conductive vias 214, in a form of edge TSVs 104, or in a form of edge TMVs 224 as shown in FIG. 6E. Further, the primary RDLs, 108A and 108C, or the secondary RDLs 118A and 118B (see FIG. 5B) may be formed with or without the edge conductive pads 212, with or without the edge conductive vias 214, with or without the edge TSVs 104, with or without the edge conductive via 222 (see FIGS. 2F and 3F), with or without the edge TMVs 232 (FIG. 5B), with or without the edge conductive pillars 224, and with or without the edge conductive plugs 234. The edge conductive elements 202 can be disposed at a periphery of the IC structures or at a periphery of the RDLs. Further, the edge conductive vias 222 can cover an entirety or a part of a thickness of the body 111 of the respective IC structure. Moreover, the edge TSVs 104, the edge TMVs 232, the edge conductive pillars 224 and the edge conductive plugs 234 can appear inside the IC structures to facilitate interior interconnection of the IC structures in different stacked layers in addition to the edge interconnection arranged on the side faces.

The conductive pillars 224 the conductive plugs 234 and the TMVs 232 (FIG. 5B) are formed based on hole opening and hole filling process steps, and they can be created by a number of methods which include a bonded vertical wire (e.g., palladium, Pd, coated Cu) approach and a laser via approach and through-photosensitive-thick-film (TPTF) approach. The bonded vertical wire approach follows the tall copper pillar process steps with wire bonding replacing the tall copper pillar formation steps. When Pd-coated Cu wire is used, thin gold (Au) can be used as the bonding pad. In the laser via approach, the ICs are first bonded to the carrier substrate 106, followed by for instance, overmolding, planarization, laser via hole opening, via hole sidewall Cu plating, via hole plating or plugging with a photosensitive polymer or a solder, planarization, RDL creation, carrier release and dicing. The TPTF process flow consists of sequentially laminating a thick photosensitive film on the bonded ICs, multiple or single exposure and development to create TMV holes (i.e., through-photosensitive-thick-film via holes), barrier/seed layer deposition, Cu plating, via hole plugging as needed, back-grinding/planarization, RDL creation, carrier release and dicing. The ICs here can have RDLs and TSVs. Multiple exposure provides process freedom to form vias with different sizes and depths. The TMV related processes can accommodate multiple ICs both in the x-y plane and in the vertical z direction as illustrated in FIG. 6E. Moreover, the dies, 122E, 122H and/or 122G, in FIG. 6E can be pre-bumped with solder bumps or copper pillar micro-bumps prior to bonding them to the carrier substrate 106 in FIG. 6A. Following die bonding, overmolding can ensue followed by planarization and RDL creation.

Figure 7B:
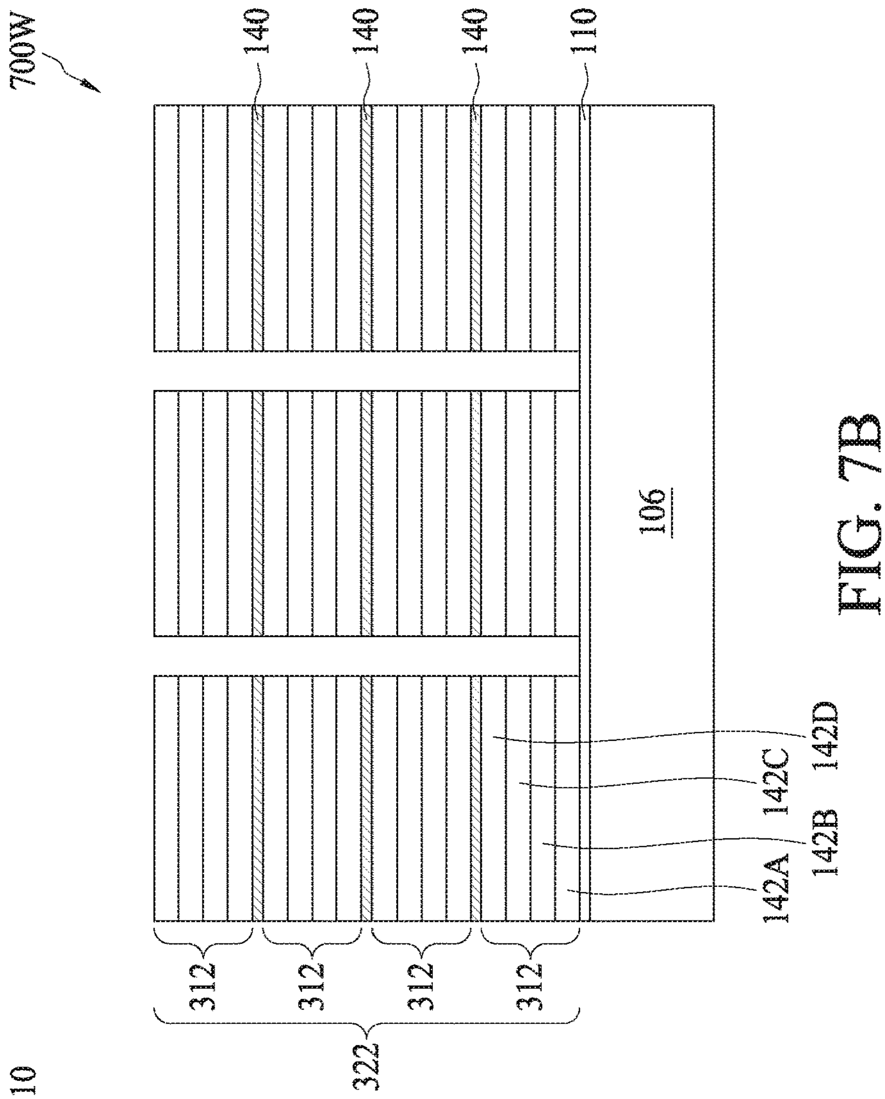
FIGS. 7A to 7H show cross-sectional views of structures in different stages of a method of manufacturing a semiconductor package, in accordance with various embodiments of the present disclosure.
Figure 7A:
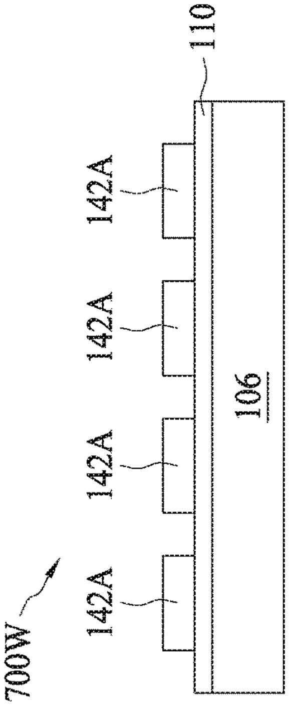
Figure 7C:
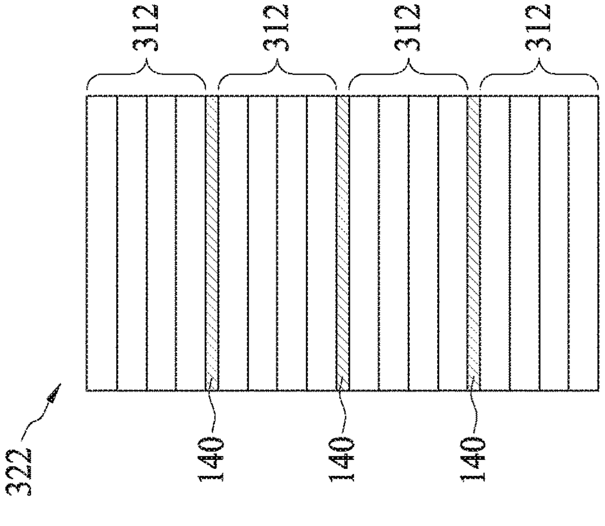
Figure 7E:
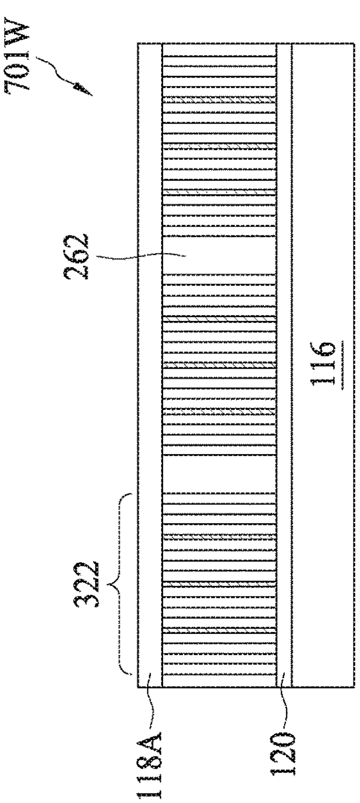
Figure 7H:
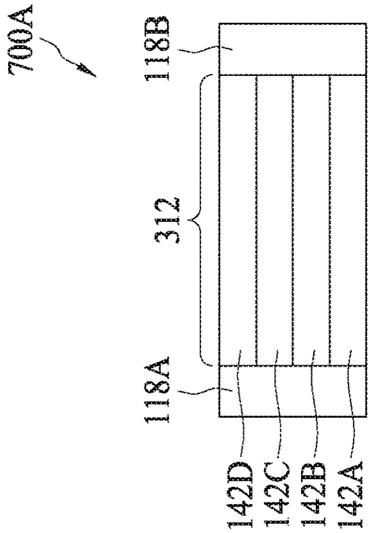

FIGS. 7A to 7H show cross-sectional views of structures in different stages of a method of manufacturing a semiconductor package 700A, in accordance with various embodiments of the present disclosure. According to some embodiments, the semiconductor package 700A shown in FIG. 7H is a semiconductor package device. The semiconductor package 700A may be formed from semiconductor devices 700W and 701W, which are wafer-level devices, wherein the semiconductor package 700A is formed by separating the semiconductor device 701W using a singulation or dicing process.

FIG. 7A to FIG. 7C illustrate formation of a plurality of tall IC stacks 322 from a plurality of IC structures 142. Referring to FIG. 7A, a carrier substrate or a supporting substrate 106 is provided or received. A release layer 110 is formed over an upper surface of the carrier substrate 106. A pick-and-place process is performed to pick and bond a plurality of known-good IC structures 142, e.g., IC structures 142A with the help of a bonding layer to form the first tier of short IC stacks 312 as shown in FIG. 7A over the release layer 110 with a suitable pitch to enhance yield. According to some embodiments, the IC structures 142 can be made up of IC structures 400A, 400B, 400C, 400D, 400E, 400F, 400G, 400H, 500A, 500B, and/or 600A; however, other types of IC structures, e.g., the IC structure 100A, 100B, 100C, 300A, 300B, 300C and/or the like, are also possible. The IC structures 142 covering 142A, 142B, 142C and 142D as illustrated in FIG. 7B for demonstration may include memory and/or processor analog dies. The IC structures 142 may also cover MEMS devices, passives as well as analog, mixed-signal and digital signal processing ICs.

Referring to FIG. 7B, another plurality of IC structures 142, e.g., IC structures 142B, are bonded to the corresponding IC structures 142A to form the second tier of the short IC stacks 312. The bonding of IC structures 142B to IC structures 142A may be achieved using thermo-compression bonding (TCB), flip-chip bonding, hybrid bonding, direct bonding, bonding via glue layers (e.g., Ti/Au), a die attachment film or paste, or other suitable bonding processes. A process of forming the short IC stacks 312 may continue until a predetermined tier number (total number of tiers) K is achieved, wherein the tier number K is a natural number. In the depicted example in FIG. 7B, the tier number K is four. That means each short IC stack 312 is constructed by four stacked IC structures 142A, 142B, 142C and 142D. This process generates known-good short IC stacks. Alternatively, the short IC stacks 312 can be formed by bonding of a plurality of 142D to a plurality of 142C with the resultant structures further processed as needed and then released, the known-good structures picked, the known-good structures bonded to a plurality of known-good 142B, etc. and the process is repeated until the short IC stacks 312 are formed in FIG. 7B.

After the first short IC stacks 312 are completed, a release (or bonding) layer 140 of a suitable thickness is formed over each short IC stack 312. A material of the release layer 140 may be different from that of the release layer 110 to avoid interference with each other during the respective release processes. Subsequently, another set of known-good short IC stacks 312 is formed over the release layers 140 of first known-good short IC stacks 312. As shown in FIG. 7B, the formation of the short IC stacks 312 and the formation of the release layers 140 are proceeded alternately until a predetermined number L of short IC stacks is achieved to form the tall IC stacks 322 in FIG. 7C, wherein the short IC stack number L (i.e., total number of short IC stacks) is a natural number. In the depicted example, the short IC stack number L is four. As a result, the short IC stacks 312 are stacked to form tall IC stacks 322 through the release layers 140.

Referring to FIG. 7C, each tall IC stack 322 is released from the carrier substrate 106 by releasing the release layer 110. As a result, four short IC stacks 312 are alternately arranged with three release layers 140 to form a column of the tall IC stack 322. In the depicted example, there are three columns of the tall IC stacks 322 in the semiconductor device 700W. The numbers K, L, and a column number introduced above are used for illustrative purposes. Other numbers are also within the contemplated scope of the present disclosure.

Figure 7G:
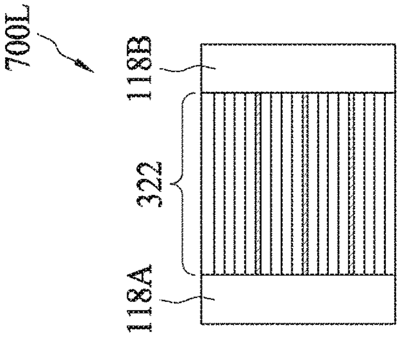
Figure 7D:
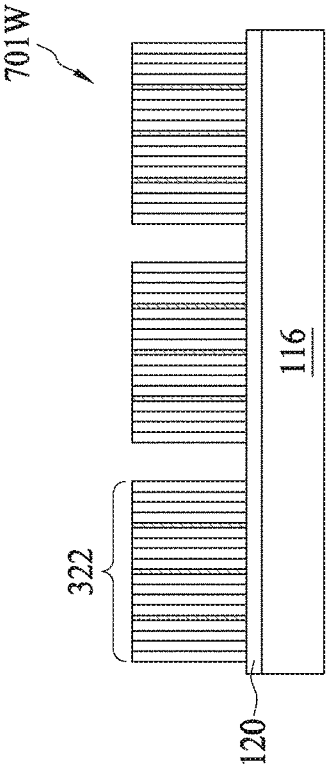

FIG. 7D to FIG. 7H illustrate formation of the semiconductor package 700A from the plurality of tall IC stacks 322. Referring to FIG. 7D, a carrier substrate 116 is provided or received. A release layer 120 is formed over an upper surface of the carrier substrate 116. A pick-and-place process is performed to pick and bond a plurality of known-good tall IC stacks 322 and arrange them over the release layer 120 with a suitable pitch to enhance yield. The tall IC stacks 322 are reconstituted on the carrier substrate 116 and bonded to the release layer 120 through their side surfaces. In other words, the tall IC stacks 322 are lying down such that the vertically-stacked IC structures 142 in the tall IC stack 322 are positioned upright in the x-y plane or IC length and width direction with one of their four side surfaces bonded to the release layer 120.

Referring to FIG. 7E, the reconstituted tall IC stacks 322 of the semiconductor device 701W are molded or encapsulated using a potting material 262. A material and a configuration of the potting material 262 are similar to those of the potting material 242 or 252. A molding or deposition process is performed to deposit the potting material 262 in between the laid-down tall IC stacks 322. According to some embodiments, a planarization process, e.g., CMP, grinding, etching (dry and/or wet) or another suitable etching operation, is performed to remove excess potting material 262 and planarize an upper surface of the potting material 262 and have it flush with a side surface of the tall IC stacks 322. Subsequently, an edge interconnect structure, RDL 118A is formed over or bonded to at least an edge interconnect of the side surface (secondary plane) of the tall IC stacks 322.

Figure 7F:
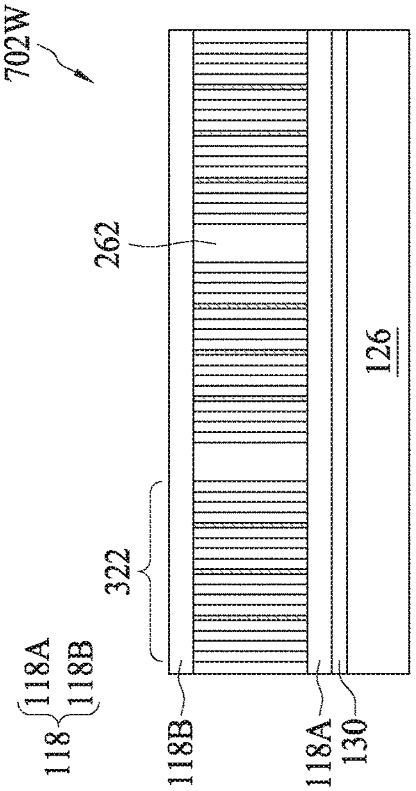

FIG. 7F illustrates formation of another edge interconnect structure, RDL 118B, on another side surface of the tall IC stacks 322 opposite to the secondary RDL 118A. Another carrier substrate 126 is provided or received in another semiconductor device 702W. Another release layer 130 is formed over the carrier substrate 126 to facilitate the creation of 118B. Materials, configurations, and methods of forming the carrier substrate 126 and the secondary RDLs, 118A and 118B, are similar to the secondary RDLs, 108A and 108B described in FIG. 5B and the primary RDLs, 108A and 108B, in FIG. 2C, and therefore details of such similar features are not repeated for brevity. A material of the release layer 130 may be different from that of the release layer 120 to avoid interference with each other during respective release processes. Subsequently, the carrier substrate 116 is removed from the semiconductor device 701W by removing the release layer 120 after the semiconductor structure 701W in FIG. 7E is bonded to the second carrier 126 on the side of RDL 118A. The edge interconnect RDL structure 118B is formed or bonded to a lower secondary surface of the tall IC stacks 322 opposite to an upper secondary surface of the tall IC stacks 322.

Referring to FIG. 7G, a singulation or dicing process is performed to separate the semiconductor device 701W into tall IC stack structures 700L. The singulation or dicing process may be performed to cut through the semiconductor device 701W at locations of the potting material 262 with the potting material 262 cleaned by, for instance, dry and/or wet etching while taking care to keep each tall IC stack 322 intact during the dicing process. According to some embodiments, a wet etching or cleaning process is performed to remove residual potting materials 262 left on the tall IC stacks structures 700L.

FIG. 7H illustrates formation of the individual semiconductor packages 700A, i.e., the short IC stack structures, from the respective IC structures, i.e., the tall IC stack structures 700L. A release process, a singulation process and/or a dicing process is performed to detach the release layers 140 (FIG. 7B) from each of the tall IC stack structures 700L such that the different semiconductor packages 700A, i.e., the respective short IC stacks 312 containing the edge interconnect RDL structures, 118A and 118B, are separated from each other. According to some embodiments, an etching or dicing process is performed to aid in the release process, e.g., by dicing, a continuous-wave laser beam, dry etching (e.g., by plasma) and/or wet etching to cut through the secondary RDLs 118A and 118B, at the locations of the release layers 140. As illustrated in FIG. 7H, the semiconductor package 700A includes a stack of short IC stack structures 142 and two secondary RDLs, 118A and 118B, arranged on two side surfaces of the short IC stack 142. The secondary RDLs, 118A and 118B, can help increase a routing area of the IC structures 142, reduce a routing distance, and improve routing capacity and design flexibility of the semiconductor package 700A.

Figure 7I:
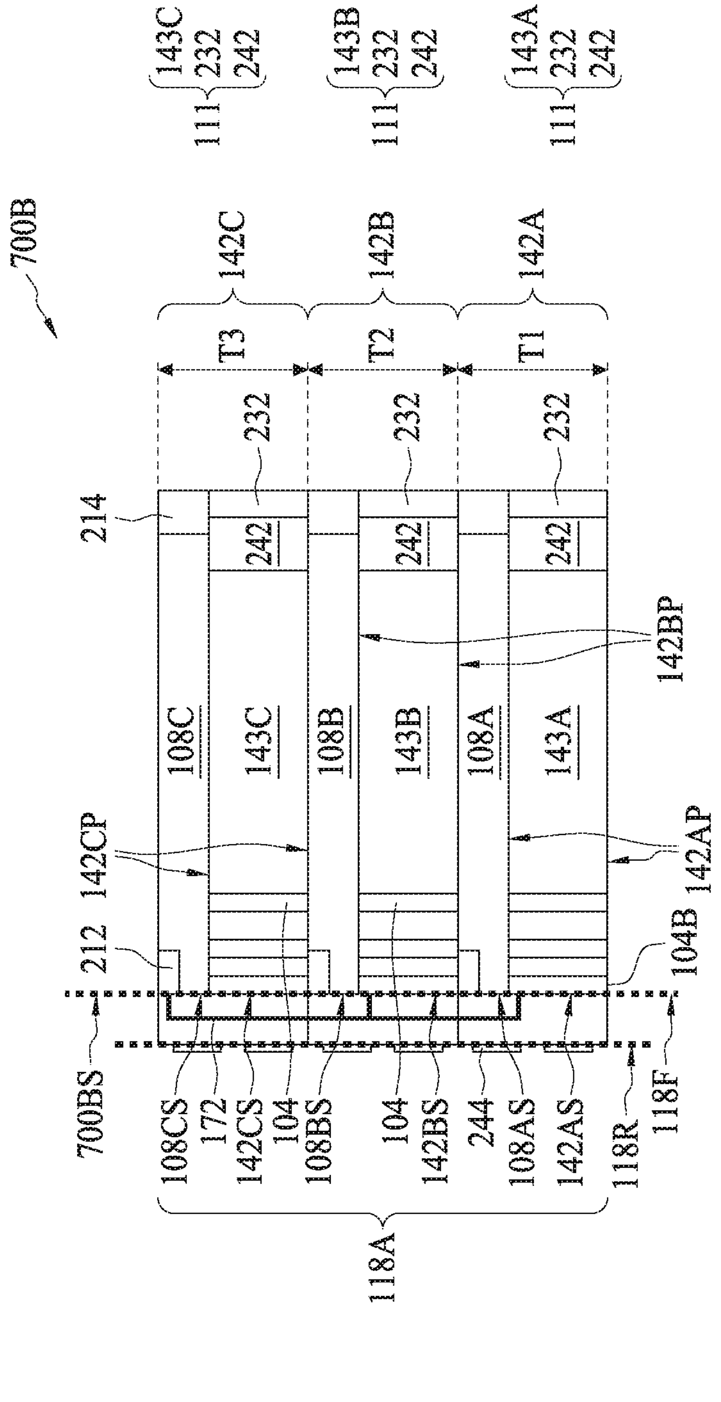
FIGS. 7I and 7J show cross-sectional views of semiconductor packages, in accordance with various embodiments of the present disclosure.
Figure 7J:
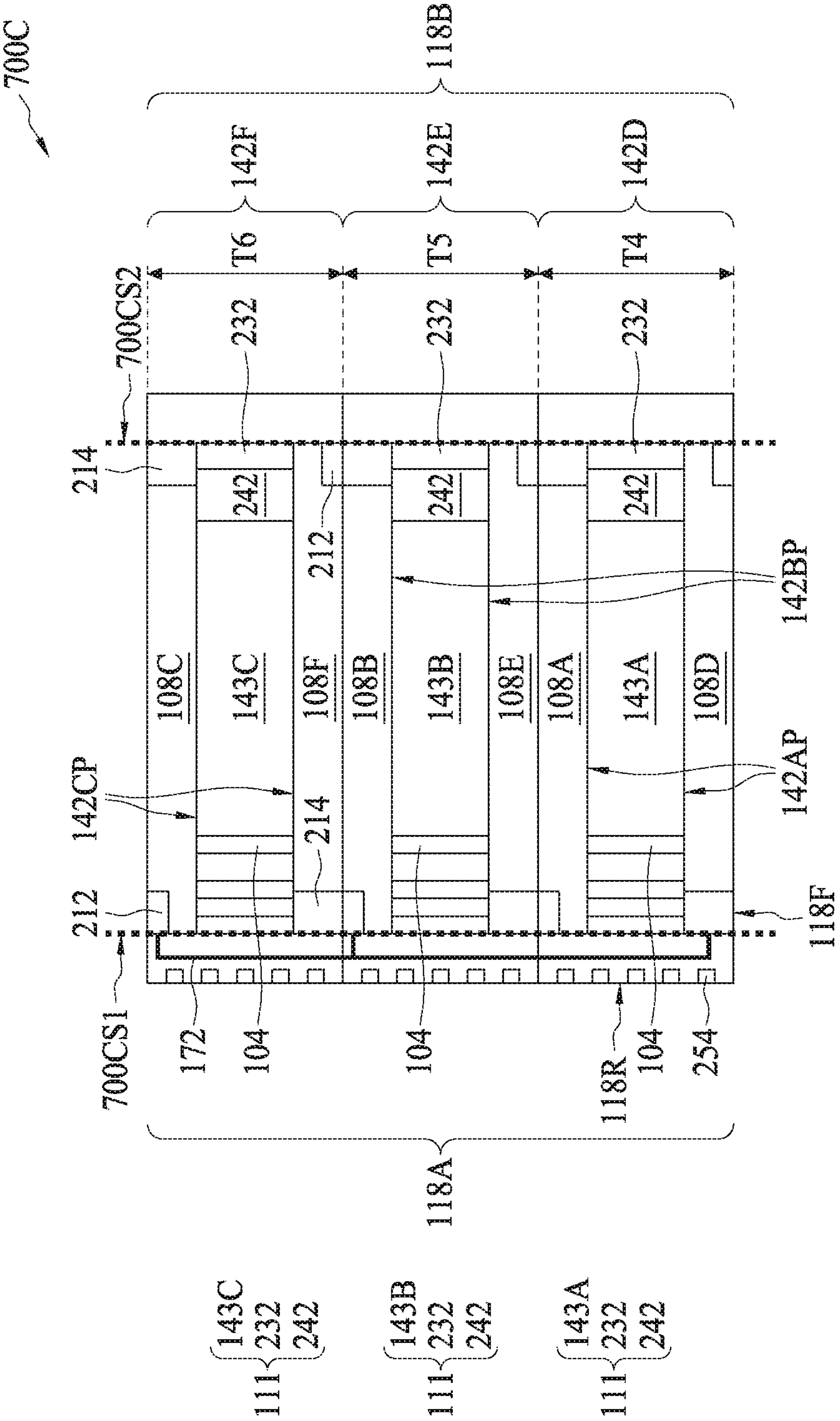
Figure 8A:
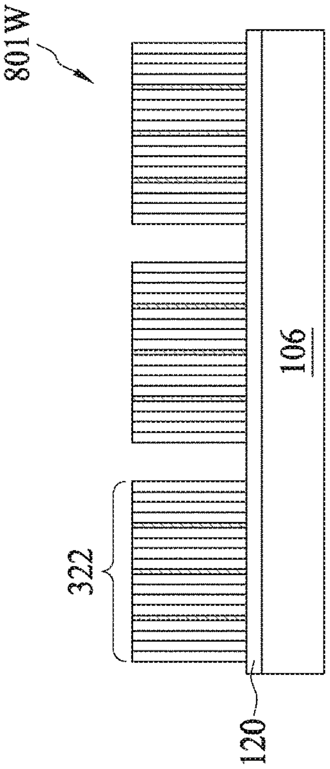
FIGS. 8A to 8E show cross-sectional views of structures in different stages of a method of manufacturing a semiconductor package, in accordance with various embodiments of the present disclosure.
Figure 8B:
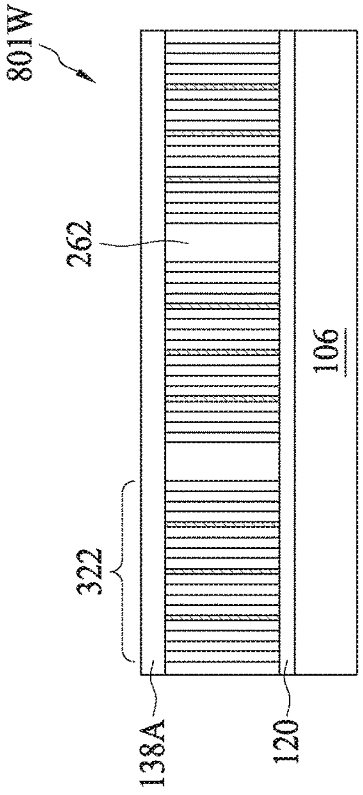
Figure 8C:
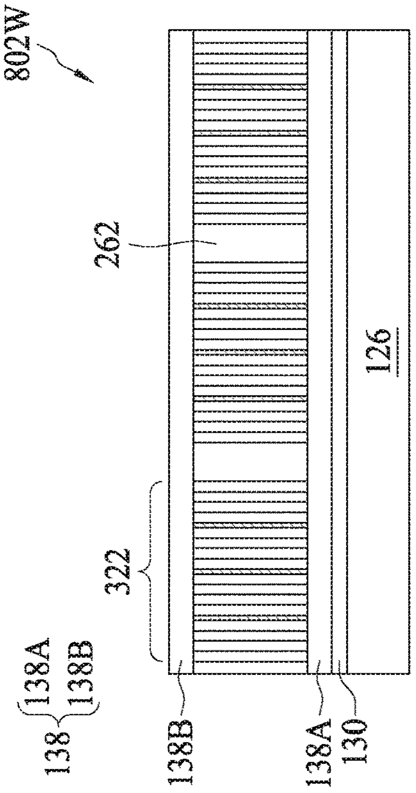
Figure 8D:
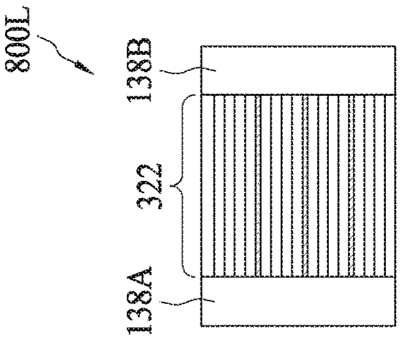
Figure 8E:
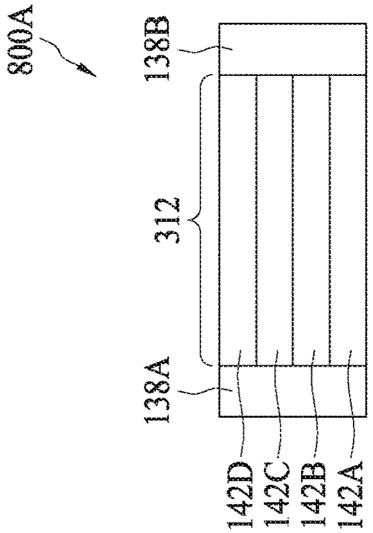

FIGS. 7I and 7J show cross-sectional views of semiconductor packages, 700B and 700C, in accordance with various embodiments of the present disclosure. The semiconductor packages, 700B and 700C, can be seen as detailed versions of the semiconductor package 700A with some minor changes. For example, referring to FIG. 7I, the semiconductor package 700B includes three IC structures, 142A, 142B and 142C, in a vertical stack, wherein each IC structure 142A, 142B or 142C, comprises a respective body 111 and a respective primary RDL 108A, 108B or 108C on its top side, arranged on the respective upper primary surfaces, 142AP, 142BP or 142CP. Throughout the present disclosure, the body 111 may also be referred to as the first body 111. Throughout the present disclosure, the upper primary surfaces, 142AP, 142BP or 142CP may also be referred to as the primary surfaces, 142AP, 142BP or 142CP. The body 111 of the IC structure 142A comprises a semiconductor die 143A, the edge TMV 232 and the potting material 242, wherein the semiconductor die 143A includes a plurality of TSVs 104. The primary surface and the secondary surface of the body 111 of the IC structure 142A can be referred to those described with reference to the IC structure 100A of FIG. 2C and are not repeated here for brevity. Moreover, the body 111 of the IC structure 142B comprises a semiconductor die 143B, the edge TMV 232 and the potting material 242, wherein the semiconductor die 143B includes a plurality of TSVs 104. The primary surface and the secondary surface of the body 111 of the IC structure 142B can be referred to those described with reference to the IC structure 100A of FIG. 2C and are not repeated here for brevity. Likewise, the body 111 of the IC structure 142C comprises a semiconductor die 143C, the edge TMV 232 and the potting material 242, wherein the semiconductor die 143C includes a plurality of TSVs 104. The primary surface and the secondary surface of the body 111 of the IC structure 142C can be referred to those described with reference to the IC structure 100A of FIG. 2C and are not repeated here for brevity. IC structures 142A, 142B and 142C can be different sizes and can contain a wide variety of combinations in terms of interior and edge interconnects covering TSVs and TMVs. According to some embodiments, the semiconductor die, 143A, 143B or 143C, can be at least one of a CPU die, a GPU die, a TPU die, a MEMS die, an AP die, an FPGA die, an ASIC die, a memory die, a transceiver die, a network interface die, an integrated photonics die, a packet buffer/router die or another suitable die (e.g., an interconnect die such as an interposer). The respective secondary surfaces 142AS, 142BS and 142CS of the IC structures 142A, 142B and 142C constitute or coincide with a secondary plane 700BS of the semiconductor package 700B. According to some embodiments, the semiconductor package 700B only includes a single secondary RDL 118A arranged on the left-side secondary plane 700BS of the semiconductor package 700B. Throughout the present disclosure, the secondary RDL 118A may also be referred to as the edge RDL 118A.

Based on the above and referring to FIG. 7I, it can be seen that the semiconductor package 700B comprises three IC structures 142A, 142B and 142C, each IC structure 142A, 142B or 142C comprises a first body 111 having a primary surface 142AP, 142BP or 142CP and a secondary surface 142AS, 142BS or 142CS, wherein the primary surface 142AP, 142BP or 142CP is greater than the secondary surface 142AS, 142BS or 142CS in area. Each IC structure 142A, 142B or 142C further comprises a primary RDL 108A, 108B or 108C over the respective primary surface 142AP, 142BP or 142CP of the respective first body 111, with the primary RDL 108A, 108B or 108C having a respective edge surface 108AS, 108BS or 108CS aligned or substantially aligned with the respective secondary surface 142AS, 142BS or 142CS of the first body 111. The semiconductor package 700B further comprises an edge RDL 118A over the secondary surface 142AS, 142BS or 142CS of the respective first body 111 of each IC structure 142A, 142B or 142C and the edge surface 108AS, 108BS or 108CS of the respective primary RDL 108A, 108B or 108C of each IC structure 142A, 142B or 142C. Referring to the descriptions of FIGS. 5A, 5B and 7I above, the primary RDLs 108A, 108B or 108C is electrically connected to the edge RDL 118A and the first body 111, and the edge RDL 118A is electrically connected to the first body 111 through the primary RDL 108A, 108B or 108C.

Based on the above and referring to FIG. 7I, it can be seen that the primary RDL 108A, 108B or 108C further comprises a first conductive element 212 exposed through the edge surface 108AS, 108BS or 108CS of the primary RDL 108A, 108B or 108C, wherein the edge RDL 118A has a first interconnect surface 118F and a second interconnect surface 118R opposite to the first interconnect surface 118F, wherein the first conductive element 212 is electrically connected to a plurality of second conductive elements 244 at the second interconnect surface 118R.

Based on the above and referring to FIGS. 2C, 2G and 7I, it can be seen that the primary RDL 108A, 108B or 108C further comprises a first conductive element 202 exposed through the edge surface 108AS, 108BS or 108CS of the primary RDL 108A, 108B or 108C, wherein the first conductive element 202 comprises a conductive pad 212 on the edge surface 108AS, 108BS or 108CS of the primary RDL 108A, 108B or 108C substantially parallel to the primary surface 142AS, 142BS or 142CS, a conductive via 172 connecting adjacent layers of the primary RDL 108A, 108B or 108C, a stacked via 214 traversing the primary RDL 108A, 108B or 108C, or a combination thereof.

Based on the above and referring to FIG. 2C, it can be seen that the secondary surface 142AS, 142BS or 142CS of the first body 111 and the edge surface 108AS, 108BS or 108CS of the primary RDL 108A, 108B or 108C jointly form a secondary plane 700BS, wherein the edge RDL 118A covers the secondary plane 700BS, with the edge RDL 118A comprising a first surface 118F coincident with the secondary plane 700BS, and a second surface 118R opposite to the first surface 118F.

According to some embodiments, the IC structures, 142A, 142B and 142C, are characterized by substantially equal or unequal thicknesses T1, T2 and T3, respectively. Each IC structure, 142A, 142B or 142C, may include a thickness in a range between about 30 μm and about 775 μm.

The secondary RDL 118A includes a front interconnect surface 118F and a back interconnect surface 118R opposite to the front interconnect surface 118F. The secondary RDL 118A is electrically connected to the secondary plane 700BS through the front interconnect surface 118F to aid in routing efficiency and flexibility. For example, the secondary RDL 118A includes a conductive trace or wire 172 extending along a longitudinal axis of the secondary RDL 118A and electrically connecting the edge conductive pad 212 of the primary RDL 108C and the edge TSV 104B of the semiconductor die 143C and 143A while bypassing the bodies of the IC structures 142A, 142B and 142C. Further, the secondary RDL 118A can be used to connect other circuits through the back interconnect surface 118R. For example, the secondary RDL 118A includes one or more conductive bumps, micro-bumps, or a bump pad array 244 (all of which referred to as external connections of the secondary RDL 118A) on the back interconnect surface 118R, wherein the conductive bump 244 is configured to electrically connect the secondary RDL 118A to circuits or layers adjacent to the secondary RDL 118A. Throughout the present disclosure, the conductive bump 244 may also be referred to as the second conductive element 244.

Referring to FIG. 7J, the semiconductor package 700C is similar to the semiconductor package 700B in many aspects, and descriptions of such similar features are not repeated for brevity. According to some embodiments, the semiconductor package 700C includes three IC structures, 142D, 142E and 142F, in a stack, wherein each IC structure, 142D, 142E or 142F, comprises a respective body 111 and two respective primary RDLs, 108A/108D, 108B/108E and 108C/108F, arranged on respective upper and lower primary surfaces, 142AP, 142BP and 142CP. According to some embodiments, the body 111 of the IC structure 142D includes the semiconductor dies 143A, the edge TMV 232, and the potting material 242, wherein the semiconductor die 143A includes a plurality of TSVs 104. The primary surface and the secondary surface of the body 111 of the IC structure 142D can be referred to those described with reference to the IC structure 100A of FIG. 2C and are not repeated here for brevity. According to some embodiments, the body 111 of the IC structure 142E includes the semiconductor dies 143B, the edge TMV 232, and the potting material 242, wherein the semiconductor die 143B includes a plurality of TSVs 104. The primary surface and the secondary surface of the body 111 of the IC structure 142E can be referred to those described with reference to the IC structure 100A of FIG. 2C and are not repeated here for brevity. According to some embodiments, the body 111 of the IC structure 142F includes the semiconductor dies 143C, the edge TMV 232, and the potting material 242, wherein the semiconductor die 143C includes a plurality of TSVs 104. The primary surface and the secondary surface of the body 111 of the IC structure 142F can be referred to those described with reference to the IC structure 100A of FIG. 2C and are not repeated here for brevity.

The semiconductor package 700C differs from the semiconductor package 700B further in that, in the case of 700C, the secondary RDL 118A arranged on a secondary plane 700CS1 of the semiconductor package 700C includes an array of conductive pads 254 on the back interconnect surface 118R of the secondary RDL 118A. Throughout the present disclosure, the conductive pads 254 may also be referred to as the second conductive element 254. According to some embodiments, the conductive pads 254 have upper surfaces that are coplanar with the back interconnect surface 118R of the secondary RDL 118A. Such coplanar arrangement of the secondary RDL 118A is helpful in performing hybrid bonding with other circuits or layers. Additionally, in contrast to the semiconductor package 700B, the semiconductor package 700C further includes another secondary RDL 118B arranged on a secondary plane 700CS2. A configuration of interconnections in the secondary RDL 118B may be similar to or different from that in the secondary RDL 118A. The secondary RDL 118B may include external connections such as micro-bumps, hybrid bonding layers, direct bonding layers, a flexible circuit connector (details thereof are provided below with reference to FIG. 9A), a combination thereof, or the like. Further, the secondary RDL 118A (or 118B) includes a conductive trace or wire 172 extending in the longitudinal axis of the secondary RDL 118A and electrically connecting the edge conductive pads 212 of the primary RDLs 108C and 108B and the edge conductive via 214 of the primary RDL 108D while bypassing the bodies of the IC structure 142D, 142E and 142F to enable skip-die and multi-sided power supply and signaling.

According to some embodiments, the IC structures, 142D, 142E and 142F, are of substantially equal or unequal thicknesses, T4, T5 and T6, respectively. Each IC structure, 142D, 142E or 142F, may include a thickness in a range between about 30 μm and about 775 μm.

Semiconductor packages, 700A, 700B and 700C, allow for skip-die and multi-sided power supply and signaling through interior interconnect structures 108X covering TMVs, primary RDLs 108 and TSVs, skip-die and multi-sided power supply and signaling through edge interconnect structures 118X covering secondary RDLs 118 and edge interconnects, as well as skip-die and multi-sided power supply and signaling through both the interior interconnect structure 108X and edge interconnect structure 118X. These semiconductor packages endowed with multi-sided power supply and signaling enable "PPAC optimization per cubic millimeter" of 3D ICs (exemplified herein by short IC stacks) to be accomplished, wherein a vertical dimension of the 3D ICs can be expanded to cover ICs, interposer, IC package substrate, IC package and system PCB (see, for instance, FIGS. 71, 7J, 12C, 13C, 14A and 14B).

FIGS. 8A to 8E show cross-sectional views of structures in different stages of a method of manufacturing a semiconductor package 800A, in accordance with various embodiments of the present disclosure. The steps shown in FIGS. 8A to 8E are similar to those shown in FIGS. 7A to 7E in many aspects, and descriptions of such similar features are not repeated for brevity. A main difference between the steps shown in FIGS. 8A to 8E and those shown in FIGS. 7A to 7E is that the edge interconnect RDL structures, 118A and 118B in FIGS. 7A to 7E are replaced with edge interconnect RDL structures, 138A and 138B, which, are formed by bonding flexible printed circuits (Flexes) to side surfaces of the short and tall IC stacks. Throughout the present disclosure, the edge interconnect RDL structures 138A and 138B may also be referred to as the edge RDLs 138A and 138B. The Flex may be formed of a plurality of conductive line layers (not separately shown), wherein each conductive line layer includes conductive lines and materials of an IMD layer, e.g., polyimide or benzocyclobutene (BCB), for electrically insulating conductive lines. The Flex may further include bonding pads (not separately shown) formed of gold, solder, or other suitable bonding materials. The Flex provides advantages of being bendable and having high-density, fine-pitch bonding pads (with a pitch down to about 10 μm), and therefore the Flex is suitable for the secondary RDLs, 138A and 138B, for an edge interconnect structure 118X.

Figure 9B:
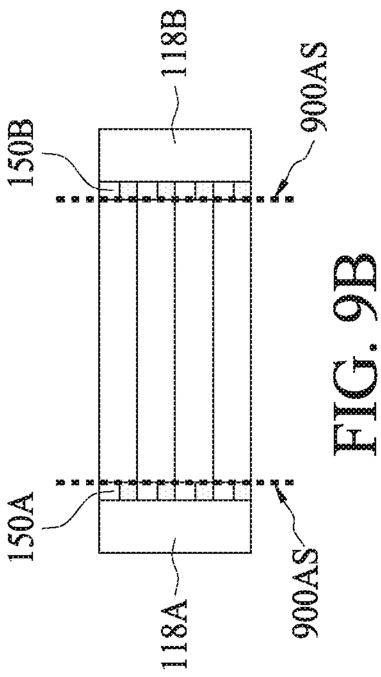
FIGS. 9A and 9B show cross-sectional views of structures in different stages of a method of manufacturing a semiconductor package, in accordance with various embodiments of the present disclosure.
Figure 9A:
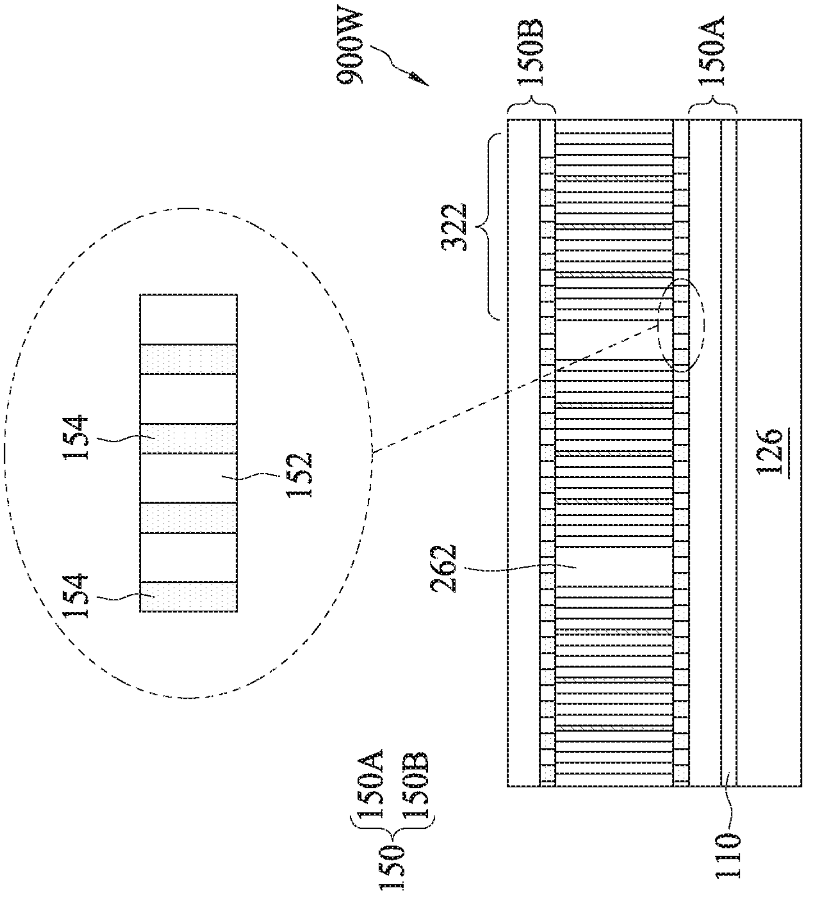

FIG. 9A shows a cross-sectional view of an structure in different stages of a method of manufacturing a semiconductor package 900A, in accordance with various embodiments of the present disclosure. The cross-sectional view of a semiconductor device 900W is a detailed representation of the semiconductor device 802W shown in FIG. 8C. In FIG. 9A, the semiconductor device 900W can be seen to include two connection layers 150, e.g., a first connection layer 150A arranged between molded tall IC stacks 322 and the edge interconnect structure 118A, and a second connection layer 150B arranged between the molded tall IC stacks 322 and the edge interconnect structure 118B. According to some embodiments, the connection layer, 150A or 150B, may include an array of flexible circuit connectors 154 and a non-conductive filler 152 encapsulating the flexible circuit connectors 154. The flexible circuit connectors 154 are bonded to the secondary planes 900AS of short IC stacks 312 (FIG. 9B). The flexible circuit connectors 154 may include conductive materials such as copper, tin, gold, or other conductive materials suitable for bonding. The non-conductive filler 152 may be an encapsulant such as a non-conductive adhesive (NCA), a non-conductive film, a non-conductive paste (NCP) or an encapsulant used in chip-on-film (CoF) packaging of driver ICs for display applications The encapsulant or the non-conductive filler 152 may fill spaces between the flexible circuit connectors 154 and between the secondary planes 900AS and the respective connection layers, 150A and 150B. Referring to FIG. 9B, after a singulation or dicing process, individual short IC stack structures 900A are formed from the semiconductor device 900W.

Flexes based on polyimide dielectric with multiple, say, 2 metal (copper, Cu) layers can be good interconnect solutions for high-speed applications. Flexes can also be used for interconnecting metal pads not just on one side face but also metal pads on multiple side faces because Flexes are mechanically formable and bendable. Flexes can provide high-density interconnects (with pitches down to 20 μm and even to 10 μm), DC power distribution, integrated I/Os (inputs and outputs), power distribution, decoupling and electro-magnetic compatibility. All the above good attributes coupled with that Flexes can be tested known-good prior to bonding make Flexes (particularly, adhesive-less Flexes) ideal candidates for 3D IC edge interconnection covering one side face or more. Take chip-on-film (COF) bonding for liquid crystal display applications for instance, adhesive-less Flexes with Cu leads (which can be pre-plated with tin, Sn) are bonded using thermo-compression bonding (TCB) to, for instance, gold bumps, Sn bumps or tin/copper (Sn/Cu) bumps on glass for applications such as mobiles. A solvent-less epoxy based underfill can be applied following bonding to avoid air bubbles that can be associated with solvent based underfills if not baked properly. Alternatively, a non-conductive adhesive (NCA) or non-conductive paste (NCP) can be applied prior to bonding to glass followed by TCB, in a way similar to fine-pitch flip chip micro-bump assembly. For edge interconnection of short 3D IC structure stacks using Flexes, one can first create the bumps on the edge pads, edge vias, edge TSVs and/or edge TMVs and then proceed to bond Flexes using thermo-compression bonding and NCA onto the bumps on one side face or more. Pre-baking the circuitry prior to Flex bonding can be performed to ensure delamination will not occur. Flexes can also be used to interconnect metal pads and RDLs on different side faces of the short 3D IC structure stack. Metal pads on the bonded Flexes residing on different side faces can be interconnected using, for instance, Flexes with leads/pads containing palladium (Pd) passivation for Flex-to-Flex bonding at low-temperatures such as 140° C.

Figure 10A:
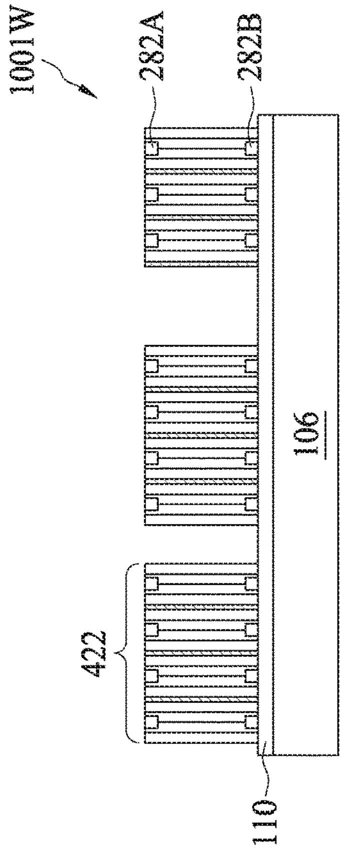
FIGS. 10A to 10H show cross-sectional views of structures in different stages of a method of manufacturing a semiconductor package, in accordance with various embodiments of the present disclosure.

FIGS. 10A to 10H show cross-sectional views of structures in different stages of a method of manufacturing a semiconductor package 1000A, in accordance with various embodiments of the present disclosure. The steps shown in FIGS. 10A to 10H are similar to those shown in FIGS. 7D to 7H in many aspects, and descriptions of such similar features are not repeated for brevity. Referring to FIG. 10A, a semiconductor device 1001W is provided. The semiconductor device 1001W includes a carrier substrate 106 and a release layer 110 over the carrier substrate 106. A plurality of tall IC stacks 422 are prepared and arranged on the release layer 110. Each tall IC stack 422 is formed in a manner similar to the steps described with reference to FIGS. 7A to 7C. In other words, each tall IC stack 422 includes a plurality of short IC stacks 1000A (see FIG. 10H) arranged alternately with a plurality of release layers 140 (see FIG. 10G). Further, each short IC stack 1000A includes a plurality of IC structures 162 (e.g., IC structures 162A, 162B, 162C and 162D shown in FIG. 10H). A main difference between the IC structures 162 and the IC structures 142 in FIGS. 7D to 7H is that the IC structures 162 include edge conductive pads 282, e.g., edge conductive pads, 282A and 282B (FIG. 10B), arranged on two side surfaces of the respective IC structures 162. The edge conductive pads, 282A and 282B, may be arranged in the respective IC structures 162 in a manner similar to those of the edge TSV 104B, the edge conductive vias 214 or the edge conductive pads 212 in the IC structure 100A (FIG. 2D), of the edge TMVs 232 in the IC structure 300C (FIG. 3F), or the like.

Figure 10B:
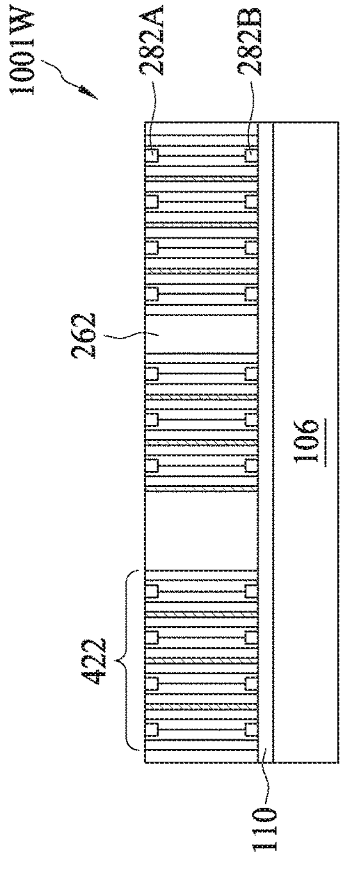
Figure 10C:
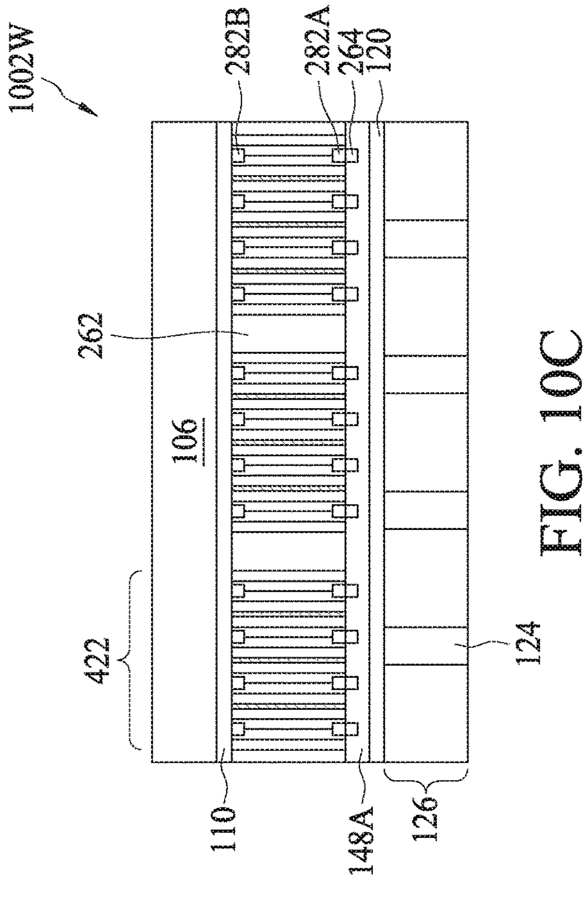

Referring to FIG. 10B, the semiconductor device 1001W, i.e., the tall IC stacks 422, is molded or encapsulated using a potting material 262 in a manner similar to that shown in FIG. 7E and is planarized. Referring to FIG. 10C, another carrier substrate 126 is provided in a semiconductor device 1002W, and another release layer or a sacrificial layer 120 is formed over the carrier substrate 126. A secondary RDL 148A is formed over the release layer or sacrificial layer 120, wherein the secondary RDL 148A includes an array of conductive pads 264 on an upper surface of the secondary RDL 148A. Throughout the present disclosure, the secondary RDL structure 148A may also be referred to as the edge RDL 148A. According to some embodiments, the semiconductor device 1001W is bonded to RDL 148A supported by the carrier substrate 126, forming the semiconductor device 1002W through a hybrid or flip chip bonding process. The semiconductor device 1001W may include a bonding surface formed of metallic surfaces of the conductive pads 282A and dielectric surfaces substantially similar to or different from those of the secondary RDL 148A. Similarly, the secondary RDL 148A includes a bonding surface formed of metallic surfaces of matching conductive pads 264 and dielectric surfaces of an IMD layer of the secondary RDL 148A. Hybrid bonding is performed to form metal-to-metal bonds and dielectric-to-dielectric bonds at an interface of the bonding surfaces of the semiconductor device 1001W and the secondary RDL 148A.

Figure 10D:
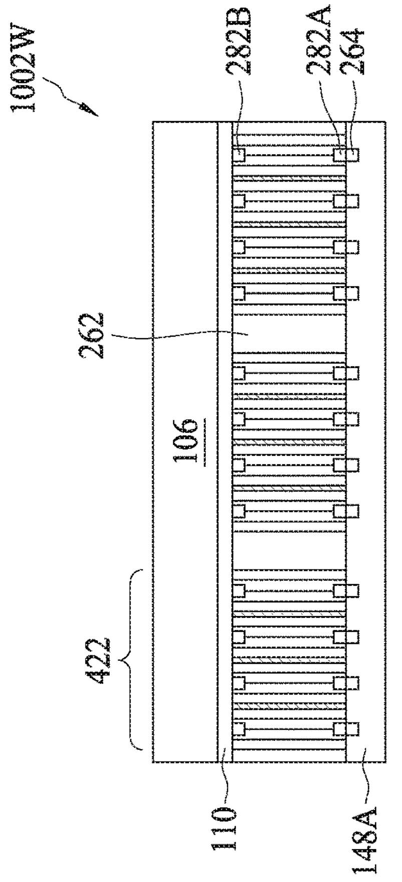

Referring to FIG. 10D, the carrier substrate 126 is removed or detached from the semiconductor device 1002W by releasing the release layer 120. According to some embodiments, referring to FIG. 10C, the carrier substrate 126 includes a plurality of holes 124 extending through a thickness of the carrier substrate 126. The holes 124 may facilitate the release of the carrier substrate 126 from the semiconductor device 1002W by wet chemical treatments.

The release or sacrificial layer 120 in FIG. 10C can be made of a mixture of metal and a non-metal. Metal candidates here can include nickel (Ni), chromium (Cr), titanium (Ti), copper (Cu), manganese (Mn), iron (Fe), cobalt (Co), tungsten (W), molybdenum (Mo) and tantalum (Ta), whereas non-metal candidates can include oxides, phosphates and chromates of the metals. Preferred mixtures include chromium and chromium oxide, and nickel and nickel oxide. Methods of deposition include vapor deposition, sputtering, electroplating and immersion plating. Many types of sacrificial layers used in MEMS processing can also be considered: metallic materials such as Cu, Al (aluminum), Ti and Cr, and also non-metallic materials such as silicon dioxide, poly-silicon, and polymers such as poly (methyl methacrylate), polyimide and photoresists (including photosensitive polyimides). The release layer can be quite thin, for instance, less than 0.3 μm in thickness. Chromium oxide, $Cr_2O_3$, has many desirable attributes as a sacrificial layer: it can be sputter deposited to form stress controlled films of several hundred nanometers thick, it adheres well to both dielectric and metal surfaces, it is resistant to most acids and bases, it etches rapidly in standard chromium etchants, and it has minimal tendencies to react with other commonly used materials even at high temperatures. To facilitate subsequent removal through etching, through holes can be created in the substrate to expose the release layers to speed up wet chemical removal.

Figure 10E:
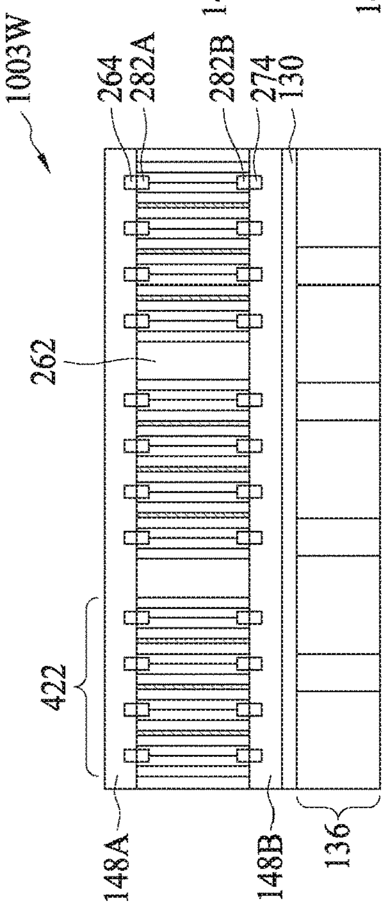
Figure 10F:
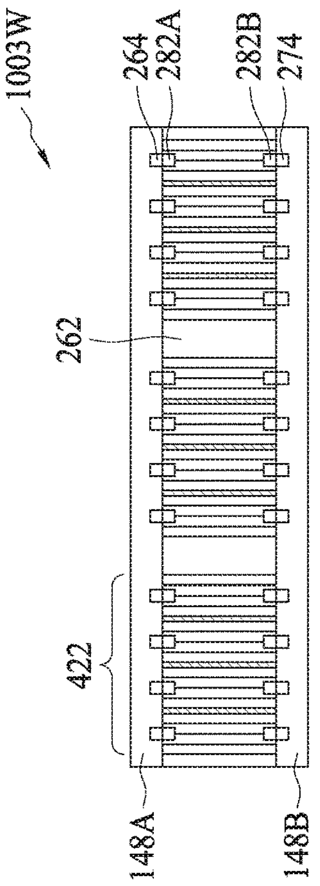

FIG. 10E illustrates formation of a secondary RDL 148B. Throughout the present disclosure, the secondary RDL structure 148B may also be referred to as the edge RDL 148B. Another carrier substrate 136 with holes 134 is provided in a semiconductor device 1003W, and another release or sacrificial layer 130 is formed over the carrier substrate 136. The secondary RDL 148B is formed over the release layer 130, wherein the secondary RDL 148B includes an array of conductive pads 274 on an upper surface of the secondary RDL 148B. The semiconductor device 1002W, following bonding to the third carrier substrate (not shown) with the help of a release layer as in the case of 1001W, and release of the carrier substrate 106, is bonded to the semiconductor device 1003W while being supported by the carrier substrate 116 with a wafer-level bonding through a hybrid bonding process. The semiconductor device 1002W includes a bonding surface formed of metallic surfaces of the conductive pads 282B and dielectric surfaces substantially similar to or different from those of the secondary RDL 148B. Similarly, the secondary RDL 148B includes a bonding surface formed of metallic surfaces of the conductive pads 274 and matching dielectric surfaces of an IMD layer of the secondary RDL 148B. Hybrid bonding is performed to form metal-to-metal bonds and dielectric-to-dielectric bonds at an interface of the bonding surfaces of the semiconductor device 1002W and the secondary RDL 148B. Following bonding, the carrier substrate 136 is released from the semiconductor structure 1003W (FIG. 10E), the semiconductor structure 1003W is wafer mounted and the third carrier substrate 116 is removed leaving the semiconductor structure 1003W as shown in FIG. 10F mounted on the wafer mount frame ready for singulation or dicing from the semiconductor device 1003W.

Figure 10G:
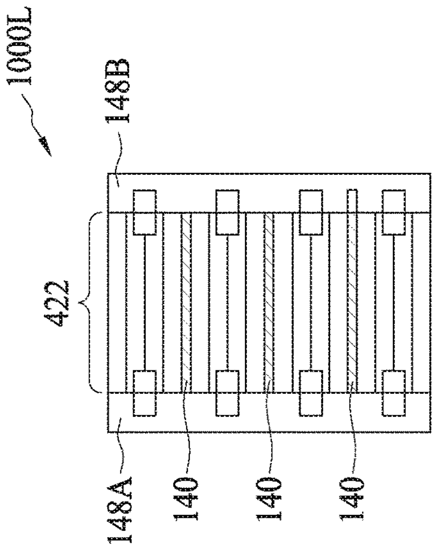

Referring to FIG. 10G, a singulation or dicing process is then performed to separate the semiconductor device 1003W into individual IC structures 1000L, i.e., the tall IC stacks. The singulation or dicing process involving dicing, laser ablation, plasma etching, dry etch, wet etch (e.g., an acid etch), wet cleaning, or a combination thereof may be performed to cut through the semiconductor device 1003W at locations of the potting material 262 to free the tall IC stacks 422 (FIG. 10G) from the semiconductor structure 1003W (FIG. 10F) The secondary RDLs, 148A and 148B, may be formed such that they are absent at the release layers 140 on the dicing or singulation streets between adjacent short IC stacks to facilitate singulation.

Figure 10H:
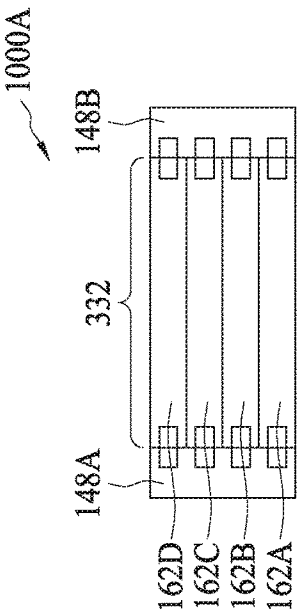

FIG. 10H illustrates formation of individual semiconductor packages 1000A, i.e., the short IC stacks, from the respective IC structures 1000L. A release process is performed to remove the release layers 140 from each of the IC structures 1000L such that the semiconductor packages 1000A, i.e., the short IC stacks 332 containing secondary RDLs, 148A and 148B, are separated from each other. According to some embodiments, a singulation or dicing process involving laser irradiation, thermos-mechanical shearing, dicing, laser ablation, plasma etching, dry etch, wet etch (e.g., an acid etch), wet cleaning, or a combination thereof is performed to aid in the release process by cutting through the secondary RDLs, 148A and 148B, at locations of the release layers 140. The secondary RDLs may be formed such that they are absent at the release layers 140 on the dicing streets between adjacent short IC stacks to facilitate singulation. As illustrated in FIG. 10H, the semiconductor package 1000A includes a stack of IC structures 162 and two secondary RDLs 148A and 148B arranged on two side surfaces of the stack of IC structures 162. The secondary RDLs, 148A and 148B, can help increase a routing area of the IC structures 162, reduce a routing distance, and improve a routing capacity and flexibility of the semiconductor package 1000A.

Figure 11B:
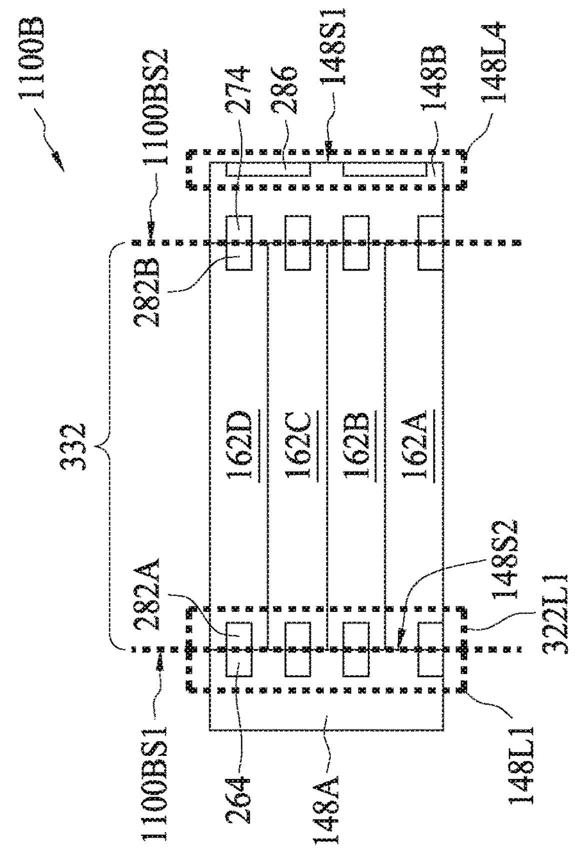
FIGS. 11A and 11B show cross-sectional views of a semiconductor package, in accordance with various embodiments of the present disclosure.
Figure 11A:
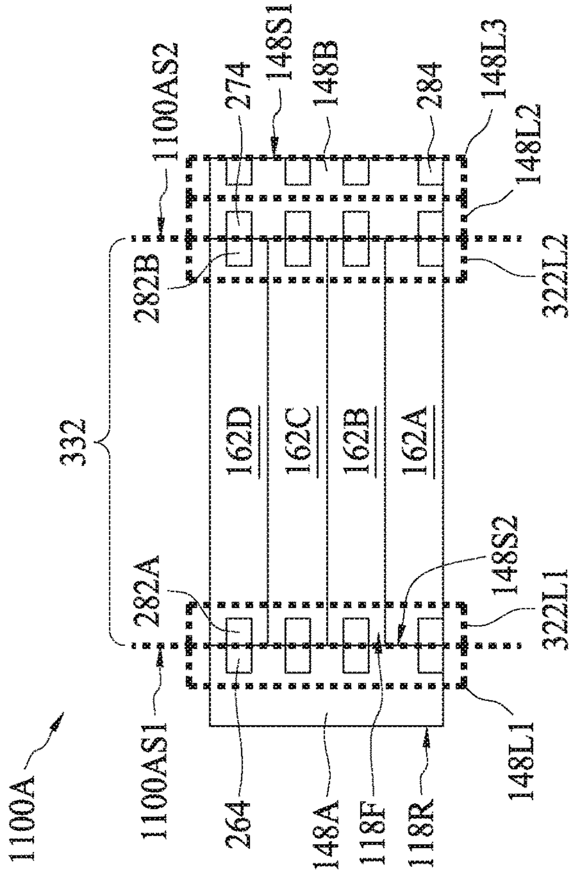

FIG. 11A shows a cross-sectional view of a semiconductor package 1100A, in accordance with various embodiments of the present disclosure. The semiconductor package 1100A is similar to the semiconductor package 1000A in many aspects, and such similar features are not repeated for brevity. The semiconductor package 1100A includes IC structures, 162A, 162B, 162C and 162D, and secondary RDLs 148A and 148B. The semiconductor package 1100A further includes a first bonding layer 322L1 and a second bonding layer 322L2 arranged on two opposite secondary planes 1100AS1 and 1100AS2, respectively, for performing edge interconnection. The first bonding layer 322L1 includes a first bonding surface on the secondary plane 1100AS1. The second bonding layer 322L2 includes a second bonding surface on the secondary plane 1100AS2. The secondary RDL 148A faces the secondary plane 1100AS1, wherein the secondary RDL 148A includes a first bonding layer 148L1 configured to be bonded to the first bonding layer 322L1. Similarly, the secondary RDL 148B faces the secondary plane 1100AS2, wherein the secondary RDL 148B includes a second bonding layer 148L2 configured to be bonded to the second bonding layer 322L2.

According to some embodiments, the first bonding layer 322L1 is bonded to the first bonding layer 148L1 via hybrid bonding. The first bonding layer 322L1 includes a bonding surface formed of metallic surfaces of conductive pads 282A and dielectric surfaces of a dielectric material of the first bonding layer 322L1, e.g., an IMD layer in the first bonding layer 322L1. Similarly, the secondary RDL 148A includes a first bonding surface formed of metallic surfaces of conductive pads 264 and dielectric surfaces of an IMD layer of the secondary RDL 148A. Hybrid bonding is performed to form metal-to-metal bonds and dielectric-to-dielectric (e.g., oxide-to-oxide or polyimide-to-polyimide) bonds at an interface of the first bonding surfaces of the first bonding layer 322L1 and the first bonding layer 148L1. In scenarios where hybrid bonding is adopted, the first bonding layers, 322L1 and 148L1, are referred to herein as hybrid bonding layers.

Likewise, according to some embodiments, the second bonding layer 322L2 is bonded to the second bonding layer 148L2 via hybrid bonding. The second bonding layer 322L2 includes a second bonding surface formed of metallic surfaces of conductive pads 282B and dielectric surfaces of a dielectric material of the second bonding layer 322L2, e.g., an IMD layer in the second bonding layer 322L2. Similarly, the secondary RDL 148B includes a second bonding surface formed of metallic surfaces of conductive pads 274 and dielectric surfaces of an IMD layer of the secondary RDL 148B. Hybrid bonding is performed to form metal-to-metal bonds and dielectric-to-dielectric (e.g., oxide-to-oxide or polyimide-to-polyimide) bonds at an interface of the second bonding surfaces of the second bonding layer 322L2 and the second bonding layer 148L2. In scenarios where hybrid bonding is adopted, the second bonding layers 322L2 and 148L2 are referred to herein as hybrid bonding layers.

According to some embodiments, the first bonding layer 322L1 includes an array of micro-bumps 282A protruding from the bonding surface of the first bonding layer 322L1, and the first bonding layer 148L1 includes an array of bonding pads (or micro-bumps) 264 or bonding pads protruding from the first bonding surface of the first bonding layer 148L1 with the bonding pads matching those of the micro-bumps 282A. The first bonding layer 322L1 is bonded to the first bonding layer 148L1 via flip-chip bonding. An underfill material, e.g., an epoxy-based material, a non-conductive paste or a non-conductive film may be dispensed between the first bonding layers 322L1 and 148L1 to fill the spaces between micro-bumps 282A and bonding pads 264. Similarly, according to some embodiments, the second bonding layer 322L2 includes an array of micro-bumps 282B protruding from the second bonding surface of the second bonding layer 322L2, and the second bonding layer 148L2 includes an array of bonding pads (or micro-bumps) 274 corresponding to the micro-bumps 282B. The second bonding layer 322L2 is bonded to the second bonding layer

148L2 via flip-chip bonding. An underfill material, e.g., an epoxy-based material, a non-conductive paste, or a non-conductive film may be dispensed between the second bonding layers 322L2 and 148L2 to fill the spaces between micro-bumps 282B and bonding pads 274. In scenarios where flip-chip bonding is adopted, the first bonding layers 322L1, 148L1 and the second bonding layers 322L2, 148L2 are referred to herein as flip-chip bonding layers. Throughout the present disclosure, the first bonding layer 148L1 and the second bonding layer 148L2 may also be referred to as the first flip-chip bonding layers 148L1 and 148L2, and the first bonding layer 322L1 and the second bonding layer 322L2 may also be referred to as the second flip-chip bonding layers 322L1 and 322L2.

Based on the above and referring to FIG. 11A, wherein the first surface 118F of the edge RDL 148A or 148B comprises a first flip-chip bonding layer 148L1 or 148L2 corresponding to a second flip-chip bonding layer 322L1 or 322L2 on the secondary plane 1100AS1 or 1100AS2.

According to some embodiments, at least one of the secondary RDLs, 148A and 148B, includes a third bonding layer 148L3 (FIG. 11A only illustrates one third bonding layer 148L3 in the secondary RDL 148B) on a third bonding surface 148S1 opposite to the secondary planes, 1100AS1 and 1100AS2, or the first/second bonding surfaces mentioned above. The third bonding layer 148L3 may include conductive pads 284 or micro-bumps 284 on the third bonding surface 148S1 with configurations similar to those of the first bonding layer 148L1 or the second bonding layer 148L2 depending upon applications, and the third bonding layer 148L3 is configured for hybrid bonding, flip-chip or flex bonding to another circuit or device where appropriate.

FIG. 11B shows a cross-sectional view of a semiconductor package 1100B, in accordance with various embodiments of the present disclosure. The semiconductor package 1100B is similar to the semiconductor package 1100A in many aspects, and such similar features are not repeated for brevity. A main difference between the semiconductor package 1100B and the semiconductor package 1100A is that the semiconductor package 1100B includes a fourth bonding layer 148L4 in place of the third bonding layer 148L3 of the semiconductor package 1100A. The fourth bonding layer 148L4 may be arranged in the secondary RDL 148A or 148B on the bonding surface 148S1 with bonding pads protruding out from the surface 148S1, opposite to a secondary plane, 1100BS1 or 1100BS2. Further, the fourth bonding layer 148L4 includes an array of bond pads 286 arranged on the bonding surface 148S1 of the secondary RDL 148B. The bond pad array of the fourth bonding layer 148L4 may be used to perform flip-chip bonding or other suitable bonding processes with adjacent circuits or devices. The third bonding layer 148L3 or the fourth bonding layer 148L4 is referred to as a hybrid bonding layer or a flip-chip bonding layer depending upon the bonding scenario.

Figure 12A:
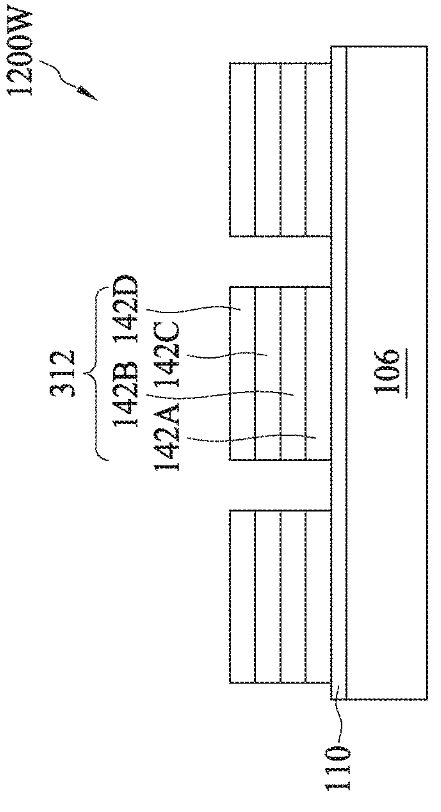
FIGS. 12A to 12C show cross-sectional views of structures in different stages of a method of manufacturing a semiconductor package, in accordance with various embodiments of the present disclosure.
Figure 12B:
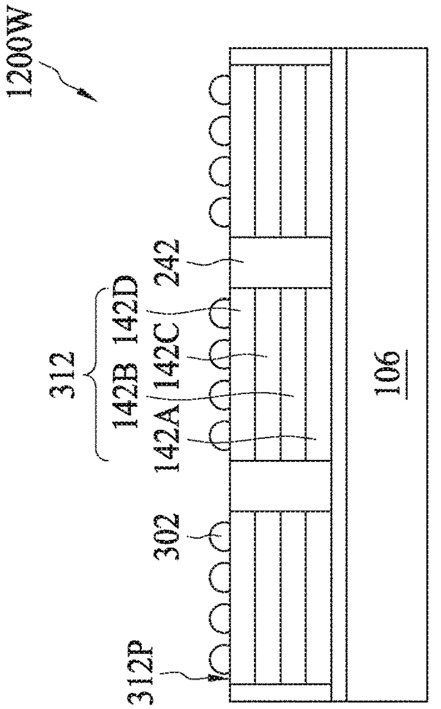
Figure 12C:
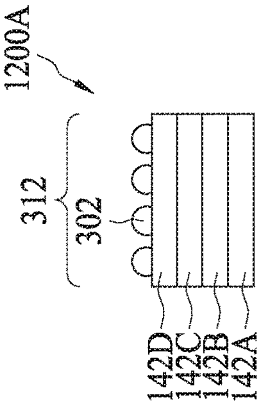

FIGS. 12A to 12C show cross-sectional views of structures in different stages of a method of manufacturing a semiconductor package 1200A, in accordance with various embodiments of the present disclosure. Referring to FIG. 12A, a carrier substrate 106 is provided or received in a semiconductor device 1200W. A release layer 110 is formed over an upper surface of the carrier substrate 106. A pick-and-place process is performed to pick and bond a plurality of known-good IC structures 142, e.g., IC structures 142A, and arrange them in a first tier of respective short IC stacks 312 over the release layer 110 with a suitable pitch. According to some embodiments, the IC structures 142 can be the IC structure 500A, 500B or 600A; however, other types of IC structures, e.g., IC structures 100A, 100B, 100C, 300A, 300B, 300C or the like, are also possible. Another plurality of IC structures 142, e.g., IC structures 142B, are bonded to the corresponding IC structures 142A to form the IC structures 142 in a second tier of the respective short IC stacks 312. The bonding between the IC structures 142A and 142B may be performed using flip-chip bonding, hybrid bonding, die attachment or another suitable bonding process. The process of forming the short IC stacks 312 may continue until a predetermined tier number K is achieved, wherein the tier number K is a natural number. In the depicted example, the tier number K is four. That means that each short IC stack 312 comprises four stacked IC structures, 142A, 142B, 142C and 142D.

Referring to FIG. 12B, the semiconductor device 1200W is molded or encapsulated using a potting material 242. A molding or deposition process is performed to deposit the potting materials 242 in between the short IC stacks 312. According to some embodiments, a planarization process, e.g., CMP, grinding, etch (dry, e.g., by RIE and/or wet) and/or another suitable etching operation, is performed to remove excess potting material 242 and planarize an upper surface of the potting material 242 to flush with primary surfaces of the short IC stacks 312. Subsequently, an array of micro-bumps 302 is formed over the primary surfaces of the short IC stacks 312 or the top die, e.g., the IC structure 142D, serving as part of an interior interconnect structure 108X of the short IC stacks 312.

Referring to FIG. 12C, a singulation or dicing process is performed to separate the semiconductor device 1200W into individual semiconductor packages 1200A. The singulation or dicing process may be performed to cut through the semiconductor device 1200W at locations of the potting material 242 while keeping each short IC stack 312 intact during the dicing process. According to some embodiments, a wet etching or cleaning process is performed to remove residual potting material 242 left on the semiconductor package 1200A.

Figure 13B:
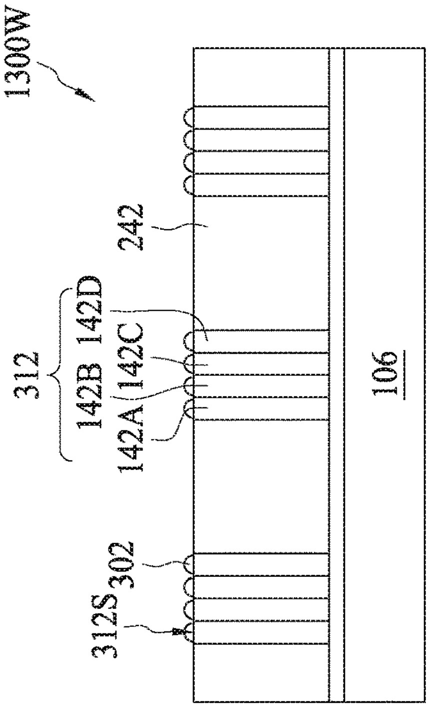
FIGS. 13A to 13C show cross-sectional views of structures in different stages of a method of manufacturing a semiconductor package, in accordance with various embodiments of the present disclosure.
Figure 13A:
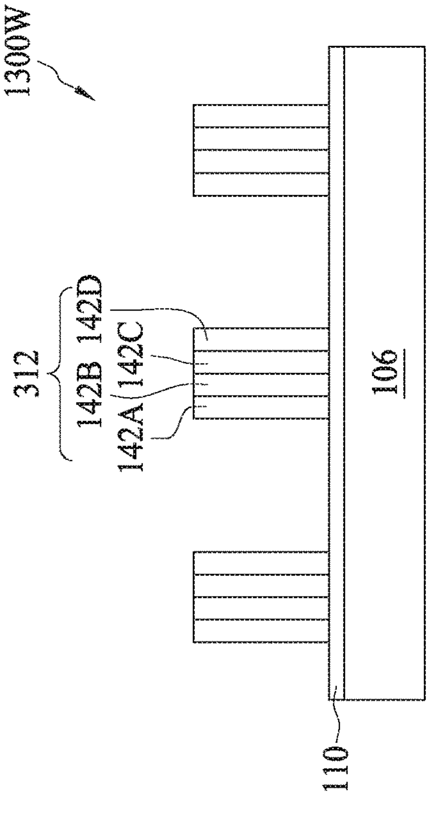
Figure 13C:
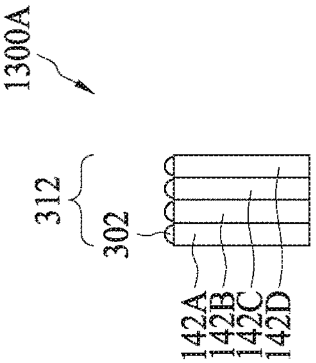

FIGS. 13A to 13C show cross-sectional views of structures in different stages of a method of manufacturing a semiconductor package 1300A, in accordance with various embodiments of the present disclosure. Referring to FIG. 13A, a carrier substrate 106 is provided or received in a semiconductor device 1300W. A release layer 110 is formed over upper surface of the carrier substrate 106. A plurality of short IC stacks 312 are prepared in a separate process, wherein each of the short IC stacks 312 comprises, e.g., four stacked IC structures, 142A, 142B, 142C and 142D, and the short IC stacks 312 is formed through the aforementioned processes. The short IC stacks 312 are arranged on the release layer 110 with a suitable pitch. A main difference between the steps for manufacturing the semiconductor package 1300A and those for manufacturing the semiconductor package 1200A is that the short IC stacks 312 shown in FIG. 13A are arranged in an upright orientation with one side surface exposed facing upward in FIGS. 13A and 13B. In other words, primary surfaces of the ICs in the short IC stacks 312 face each other in a horizontal direction.

Referring to FIG. 13B, the semiconductor device 1300W is molded or encapsulated using a potting material 242, in a manner similar to that described with reference to FIG. 12B. Subsequently, an array of micro-bumps 302 is formed over the side surfaces of the short IC stacks 312 to serve as part of an edge interconnect structure 118X of the short IC stacks 312.

Referring to FIG. 13C, a singulation or dicing process is performed to separate the semiconductor device 1300W into individual semiconductor packages 1300A. The singulation or dicing process may be performed to cut through the semiconductor device 1300W at locations of the potting material 242 in order to free short IC stacks 312 from the potting material 242. According to some embodiments, a wet etching or cleaning process is performed to remove residual potting material 242 left on the semiconductor package 1300A.

Figure 13D:
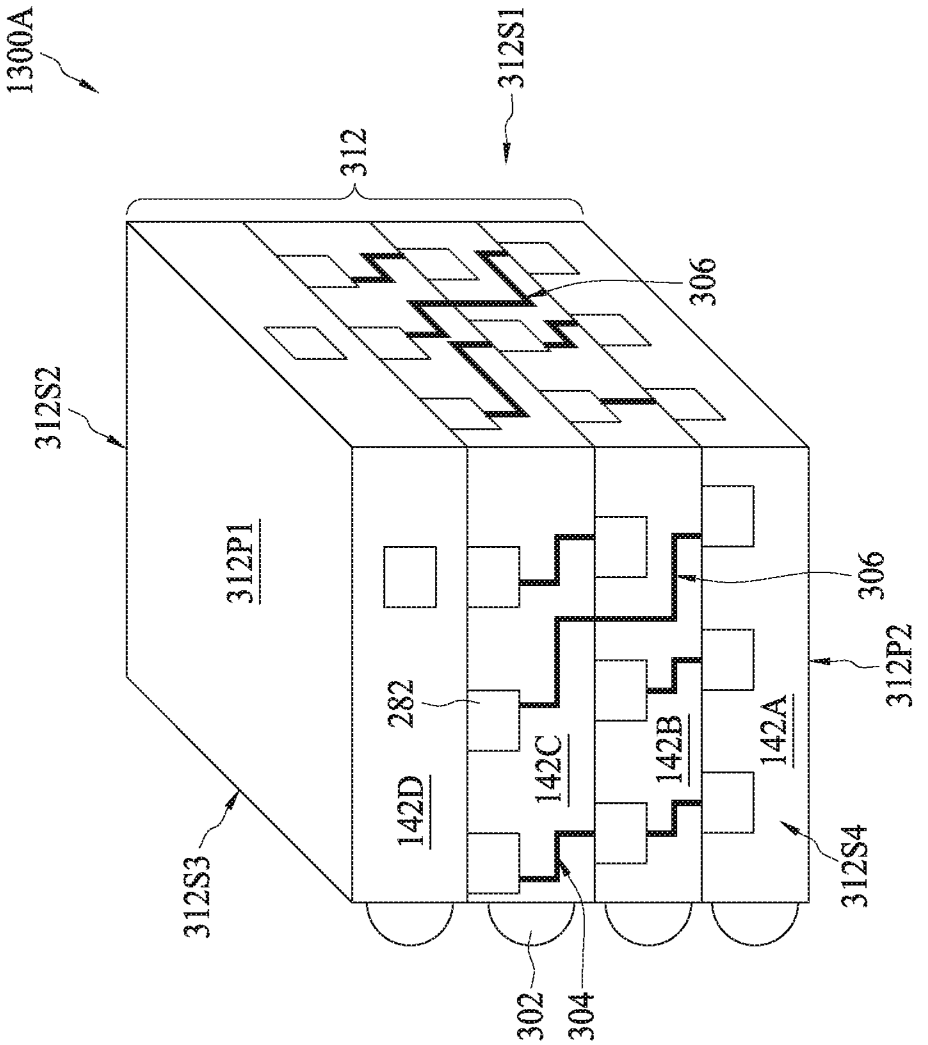
FIG. 13D shows a perspective view of the semiconductor package shown in FIG. 13C, in accordance with various embodiments of the present disclosure.

FIG. 13D shows a perspective view of the semiconductor package 1300A shown in FIG. 13C, in accordance with various embodiments of the present disclosure. The semiconductor package 1300A is an exemplary short IC stack structure that has six side surfaces, which include an upper primary surface 312P1, a lower primary surface 312P2, and four lateral side surfaces, 312S1, 312S2, 312S3 and 312S4, between the two primary surfaces, 312P1 and 312P2. The semiconductor package 1300A further includes edge conductive elements 302, e.g., edge conductive pads, edge conductive vias, edge conductive bumps, micro-bumps and/or hybrid bonding pads, distributed on the side surfaces of the four IC structures, 142A, 142B, 142C and 142D. The semiconductor package 1300A also includes edge conductive traces or wires 304 and 306. The conductive trace 304 may be configured to serve as an adjacent-die interconnect line and used to interconnect edge conductive elements of adjacent IC structures 142, e.g., IC structures 142B and 142C. Further, the conductive trace 306 may be configured as a skip-die interconnect line and used to interconnect edge conductive elements of non-adjacent IC structures 142, e.g., IC structures, 142A and 142C, while bypassing the body of the IC structure 142B. With such configuration, the semiconductor package 1300A can provide shorter routing distances, greater routing efficiency and greater flexibility than existing semiconductor packages which lack the edge interconnect structure 118X.

Figure 14A:
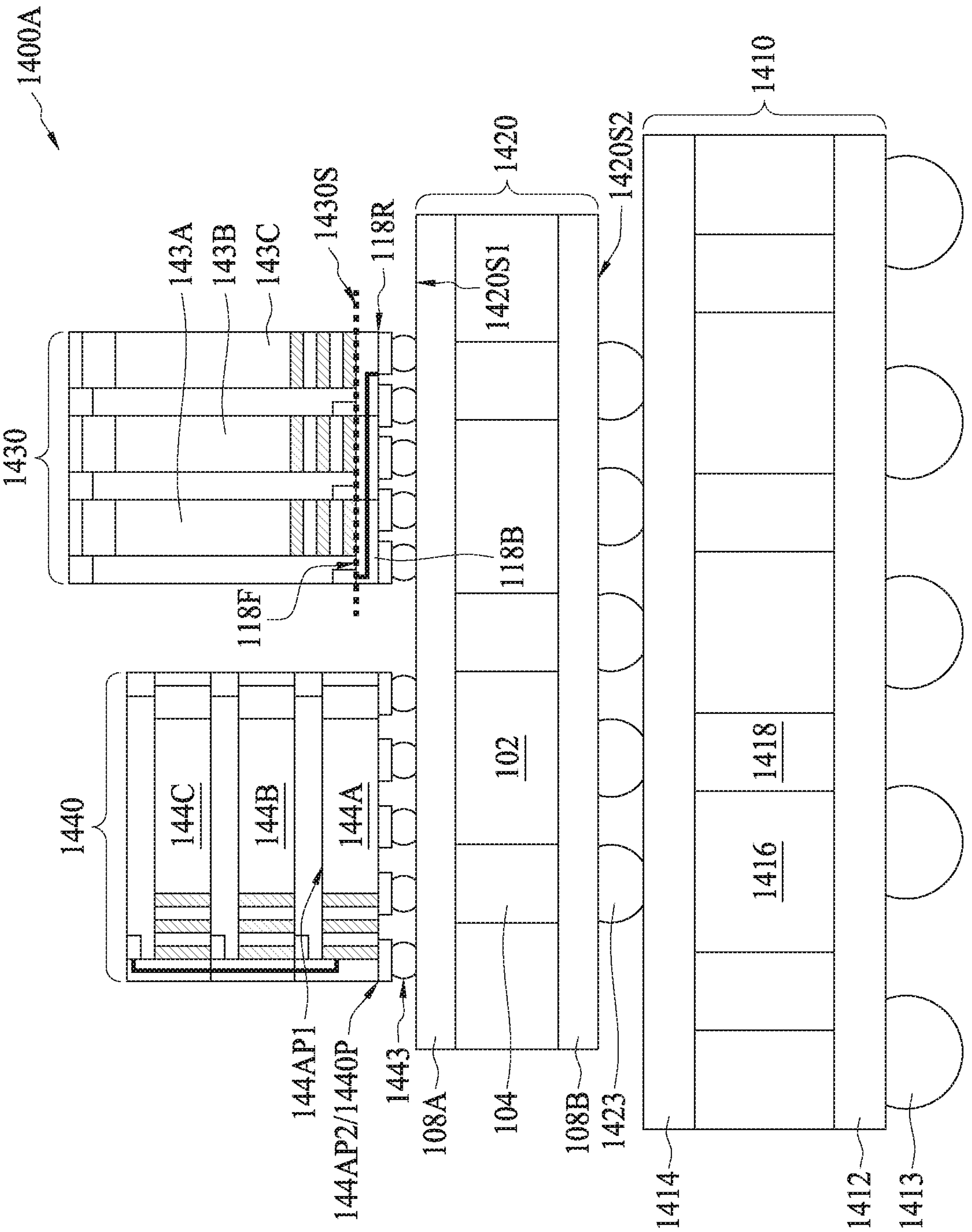
FIGS. 14A and 14B show cross-sectional views of a semiconductor package assembly, in accordance with various embodiments of the present disclosure.

FIG. 14A shows a cross-sectional view of a semiconductor package assembly 1400A, in accordance with various embodiments of the present disclosure. The semiconductor package assembly 1400A includes a substrate 1410, a carrier 1420, a first semiconductor package 1430 and a second semiconductor package 1440, all bonded to each other.

According to some embodiments, the carrier 1420 can be a silicon interposer or a laminate substrate and the substrate 1410 a laminate substrate or a printed circuit board (PCB). The substrate 1410 may be formed of a first buildup layer 1412, a second buildup layer 1414 and a core layer 1416 sandwiched between the first buildup layer 1412 and the second buildup layer 1414. Each of the first buildup layer 1412 and the second buildup layer 1414 is formed of one or more conductive/dielectric layers containing copper or other suitable conductive materials. The conductive materials are insulated from each other by insulating materials, e.g., BT, ABF, polyimide, FR-4, or the like. The core layer 1416 may be formed of one or more dielectric materials, e.g., glass, resin, or the like. The core layer 1416 may include plated through holes 1418 which are formed of conductive materials, e.g., copper, and are configured to be electrically connected to the first buildup layer 1412 and the second buildup layer 1414. The semiconductor package assembly 1400A further includes external electrical connections 1413 for connection to the next-level substrate (not shown). The external connections 1413 may be micro-bumps, solder bumps, ball grid array balls, land grid array pads, or other suitable interconnections.

According to some embodiments, the carrier 1420 is an aforementioned IC structure, an interposer or the like. The carrier 1420 may be configured to support the first semiconductor package 1430 and the second semiconductor package 1440, and to electrically connect the first semiconductor package 1430 to the second semiconductor package 1440, or to electrically connect the first semiconductor package 1430 and the second semiconductor package 1440 to the substrate 1410. According to some embodiments, the carrier 1420 includes a substrate 102 and a plurality of TSVs 104 in the substrate 102. Materials, configurations and methods of forming the substrate 102 and the TSVs 104 are similar to those described with reference to the IC structure 100A shown in FIG. 2D or other suitable IC structures mentioned above. The carrier 1420 further includes a first primary RDL 108A arranged on an upper side of the substrate 102 and a second primary RDL 108B arranged on a bottom side of the substrate 102. The first primary RDL 108A may be electrically connected to the secondary RDL 108B through the TSVs 104. The first primary RDL 108A includes an interconnect surface 1420S1 electrically bonded to the first semiconductor package 1430 and the second semiconductor package 1440. Likewise, the second primary RDL 108B includes an interconnect surface 1420S2 electrically bonded to the substrate 1410. The semiconductor package assembly 1400A may include external connections 1423 electrically connecting the substrate 1410 to the carrier 1420 through a flip-chip bonding process. The external connections 1423 may include micro-bumps, solder bumps, ball grid array balls or other suitable connectors.

According to some embodiments, a structural configuration of the first semiconductor package 1430 is similar to those of the semiconductor packages, 1300A, 700B, 700C, and 1100A, as shown in FIGS. 13C, 71, 7J, 11A, respectively. Therefore, details of the first semiconductor package 1430 can be found by referring to descriptions of these semiconductor packages. Referring to FIG. 11A and FIG. 14A, the first semiconductor package 1430 includes a secondary RDL 118B formed on a lower secondary plane 1430S of the first semiconductor package 1430. Further, as shown in FIG. 14A, the secondary RDL 118B includes a front interconnect surface 118F facing the IC structures, 143A, 143B, and 143C, and a back interconnect surface 118R opposite to the front interconnect surface 118F. The back interconnect surface 118R is electrically bonded to the interconnect surface 1420S1 of the carrier 1420. As a result, the first semiconductor package 1430 is bonded to the carrier 1420 through an edge interconnect structure 118X of the first semiconductor package 1430. According to some embodiments, the back interconnect surface 118R includes a first bond pad array, and the interconnect surface 1420S1 includes a second bond pad array corresponding to the first bond pad array. The first bond pad array and the second bond pad array are joined via flip chip bonding and jointly form a flip-chip assembly by performing flip-chip bonding.

According to some embodiments, a structural configuration of the second semiconductor package 1440 is similar to that of the semiconductor package 1200A and 700C shown in FIGS. 12C and 7J. Therefore, details of the second semiconductor package 1440 can be found by referring to the semiconductor package 700C. Referring to FIG. 7I and FIG. 14A, the second semiconductor package 1440 includes three bodies including IC structures, 144A, 144B and 144C. The body of the IC structure 144A includes an upper primary surface 144AP1 and a lower primary surface 144AP2 coincident with the lower primary surface 1440P of the second semiconductor package 1440, and therefore the lower primary surface 1440P serves as an interconnect surface of the second semiconductor package 1440. The semiconductor package assembly 1400A further includes external connections 1443 between and electrically connecting the second semiconductor package 1440 and the carrier 1420. According to some embodiments, the external connections 1443 include micro-bumps, solder bumps, or other suitable connectors. The carrier 1420 is bonded to the second semiconductor package 1440 through the first interconnect surface 1420S1 of the carrier 1420 and the interconnect surface of the lower primary surface 1440P of the second semiconductor package 1440 via a flip-chip bonding process. According to some embodiments, the interconnect surface of the lower primary surface 1440P includes a third bond pad array, and the interconnect surface 1420S1 includes the second bond pad array corresponding to the third bond pad array. The second bond pad array and the third bond pad array jointly form a flip-chip assembly by performing flip-chip bonding.

Figure 14B:
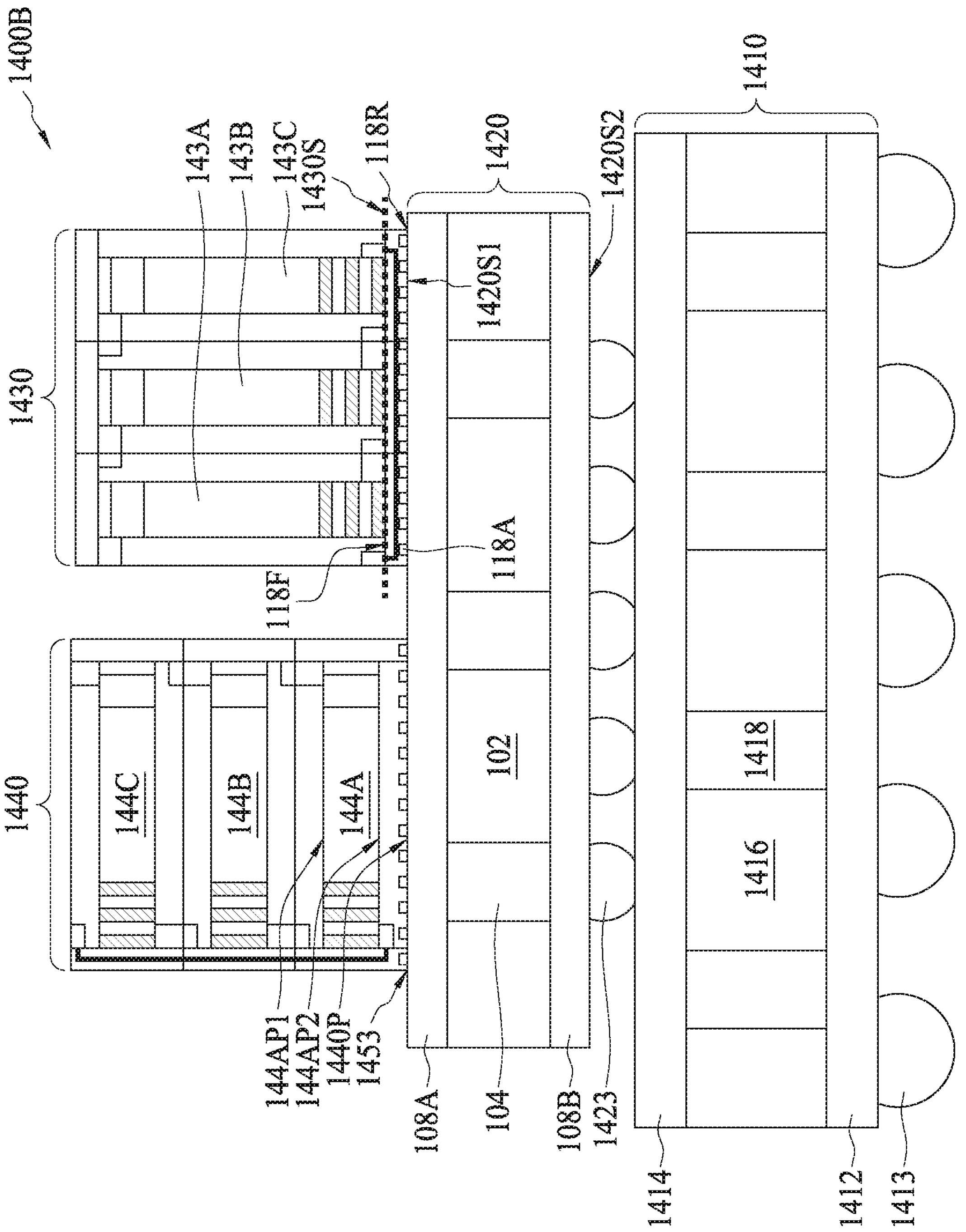

FIG. 14B shows a cross-sectional view of a semiconductor package assembly 1400B, in accordance with various embodiments of the present disclosure. The semiconductor package assembly 1400B is similar to the semiconductor package assembly 1400A in many aspects, and such similar aspects are not repeated for brevity. Referring to FIG. 7J and FIG. 14B, the first semiconductor package 1430 includes a secondary RDL 118A bonded to a lower secondary plane 1430S of the first semiconductor package 1430. Further, the secondary RDL 118A includes a front interconnect surface 118F facing the IC structures, 143A, 143B and 143C, and a back interconnect surface 118R opposite to the front interconnect surface 118F. The back interconnect surface 118R is electrically bonded to the interconnect surface 1420S1 of the carrier 1420. As a result, the first semiconductor package 1430 is bonded to the carrier 1420 through an edge interconnect structure 118X of the first semiconductor package 1430. According to some embodiments, the secondary RDL 118A includes a first bonding layer 118L1 bonded to a first bonding layer of a first primary RDL 108A through a hybrid bonding process. According to some embodiments, the back interconnect surface 118R includes a first hybrid bonding layer, and the interconnect surface 1420S1 includes a second hybrid bonding layer corresponding to the first hybrid bonding layer for performing hybrid bonding.

According to some embodiments, a structural configuration of the second semiconductor package 1440 shown in FIG. 14B is similar to that of the semiconductor package 700B shown in FIG. 7I. Referring to FIG. 7I and FIG. 14A, the second semiconductor package 1440 includes three bodies including IC structures, 144A, 144B and 144C. The body of the IC structure 144A includes an upper primary surface 144AP1 and a lower primary surface 144AP2 above the lower primary surface 1440P of the second semiconductor package 1440, and therefore the lower primary surface 1440P is an interconnect surface of the second semiconductor package 1440. The IC structure 144A further includes a bonding layer facing the carrier 1420, and the first primary RDL 108A further includes a bonding layer facing the second semiconductor package 1440. The carrier 1420 is bonded to the second semiconductor package 1440 through the first interconnect surface 1420S1 and the interconnect surface 1440P of the semiconductor package 1440 via a hybrid-bonding process. According to some embodiments, the interconnect surface of the lower primary surface 1440P includes a third hybrid bonding layer, and the interconnect surface 1420S1 includes the second hybrid bonding layer corresponding to the third hybrid bonding layer for performing hybrid bonding.

The embodiments discussed above are described with scenarios of 3D ICs as examples. However, the present disclosure is not limited thereto. The methodologies, processes and structures discussed in the present disclosure can also be applied to other advanced systems-in-a-package (SiPs) comprising fan-out, embedded SiP, silicon photonics and their combinations, e.g., the embodiments shown in FIGS. 1A, 1B, 1C, 1D, 1E and 1F, wherein the SiPs involving die stacking in the thickness direction are employed.

The foregoing outlines structures of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:

a plurality of integrated circuit (IC) structures, each IC structure comprising:

a first body having a primary surface and a secondary surface, wherein the primary surface is greater than the secondary surface in area; and a primary redistribution layer (RDL) over the primary surface of the first body, with the primary RDL having an edge surface aligned or substantially aligned with the secondary surface of the first body; and an edge RDL over the secondary surface of the first body of each IC structure and the edge surface of the primary RDL of each IC structure, wherein the primary RDL is electrically connected to the edge RDL and the first body, and the edge RDL is electrically connected to the first body through the primary RDL, wherein the primary RDL further comprises a first conductive element exposed from the edge surface of the primary RDL, wherein the edge RDL has a first interconnect surface and a second interconnect surface opposite to the first interconnect surface, wherein the first conductive element is electrically connected to a plurality of second conductive elements at the second interconnect surface.

2. The semiconductor package of claim 1, wherein the primary RDL is electrically connected to the edge RDL and the first body of each IC structure, and the edge RDL is electrically connected directly to the first body of each IC structure.

3. The semiconductor package of claim 1 wherein the first body further comprises at least an BEOL (Backend-of-line) edge pad, a BEOL via, a stacked BEOL via, a through-silicon via, a through-mold via, a partial through-silicon via, a partial through-mold via, a semiconducting element, or an insulating element exposed through the secondary surface.

4. The semiconductor package of claim 1, wherein the first body comprises multiple first dies placed in a same package layer, vertically stacked second dies, the vertically stacked second dies placed side-by-side with other third dies in the same package layer, or a combination thereof, and wherein the first, second and third dies are of the same or different sizes.

5. The semiconductor package of claim 4, wherein the first body comprises a plurality of conductive vias, pillars or plugs of same or different lengths in one or more dies, electrically connecting the die(s) to the primary RDL and/or the edge RDL.

6. The semiconductor package of claim 1, wherein the secondary surface of the first body and the edge surface of the primary RDL jointly form a secondary plane, wherein the edge RDL covers the secondary plane, with the first interconnect surface coincident with the secondary plane, wherein the first interconnect surface of the edge RDL is connected to the secondary plane using a RDL process.

7. The semiconductor package of claim 1, wherein the secondary surface of the first body and the edge surface of the primary RDL jointly form a secondary plane, wherein the edge RDL covers the secondary plane, with the first interconnect surface coincident with the secondary plane, wherein the first interconnect surface of the edge RDL comprises a first hybrid bonding layer corresponding to a second hybrid bonding layer on the secondary plane.

8. The semiconductor package of claim 1, wherein the secondary surface of the first body and the edge surface jointly form a secondary plane, wherein the edge RDL comprises a flexible circuit connector disposed on the secondary plane, and the semiconductor package further comprises a non-conductive filler or an encapsulant filling spaces between the flexible circuit connector and the secondary plane.

9. The semiconductor package of claim 1, wherein the secondary surface and the edge surface jointly form a secondary plane, wherein the plurality of IC structures comprise:

a first IC structure;

a second IC structure stacked over the primary surface of the first IC structure; and a third IC structure stacked over the primary surface of the second IC structure, wherein the edge RDL extends over a secondary plane of the first IC structure, a secondary plane of the second IC structure, and a secondary plane of the third IC structure, and wherein a conductive trace or wire in the edge RDL electrically connects the first IC structure, the second IC structure and the third IC structure while bypassing the first body of the second IC structure.

10. A semiconductor package, comprising:

a plurality of integrated circuit (IC) structures, each IC structure comprising:

a first body having a primary surface and a secondary surface, wherein the primary surface is greater than the secondary surface in area; and a primary redistribution layer (RDL) over the primary surface of the first body, with the primary RDL having an edge surface aligned or substantially aligned with the secondary surface of the first body; and an edge RDL over the secondary surface of the first body of each IC structure and the edge surface of the primary RDL of each IC structure, wherein the primary RDL is electrically connected to the edge RDL and the first body, and the edge RDL is electrically connected to the first body through the primary RDL, wherein the primary RDL further comprises a first conductive element exposed through the edge surface of the primary RDL, wherein the first conductive element comprises a conductive pad on the edge surface of the primary RDL substantially parallel to the primary surface, a conductive via connecting adjacent layers of the primary RDL, a stacked via traversing the primary RDL, or a combination thereof.

11. A semiconductor package, comprising:

a plurality of integrated circuit (IC) structures, each IC structure comprising:

a first body having a primary surface and a secondary surface, wherein the primary surface is greater than the secondary surface in area; and a primary redistribution layer (RDL) over the primary surface of the first body, with the primary RDL having an edge surface aligned or substantially aligned with the secondary surface of the first body; and an edge RDL over the secondary surface of the first body of each IC structure and the edge surface of the primary RDL of each IC structure, wherein the primary RDL is electrically connected to the edge RDL and the first body, and the edge RDL is electrically connected to the first body through the primary RDL, wherein the secondary surface of the first body and the edge surface of the primary RDL jointly form a secondary plane, wherein the edge RDL covers the secondary plane, with the edge RDL comprising a first surface coincident with the secondary plane, and a second surface opposite to the first surface, wherein the first surface of the edge RDL comprises a first flip-chip bonding layer corresponding to a second flip-chip bonding layer on the secondary plane.

* * * * *